(12) United States Patent
Bae et al.

(10) Patent No.: US 10,306,763 B2
(45) Date of Patent: May 28, 2019

(54) ELECTRONIC COMPONENT, ELECTRIC DEVICE INCLUDING THE SAME, AND BONDING METHOD THEREOF

(71) Applicant: SAMSUNG DISPLAY CO., LTD., Yongin-si, Gyeonggi-do (KR)

(72) Inventors: Han-Sung Bae, Yongin-si (KR); Wonkyu Kwak, Yongin-si (KR); Cheolgeun An, Yongin-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 15/975,334

(22) Filed: May 9, 2018

(65) Prior Publication Data

US 2018/0263116 A1    Sep. 13, 2018

Related U.S. Application Data

(63) Continuation of application No. 14/574,492, filed on Dec. 18, 2014, now Pat. No. 9,974,175, which is a
(Continued)

(30) Foreign Application Priority Data

Apr. 29, 2013 (KR) .................. 10-2013-0047535
Apr. 10, 2014 (KR) .................. 10-2014-0043134
(Continued)

(51) Int. Cl.
*H05K 5/00* (2006.01)
*H05K 7/00* (2006.01)
(Continued)

(52) U.S. Cl.
CPC ......... *H05K 1/118* (2013.01); *G02F 1/13458* (2013.01); *H01L 24/06* (2013.01);
(Continued)

(58) Field of Classification Search
CPC ............ H01L 2224/50; H01L 2224/79; H01L 2224/86; H01L 2225/06579; H01L 2225/107
(Continued)

(56) References Cited

U.S. PATENT DOCUMENTS 4,951,119 A * 8/1990 Yonemochi et al. .........................
.................................................. H01L 23/49537
257/666
5,951,304 A * 9/1999 Wildes et al. ........ B81B 7/0006
439/67
(Continued)

FOREIGN PATENT DOCUMENTS

CN    1268675 A    10/2000
CN    1441288 A    9/2003
(Continued)

OTHER PUBLICATIONS

Chinese Examination Report dated Aug. 31, 2018.
European Search Report dated Sep. 27, 2016.

*Primary Examiner* — Binh B Tran
(74) *Attorney, Agent, or Firm* — Lee & Morse P.C.

(57) ABSTRACT

Provided is an electronic component including a pad region including a plurality of pads extending along corresponding extension lines and arranged in a first direction, and a signal wire configured to receive a driving signal from the pad region, wherein the plurality of pads include a plurality of first pads arranged continuously and a plurality of second pads arranged continuously, and extension lines of the plurality of first pads substantially converge into a first point and extension lines of the plurality of second pads substantially converge into a second point different from the first point.

1 Claim, 39 Drawing Sheets

Related U.S. Application Data continuation-in-part of application No. 14/048,213, filed on Oct. 8, 2013, now Pat. No. 9,894,792.

(30) Foreign Application Priority Data

| Apr. 10, 2014 | (KR) | ......................... 10-2014-0043136 |
| Jun. 26, 2014 | (KR) | ......................... 10-2014-0079080 |

(51) Int. Cl.

| H05K 1/18 | (2006.01) |
|---|---|
| H05K 1/00 | (2006.01) |
| H05K 1/11 | (2006.01) |
| G02F 1/1345 | (2006.01) |
| H01L 23/00 | (2006.01) |
| H05K 3/30 | (2006.01) |
| H01L 23/495 | (2006.01) |
| H05K 3/36 | (2006.01) |

(52) U.S. Cl.
CPC ........ *H05K 1/111* (2013.01); *H01L 23/49572* (2013.01); *H01L 2224/50* (2013.01); *H01L 2224/79* (2013.01); *H01L 2224/86* (2013.01); *H01L 2225/06579* (2013.01); *H01L 2225/107* (2013.01); *H05K 3/303* (2013.01); *H05K 3/361* (2013.01); *H05K 2201/05* (2013.01); *H05K 2201/058* (2013.01); *H05K 2201/094* (2013.01); *H05K 2201/09418* (2013.01); *H05K 2203/04* (2013.01); *Y02P 70/611* (2015.11)

(58) Field of Classification Search
USPC .......................... 345/55, 87; 361/749; 156/64
See application file for complete search history.

(56) References Cited

U.S. PATENT DOCUMENTS

| 6,172,732 | B1 | 1/2001 | Hayakawa et al. |
| 8,339,849 | B2 | 12/2012 | Kwak et al. |
| 2003/0160929 | A1 | 8/2003 | Kurusawa |
| 2006/0049494 | A1* | 3/2006 | Urushido .......... H01L 23/49838 |
| | | | 257/666 |
| 2007/0029658 | A1 | 2/2007 | Peng et al. |
| 2007/0195763 | A1 | 8/2007 | Onodera |
| 2007/0275578 | A1 | 11/2007 | Yamada |
| 2012/0134120 | A1 | 5/2012 | Gondo |
| 2013/0141877 | A1 | 6/2013 | Lau et al. |

FOREIGN PATENT DOCUMENTS

| CN | 101740580 A | 6/2010 |
| CN | 102437141 A | 5/2012 |
| EP | 0 588 481 A1 | 3/1994 |
| EP | 2 811 337 A1 | 12/2014 |
| JP | H11-112119 A | 4/1999 |
| JP | 2000-269608 A | 9/2000 |
| JP | 2003-258027 A | 9/2003 |
| JP | 2007-242942 A | 9/2007 |
| KR | 10-0299390 B1 | 6/2001 |
| KR | 10-2007-0087509 A | 8/2007 |
| WO | WO 2013/128857 A1 | 9/2013 |

* cited by examiner

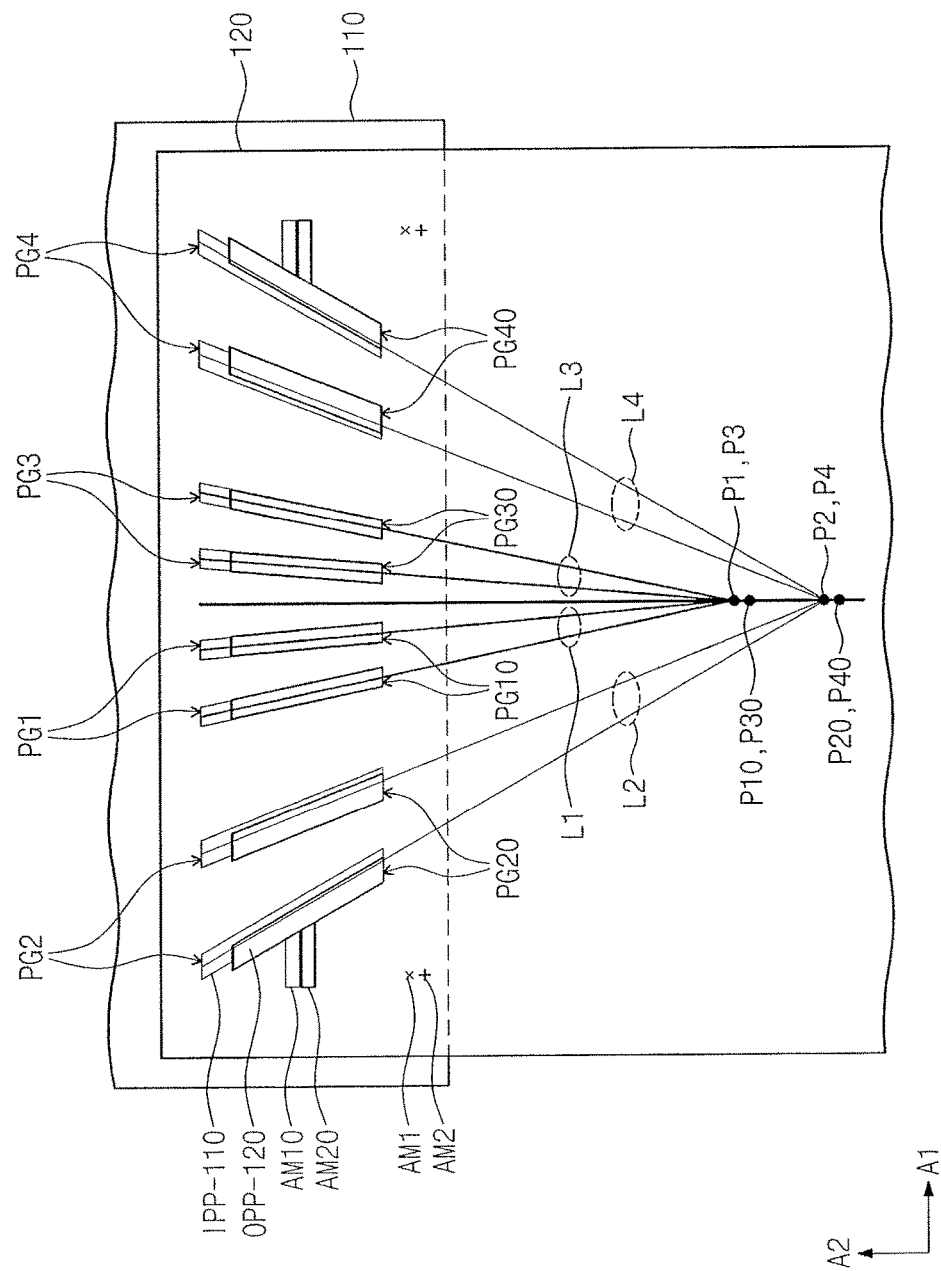

FIG. 26A
FIG. 26B
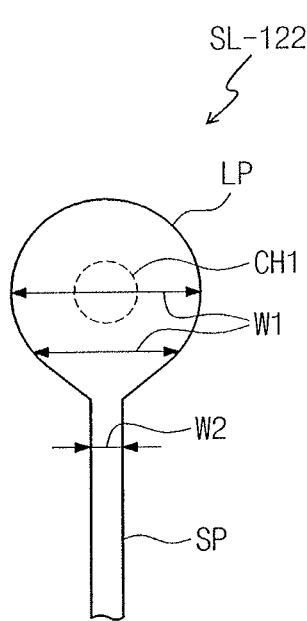
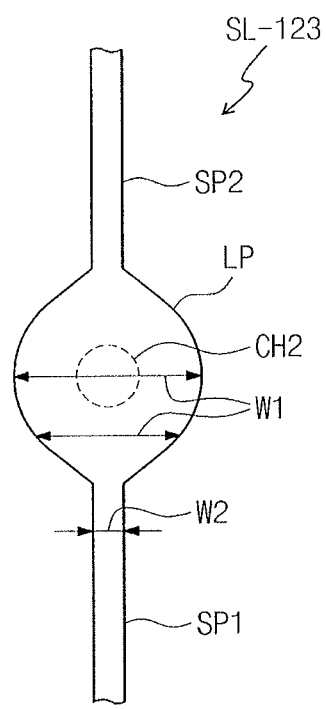

ELECTRONIC COMPONENT, ELECTRIC DEVICE INCLUDING THE SAME, AND BONDING METHOD THEREOF

CROSS-REFERENCE TO RELATED APPLICATIONS

This application is a continuation of pending application Ser. No. 14/574,492, filed Dec. 18, 2014, which in turn is a continuation-in-part of U.S. patent application Ser. No. 14/048,213, filed on Oct. 8, 2013, now U.S. Pat. No. 9,894,792, issued Feb. 13, 2018, and entitled "Display Panel, Electronic Device Including the Same, and Bonding Method Thereof," the entire contents of which are hereby incorporated by reference.

Korean Patent Application No. 10-2013-0047535, filed on Apr. 29, 2013, in the Korean Intellectual Property Office, and entitled, "Display Panel, Electronic Device Including the Same, and Bonding Method Thereof," and Korean Patent Application Nos. 10-2014-0043134, filed on Apr. 10, 2014, 10-2014-0043136, filed on Apr. 10, 2014, and 10-2014-0079080, filed on Jun. 26, 2014, in the Korean Intellectual Property Office, and entitled: "Electronic Component, Electric Device Including the Same, and Bonding Method Thereof," are incorporated by reference herein in their entirety.

BACKGROUND

1. Field

Exemplary embodiments of the present disclosure relate to an electronic component, an electronic device including the same, and a bonding method thereof. More particularly, exemplary embodiments of the present disclosure relate to an electronic component improving the reliability of an electrical connection, an electronic device including the same, and a bonding method thereof

2. Description of the Related Art

In general, an electronic device may include at least two electronic components. For example, an electronic device, e.g., a mobile phone, a notebook computer, and a television, may include an electro-optical panel, a main wiring substrate, and a flexible wiring substrate to generate an image.

The two electronic components of the electronic device are electrically connected to each other. For example, through coupling of respective pad regions, the two electronic components may be electrically connected to each other. A process (hereinafter referred to as a bonding process) for electrically connecting the pad regions of the two electronic components may include aligning and coupling the pad regions of the two electronic components. The coupling process may use a thermo-compression tool.

SUMMARY

Exemplary embodiments of the present disclosure provide an electronic component, including a pad region including a plurality of pads extending along corresponding extension lines, the plurality of pads being spaced apart from each other in a first direction, and a signal wire configured to receive a driving signal from the pad region, wherein the plurality of pads includes a plurality of first pads arranged continuously and a plurality of second pads arranged continuously, and wherein extension lines of the plurality of first pads substantially converge into a first point, and extension lines of the plurality of second pads substantially converge into a second point different from the first point.

First between-angles, formed by a reference line defined at a center of the first direction of the pad region and extending in a second direction intersecting the first direction and the extension lines of the plurality of first pads, may be reduced as the plurality of first pads are progressively closer to the reference line, and second between-angles, formed by the reference line and the extension lines of the plurality of second pads, may be reduced as the plurality of second pads are progressively closer to the reference line.

The first between-angles may be reduced by a first value and the second between-angles are reduced by a second value, and the first value and the second value are different from each other.

A first between-angle $\theta 1n$ may be formed by an extension line of an n-th first pad among the first pads and the reference line and satisfies Equation 1 below, $$\theta_{1n}=\theta_{11}-(n-1)\alpha \qquad \text{[Equation 1]}$$

where $\theta 11$ is a first between-angle formed by an extension line of a first pad disposed at the outermost among the first pads and the reference line, n is a natural number greater than or equal to 2, and $\alpha$ is the first value.

A second between-angle $\theta 2m$ may be formed by an extension line of an m-th second pad among the second pads and the reference line and satisfies Equation 2 below, $$\theta_{2m}=\theta_{21}-(m-1)\beta \qquad \text{[Equation 2]}$$

where $\theta 21$ is a second between-angle formed by an extension line of a second pad disposed at the outermost among the second pads and the reference line, m is a natural number greater than or equal to 2, and $\beta$ is the second value.

The first pads may be closer to the reference line than the second pads, and $\theta 11$ satisfies Equation 3 below, $$\theta_{11} \neq \theta_{21}-K \times \beta \qquad \text{[Equation 3]}$$

where K is a number of the second pads.

The first point and the second point may be disposed at different positions.

One of the first point and the second point may be disposed on the reference line and the other of the first point and the second point is disposed outside the reference line.

The first point and the second point may be disposed on a parallel line extending in the first direction.

Each of the first pads and the second pads may have a parallelogram form extending in each extension direction.

Exemplary embodiments of the present disclosure also provide an electronic device, including a first electronic component including a first pad region, and a second electronic component including a second pad region electrically connected to the first pad region, herein one pad region of the first pad region and the second pad region includes a plurality of first pads extending along corresponding extension lines and arranged continuously, and a plurality of second pads extending along corresponding extension lines and arranged continuously, and wherein the extension lines of the plurality of first pads substantially converge into a first point, and the extension lines of the plurality of second pads substantially converge into a second point different from the first point.

The first electronic component may include an electro-optical panel or a wiring substrate, and the second electronic component may include a flexible wiring substrate.

The first point and the second point may be disposed on the electro-optical panel or the wiring substrate.

The first point and the second point may be disposed on the flexible wiring substrate.

Another pad region of the first pad region and the second pad region may include a plurality of third pads and fourth pads extending along corresponding extension lines, the extension lines of the plurality of third pads substantially converge into a third point, and the extension lines of the plurality of fourth pads substantially converge into a fourth point different from the third point, and the plurality of third pads are electrically connected to the plurality of first pads, and the plurality of fourth pads are electrically connected to the plurality of second pads.

Exemplary embodiments of the present disclosure also provide a bonding method of an electronic device including a first electronic component and a second electronic component, where pad regions of the first and second electronic components are electrically coupled to each other, the method including aligning a pad region of the first electronic component and a pad region of the second electronic component, calculating an x-axis displacement error value between the pad region of the first electronic component and the pad region of the second electronic component, when the x-axis displacement error value is less than a reference value, coupling the pad region of the first electronic component and the pad region of the second electronic component, and when the x-axis displacement error value is greater than the reference value, calculating a y-axis correction value in accordance with the x-axis displacement error value, and correcting a y-axis displacement of at least one of the pad region of the first electronic component and the pad region of the second electronic component on the basis of the y-axis correction value.

The aligning the pad region of the first electronic component and the pad region of the second electronic component may include aligning an align mark of the first electronic component and an align mark of the second electronic component.

One of the pad region of the first electronic component and the pad region of the second electronic component includes a plurality of first pads and second pads extending along corresponding extension lines and arranged along the x-axis, and extension lines of the plurality of first pads substantially converge into a first point and extension lines of the plurality of second pads substantially converge into a second point different from the first point.

The another one of the pad region of the first electronic component and the pad region of the second electronic component may include a plurality of third pads and fourth pads extending along corresponding extension lines and arranged along the x-axis, extension lines of the plurality of third pads substantially converge into a third point, and extension lines of the plurality of fourth pads substantially converge into a fourth point different from the third point, and the plurality of third pads are electrically connected to the plurality of first pads, and the plurality of fourth pads are electrically connected to the plurality of second pads.

Exemplary embodiments of the present disclosure also provide an electronic component, including a pad region including a plurality of first pads and second pads arranged along a first direction axis, and a signal wire configured to be electrically connected to the pad region, wherein the first pads have a first pitch measured along a first line parallel to the first direction axis and a second pitch different from the first pitch, the second pitch being measured along a second line parallel to the first direction axis and different from the first line, and the second pads have a third pitch different from the first pitch and measured along the first line, and a fourth pitch different from the second pitch and measured along the second line, wherein the first pitch is defined by a sum of a width of one first pad of the first pads measured along the first line and an interval between adjacent two first pads among the first pads measured along the first line, wherein the second pitch is defined by a sum of a width of one first pad of the first pads measured along the second line and an interval between adjacent two first pads among the first pads measured along the second line, wherein the third pitch is defined by a sum of a width of one second pad of the second pads measured along the first line and an interval between adjacent two second pads among the second pads measured along the first line, and wherein the fourth pitch is defined by a sum of a width of one second pad of the second pads measured along the second line and an interval between adjacent two second pads among the second pads measured along the second line.

A first between-angle formed by a first pad adjacent to an outer of the pad region among the first pads and the first direction axis may be less than a first between-angle formed by a first pad adjacent to a center of the pad region and the first direction axis.

A second between-angle formed by a second pad adjacent to an outer of the pad region among the second pads and the first direction axis may be less than a second between-angle formed by a second pad adjacent to a center of the pad region and the first direction axis.

The second pads may be farther disposed along the first direction axis from the center than the first pads, and the third pitch is greater than the first pitch.

Exemplary embodiments of the present disclosure also provide an electronic component, including a pad region arranged along a first direction axis, the pad region including a plurality of pads tilted relative to the first direction axis, and a signal wire configured to be electrically connected to the pad region, wherein the plurality of pads includes a plurality of first pads having a first between-angle variation and arranged continuously, and a plurality of second pads having a second between-angle variation different from the first between-angle variation and arranged continuously.

First between-angles formed by the first direction axis and the plurality of first pads may be increased according to the first between-angle variation as the plurality of first pads are progressively closer to a center of the pad region, and second between-angles formed by the first direction axis and the plurality of second pads may be increased according to the second between-angle variation as the plurality of second pads are progressively closer to the center of the pad region.

A first between-angle $\theta 1n$ may be formed by an extension line of an n-th first pad among the first pads and the reference line and satisfies Equation 1 below, $$\theta_{1n}=\theta_{11}+(n-1)\alpha \qquad \text{[Equation 1]}$$

where $\theta 11$ is a first between-angle formed by an extension line of a first pad disposed at the outermost among the first pads and the reference line, n is a natural number greater than or equal to 2, and $\alpha$ is the first between-angle variation.

A second between-angle $\theta 2m$ may be formed by an extension line of an m-th second pad among the second pads and the reference line and satisfies Equation 2 below, $$\theta_{2m}=\theta_{21}+(m-1)\beta \qquad \text{[Equation 2]}$$

where $\theta 21$ is a second between-angle formed by an extension line of a second pad disposed at the outermost among the second pads and the reference line, m is a natural number greater than or equal to 2, and $\beta$ is the second between-angle variation.

Exemplary embodiments of the present disclosure also provide an electronic component, including a pad region configured to receive a driving signal, the pad region including a first pad row having pads extending along corresponding extension lines, and a second pad row having pads extending along corresponding extension lines, and a signal wire electrically connected to the pad region, wherein the pads of the first pad row include first pads and second pads, extension lines of the first pads substantially converging into a first point, and extension lines of the second pads substantially converging into a second point different from the first point, and wherein the pads of the second pad row include third pads and fourth pads, extension lines of the third pads substantially converging into a third point, and extension lines of the fourth pads substantially converging into a fourth point different from the third point.

The pads of the first pad row may be arranged along a first direction axis, and between-angles formed by the extension lines of the pads of the first pad row and a second direction axis orthogonal to the first direction axis may be reduced as progressively closer from an outer of the first pad row to a center.

First between-angles formed by the extension lines of the first pads and the second direction axis may be reduced by a first value as progressively closer from an outer of the first pad row to a center, and second between-angles formed by the extension lines of the second pads and the second direction axis are reduced by a second value different from the first value as progressively closer from the outer of the first pad row to the center.

A first between-angle $\theta 1n$ may be formed by an extension line of an n-th first pad among the first pads and the reference line and satisfies Equation 1 below, $$\theta_{1n}=\theta_{11}-(n-1)\alpha \quad \text{[Equation 1]}$$

where $\theta 11$ is a first between-angle formed by an extension line of a first pad disposed at the outermost among the first pads and the reference line, n is a natural number greater than or equal to 2, and $\alpha$ is the first value.

A second between-angle $\theta 2m$ may be formed by an extension line of an m-th second pad among the second pads and the reference line and satisfies Equation 2 below, $$\theta_{2m}=\theta_{21}-(m-1)\beta \quad \text{[Equation 2]}$$

where $\theta 21$ is a second between-angle formed by an extension line of a second pad disposed at the outermost among the second pads and the reference line, m is a natural number greater than or equal to 2, and $\beta$ is the second value.

The first pads may be closer to the center along the first direction axis than the second pads, and $\theta 11$ satisfies Equation 3 below, $$\theta_{11} \neq \theta_{21}-K \times \beta \quad \text{[Equation 3]}$$

where K is a number of the second pads.

A reference line parallel to the second direction axis may be defined on the center of the first pad row, and the first point and the second point are disposed at different positions on the reference line.

A reference line parallel to the second direction axis may be defined on the center of the first pad row, and one of the first point and the second point may be disposed on the reference line, and the other one of the first and second points is disposed outside the reference line.

The first point and the second point may be disposed on a parallel line parallel to the first direction axis.

A reference line parallel to the second direction axis may be defined on the center of the first pad row, and the pads of the first pad row further may include fifth pads and sixth pads respectively symmetric to the first pads and the second pads relative to the reference line.

The pads of the second pad row may be arranged along the first direction axis, and the between-angles formed by extension lines of the pads of the second pad row and the second direction axis may be reduced as progressively closer from an outer of the second pad row to a center of the second pad row.

Form and arrangement of the pads of the second pad row may be identical to form and arrangement of the pads of the first pad row on a plane.

A first reference line parallel to the second direction axis may be defined at the center of the first pad row, a second reference line parallel to the second direction axis may be defined at the center of the second pad row, and the first reference line and the second reference line may overlap each other.

A distance between the third point and the fourth point may be identical to a distance between the first point and the second point.

The first point and the second point may be disposed at different positions on the first reference line, and the third point and the fourth point may be disposed at different positions on the second reference line.

One of the first point and the second point may be disposed on the first reference line and the other one is disposed outside the first reference line, and one of the third point and the fourth point is disposed on the second reference line and the other one is disposed outside the second reference line.

The first point and the second point may be disposed on a first parallel line parallel to the first direction axis, and the third point and the fourth point are disposed on a second parallel line parallel to the first direction axis.

The pads of the first pad row may be arranged along a first direction axis, each of the first pads has a first pitch and each of the second pads has a second pitch different from the first pitch, the first pitch is defined by a sum of a width of each of the first pads along the first direction axis and an interval along the first direction axis between adjacent two first pads among the first pads, and the second pitch is defined by a sum of a width of each of the second pads along the first direction axis and an interval along the first direction axis between adjacent two second pads among the second pads.

The pads may be farther disposed along the first direction axis from the center than the first pads, and the second pitch is greater than the first pitch.

Exemplary embodiments of the present disclosure also provide an electronic device, including a first electronic component, and a second electronic component electrically connected to the first electronic component, wherein the first electronic component includes a first pad region, and the second electronic component is electrically connected to the first pad region, wherein the first pad region includes a first pad row having pads extending along corresponding extension lines, and a second pad row having pads extending along corresponding extension lines, wherein the pads of the first pad row include first pads and second pads, extension lines of the first pads substantially converging into a first point, and extension lines of the second pads substantially converging into a second point different from the first point, and wherein the pads of the second pad row include third pads and fourth pads, extension lines of the third pads substantially converging into a third point, and extension lines of the fourth pads substantially converging into a fourth point different from the third point.

The second pad region may include a third pad row electrically connected to the first pad row and including pads extending along corresponding extension lines and a fourth pad row electrically connected to the second pad row and including pads extending along corresponding extension lines.

The pads of the third pad row may include fifth pads of which extension lines substantially converge into a fifth point and sixth pads of which extension lines substantially converge into a sixth point different from the fifth point, and the pads of the fourth pad row may include seventh pads of which extension lines substantially converge into a seventh point and eighth pads of which extension lines substantially converge into an eighth point different from the seventh point.

The first electronic component may have a lower strain by heat than the second electronic component.

Lengths in an extended direction of the pads of the third pad row may be less than lengths in an extended direction of the pads of the first pad row, and lengths in an extended direction of the pads of the fourth pad row are less than lengths in an extended direction of the pads of the second pad row.

The first electronic component may include an electro-optical panel or a wiring substrate, and the second electronic component may include a flexible wiring substrate.

The flexible wiring substrate may include an insulating layer having one side where the fifth pads, the sixth pads, the seventh pads, and the eighth pads may be disposed, first wires disposed on the one side of the insulating layer and connected to the fifth pads, the sixth pads, the seventh pads, and the eighth pads, and second wires disposed on the other side of the insulating layer and connected to some of the first wires via first through holes defined in the insulating layer.

The flexible wiring substrate may further include third wires disposed on the one side of the insulating layer and spaced apart from the first wires, and the third wires may be connected to the second wires via second through holes defined in the insulating layer.

The second electronic component may further include a driving chip connected to the first wires.

Each of the second wires may include a land portion overlapping a corresponding first through hole among the first through holes, and a wiring portion connected to the land portion, wherein the land portion has a form in which a width is decreased as progressively closer from the first through hole to the wiring portion.

The flexible wiring substrate may further include a dummy pad disposed between the third pad row and the fourth pad row.

The dummy pad may be disposed on the same layer as the fifth pads, the sixth pads, the seventh pads, and the eighth pads.

BRIEF DESCRIPTION OF THE DRAWINGS

Features will become apparent to those of ordinary skill in the art by describing in detail exemplary embodiments with reference to the attached drawings, in which:

FIG. 15 illustrates a plan view of a pad region of an electronic device where a bonding process is completed according to an embodiment;

FIGS. 26A to 26E illustrate partially enlarged views of wires shown in FIGS. 24B and 24C;

DETAILED DESCRIPTION

Figure 1:
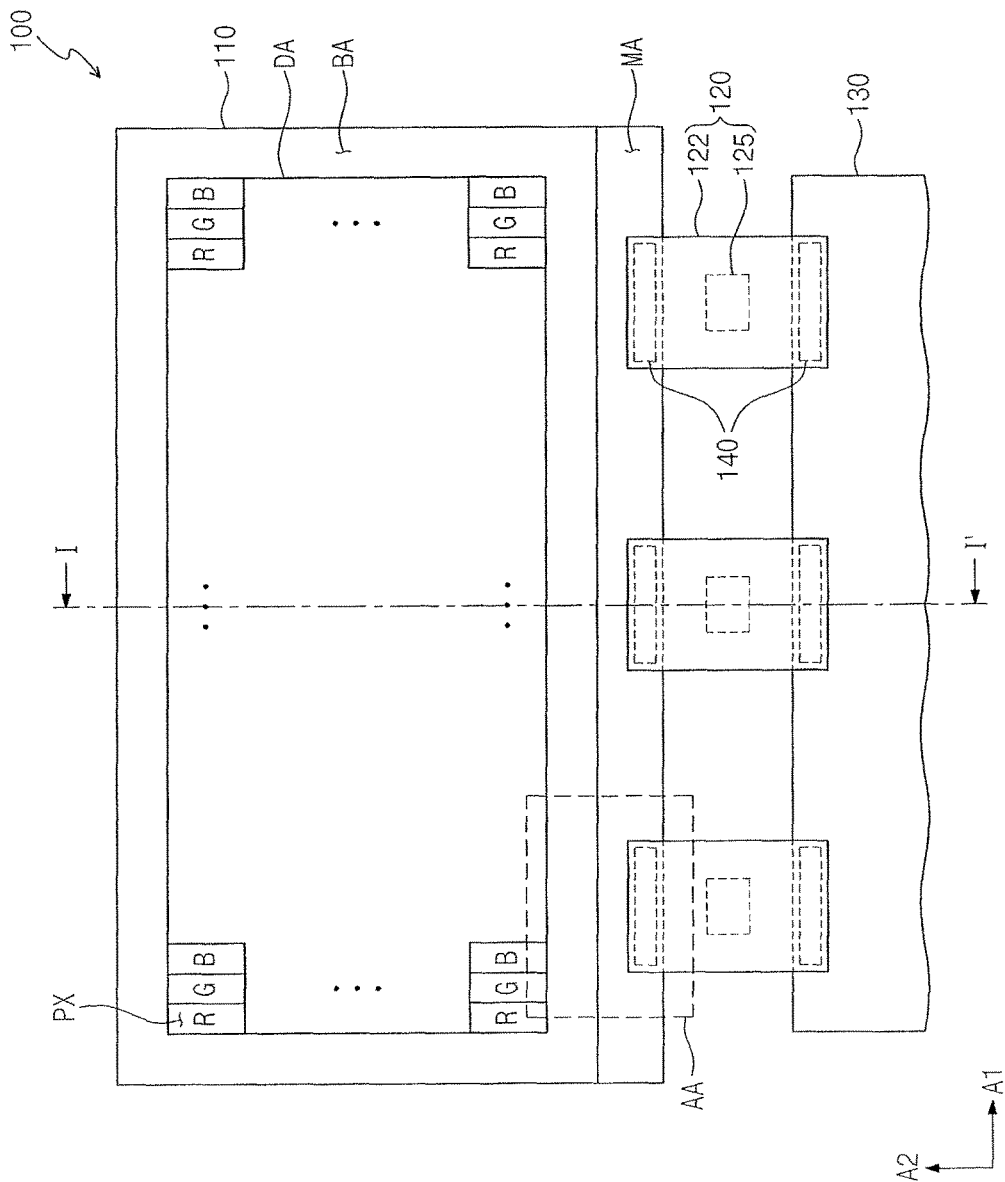
FIG. 1 illustrates a plan view of an electronic device according to an embodiment.

Various modifications are possible in various embodiments and specific embodiments are illustrated in drawings and related detailed descriptions are listed. Accordingly, embodiments are not intended to limit and are understood to include all modifications, equivalents, and substitutes within the scope and technical range of exemplary implementations.

In describing each drawing, like reference numerals refer to like elements. In the accompanying drawings, the dimensions of structures may be exaggerated for clarity of illustration. It will be understood that the terms "first" and "second" are used herein to describe various components but these components should not be limited by these terms. These terms are used only to distinguish one component from other components. For example, a first component may be referred to as a second component and vice versa without departing from the scope of the embodiments. The terms of a singular form may include plural forms unless they have a clearly different meaning in the context.

Additionally, in this specification, the meaning of "include," "comprise," "including," or "comprising," specifies a property, a region, a fixed number, a step, a process, an element and/or a component but does not exclude other properties, regions, fixed numbers, steps, processes, elements and/or components. It will also be understood that when a layer (or film) is referred to as being 'on' another layer or substrate, it can be directly on the other layer or substrate, or intervening layers may also be present. It will also be understood that when a layer (or film) is referred to as being 'under' another layer or substrate, it can be directly on the other layer or substrate, or intervening layers may also be present.

Hereinafter, preferred embodiments will be described in more detail with reference to the accompanying drawings.

Figure 2:
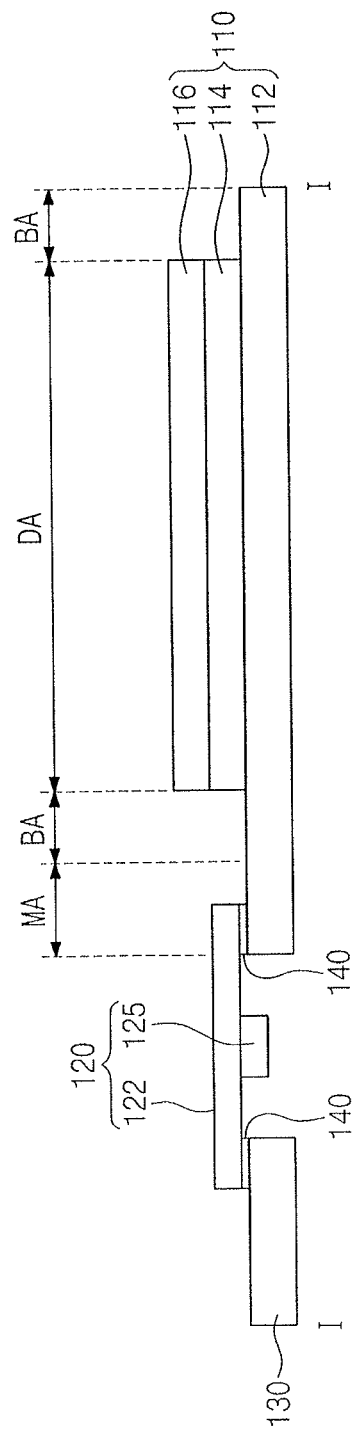
FIG. 2 illustrates a cross-sectional view taken along line I-I' of FIG. 1.
Figure 3A:
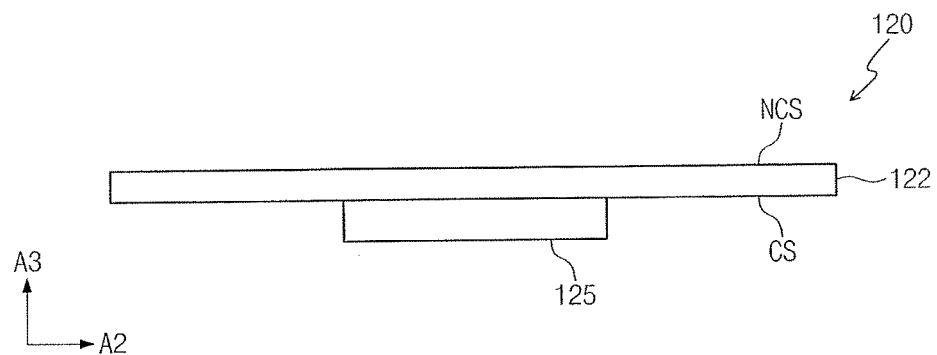
FIG. 3A illustrates a side view of a second electronic component according to an embodiment.
Figure 3B:
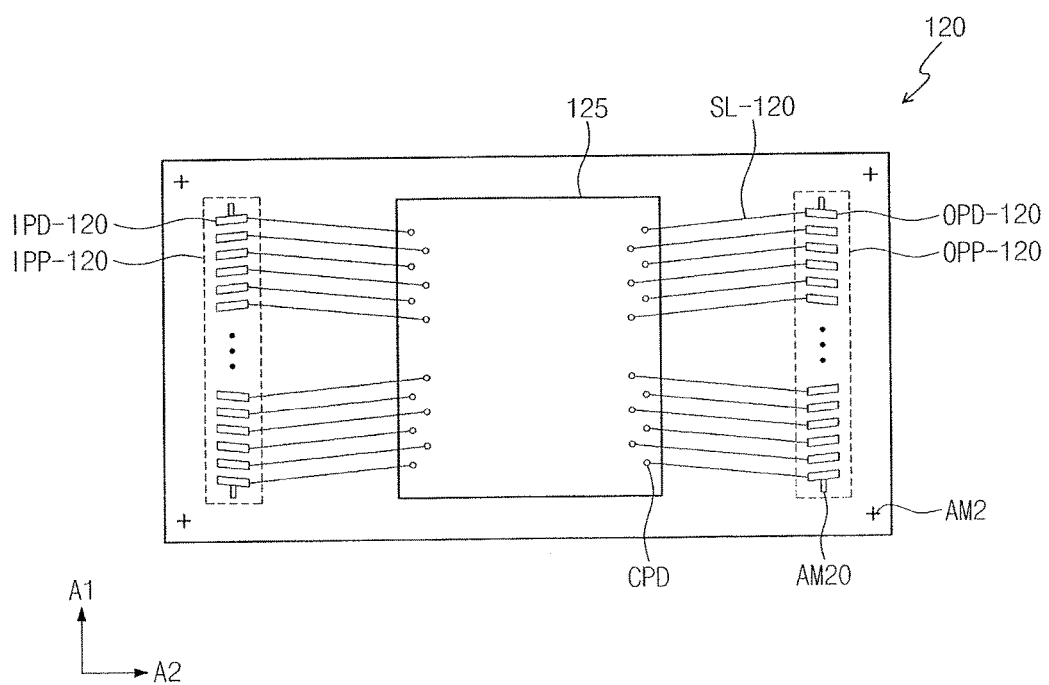
FIG. 3B illustrates a plan view of a second electronic component according to an embodiment.

FIG. 1 is a plan view illustrating an electronic device according to an embodiment. FIG. 2 is a sectional view taken along a line I-I' of FIG. 1. FIG. 3A is a side view of a second electronic component according to an embodiment. FIG. 3B is a plan view of a second electronic component according to an embodiment.

Referring to FIGS. 1 and 2, the electronic device 100 includes first to third electronic components 110, 120, and 130. The first to third electronic components are electrically connected to each other. In the embodiment, the first electronic component 110 may be an electro-optical panel. The second electronic component 120 may be a connection wiring substrate. The third electronic component 130 may be a main wiring substrate. Each of the connection wiring substrate and the main wiring substrate may include a printed circuit board. This embodiment exemplarily illustrates the electronic device 100 including three second electronic components 120 but embodiments are not limited thereto. According to application or size, the electronic device 100 may include one second electronic component 120.

As shown in FIG. 1, the electro-optical panel 110 (hereinafter referred to as a display panel) may be a display panel displaying a desired image by applying a driving signal to a plurality of pixels PX. The plurality of pixels PX may be disposed in a matrix according to a first direction axis A1 and a second direction axis A2 perpendicular to each other. According to an embodiment, the pixels PX may include first to third pixels displaying red color R, green color G, and blue color B, respectively. According to an embodiment, the pixels PX may further include some of pixels (not shown) displaying white, cyan, and magenta. The plurality of pixels PX may be defined as a display unit of the display panel 110.

According to the types of the plurality of pixels PX, the display panel 110 may be divided as a liquid crystal display panel, an organic light emitting display panel, and an electrowetting display panel. In this embodiment, the display panel 110 may be an organic light emitting display panel.

On a plane, the display panel 110 may include a display area DA where the plurality of pixels PX are disposed, a non-display area BA surrounding the display panel DA, and a mounting area MA where the second electronic component 120 is coupled. According to an embodiment of, the non-display area BA and the mounting area MA may not be distinguishable from each other. The non-display area BA may be omitted or the mounting area MA may be part of the non-display area BA.

As shown in FIG. 2, the display panel 110 may include a display substrate 112, a display device layer 114 disposed on the display substrate 112, and a sealing layer 116 disposed on the display device layer 114. The display substrate 112 may include a base substrate and a plurality of insulating layers, functional layers, and conductive layers on the base substrate. The conductive layer may include gate wires (not shown), data wires (not shown), and other signal wires. Additionally, the conductive layer may include a pad region (not shown) connected to the wires. The wires provide a driving signal to the plurality of pixels PX.

The display device layer 114 may include a plurality of insulating layers, functional layers, and conductive layers for configuring the plurality of pixels PX. The functional layer may include an organic light emitting layer. The sealing layer 116 is disposed on the display device layer 114. The sealing layer 116 protects the display device layer 114. Although not specifically shown in the drawing, according to an embodiment, the sealing layer 116 may cover a side of the display device layer 114. Additionally, according to the type of the display panel 110, the sealing layer 116 may be omitted or replaced with another display substrate.

A black matrix (not shown) blocking light may be disposed in the non-display area BA. A gate driving circuit (not shown) for applying a gate signal to the plurality of pixels PX may be provided in the non-display area BA. According to an embodiment, a data driving circuit (not shown) may be further provided in the non-display area BA. A pad region (not shown) for receiving a signal from the second electronic component 120 is disposed in the mounting area MA.

As shown in FIGS. 1 and 2, the second electronic component 120 includes a flexible wiring substrate 122 and a data driving circuit 125. The data driving circuit 125 may include at least one driving chip. The data driving circuit 125 is electrically connected to the wires of the flexible wiring substrate 122.

When the second electronic component 120 includes the data driving circuit 125, a pad region (not shown) of the display panel 110 may include data pads electrically connected to data wires and control signal pads electrically connected to control signal wires. The data wires may be connected to the pixels PX and the control signal wires may be connected to the gate driving circuit. In this embodiment, the second electronic component 120 has a chip on film structure but embodiments are not limited thereto.

The second electronic component 120 may be further described with reference to FIGS. 3A and 3B. The flexible wiring substrate 122 includes an insulating layer (not shown), a plurality of pads CPD, IPD-120, and OPD-120 and a plurality of wires SL-120. The plurality of pads CPD, IPD-120, and OPD-120 and the plurality of wires SL-120 are disposed on the insulating layer. The insulating layer may include a polyimide.

The plurality of pads CPD, IPD-120, and OPD-120 may include connection pads CPD connected to connection terminals (not shown) of the data driving circuit 125, input pads IPD-120 connected to the third electronic component 130, and output pads OPD-120 connected to the display panel 110. The input pads IPD-120 may be defined as an input pad region IPP-120 disposed at one side of the flexible wiring substrate 122 and the output pads OPD-120 may be defined as an output pad region OPP-120 disposed at the other side of the flexible wiring substrate 122. In this embodiment, the connection pads CPD are arranged overlapping the both sides of the data driving circuit 125 but unlike FIG. 3B, the connection pads CPD may be randomly arranged in correspondence to connection terminals of the data driving circuit 125.

In this embodiment, the input pad region IPP-120 and the output pad region OPP-120, each including one pad row, is exemplarily shown. The pad row includes a plurality of pads arranged along the first direction axis A1. According to an embodiment, each of the input pad region IPP-120 and the output pad region OPP-120 may include a plurality of pad rows.

Some of the wires SL120 connect the connection pads CPD and the input pads IPD-120 and some other wires connect the connection pads CPD and the output pads OPD-120. Although not shown in the drawing, the wires SL-120 may directly connect some of the input pads IPD-120 and some of the output pads OPD-120.

The flexible wiring substrate 122 may be disposed on the insulating layer and further may include a solder resist layer covering at least the plurality of wires SL-120. The solder resist layer may further cover the periphery of the plurality of pads CPD, IPD-120, and OPD-120 and may expose at least each of the plurality of pads CPD, IPD-120, and OPD-120. Openings corresponding to the plurality of pads CPD, IPD-120, and OPD-120 may be formed in the solder resist layer.

Additionally, the flexible wiring substrate 122 may include align marks AM2 and AM20 used for a bonding process described later. FIG. 3B exemplarily illustrates four first align marks spaced apart from the plurality of pads CPD, IPD-120, and OPD-120 and four second align marks AM20 connected to the input pads IPD-120 and the output pads OPD-120. At least one of the first and second align marks AM2 and AM20 may be omitted.

According to an embodiment, the surface where the input pads IPD-120 and the output pads OPD-120 are exposed is defined as a coupling surface of the flexible wiring substrate 122 and the surface facing the coupling surface is defined as a non-coupling surface NCS. In this embodiment, although it is shown that the data driving circuit 125 is disposed on the coupling surface CS, embodiments are not limited thereto and the data driving circuit 125 may be disposed on the non-coupling surface NCS.

Referring to FIGS. 1 and 2 again, the third electronic component 130 provides image data, control signal, and power voltage to the display panel 110 or the data driving circuit 125. The third electronic component 130 may include active devices and passive devices on a wiring substrate different from the flexible wiring substrate 122. The third electronic component 130 may include a pad region (not shown) connected to the flexible wiring substrate 122, on a flexible wiring substrate or a rigid wiring substrate.

Referring to FIGS. 1 to 3B, the output pad region OPP-120 of the flexible wiring substrate 122 and a pad region of the display panel 110 may be electrically connected to each other by a conductive adhesive film 140. The input pad region IPP-120 of the flexible wiring substrate 122 and a pad region of the third electronic component 130 may be electrically connected to each other by the conductive adhesive film 140. The conductive adhesive film 140 may be an anisotropic conductive film (ACF). According to an embodiment, a solder bump may replace the conductive adhesive film 140.

A pad region of the display panel 110 may include pads corresponding to the output pads OPD-120 of the flexible wiring substrate 122. Or, a pad region of the third electronic component 130 may include pads corresponding to the input pads IPD-120 of the flexible wiring substrate 122.

Hereinafter, an electrical connection structure of the first to third electronic components 110, 120, and 130 will be described in more detail by referring to the pad region of the display panel 110 and the output pad region OPP-120 of the flexible wiring substrate 122. An electrical connection structure of the second electronic component 120 and the third electronic component 130 may correspond to an electrical connection structure of the pad portion of the display panel 110 and the output pad OPP-120 of the flexible wiring substrate 122 described later. Additionally, although it is described that the electronic device 100 includes the first to third electronic components 110, 120, and 130, any one of the first electronic component 110 and the third electronic component 130 may be omitted.

Figure 4A:
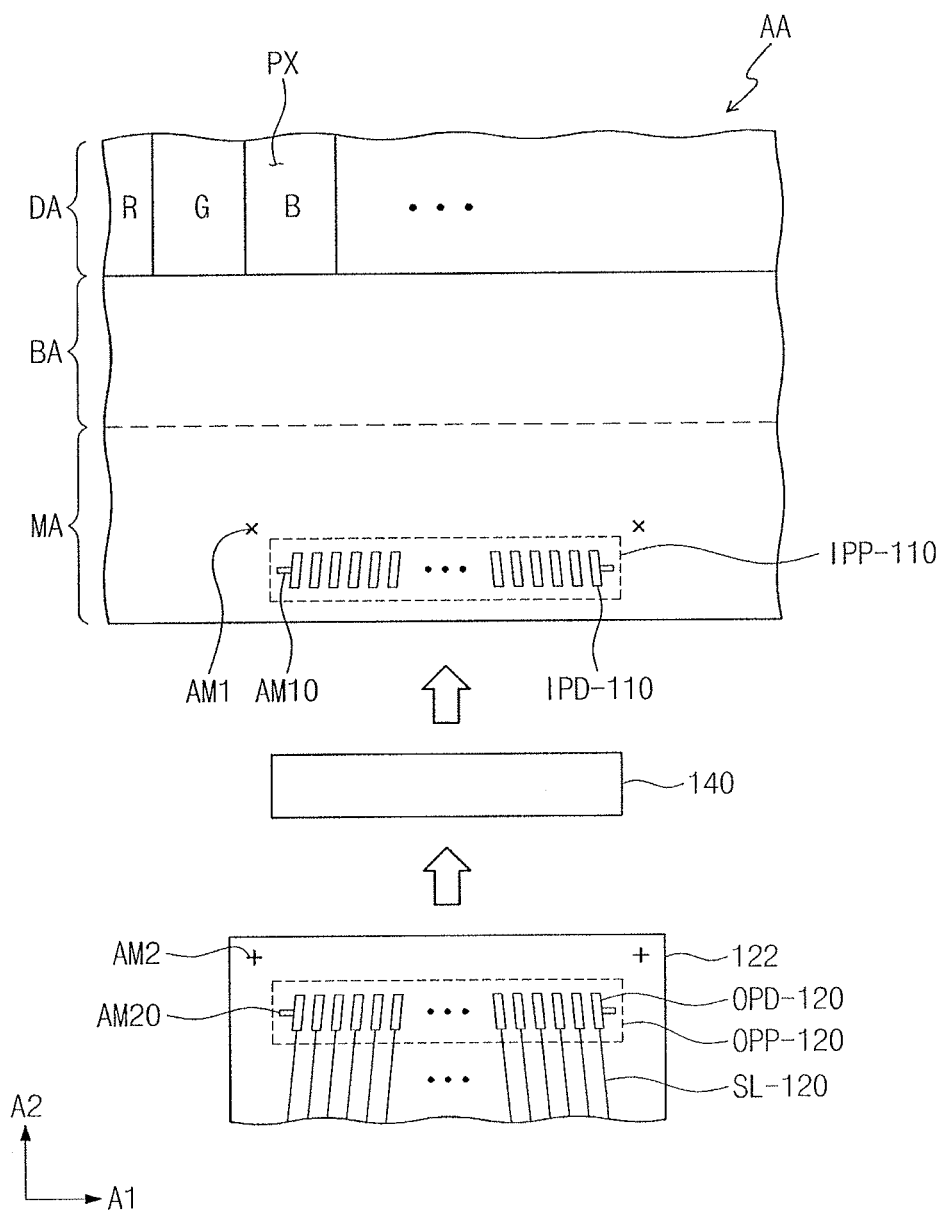
FIG. 4A illustrates a plan view of separated pad regions of two electronic components shown in FIG. 1.
Figure 4B:
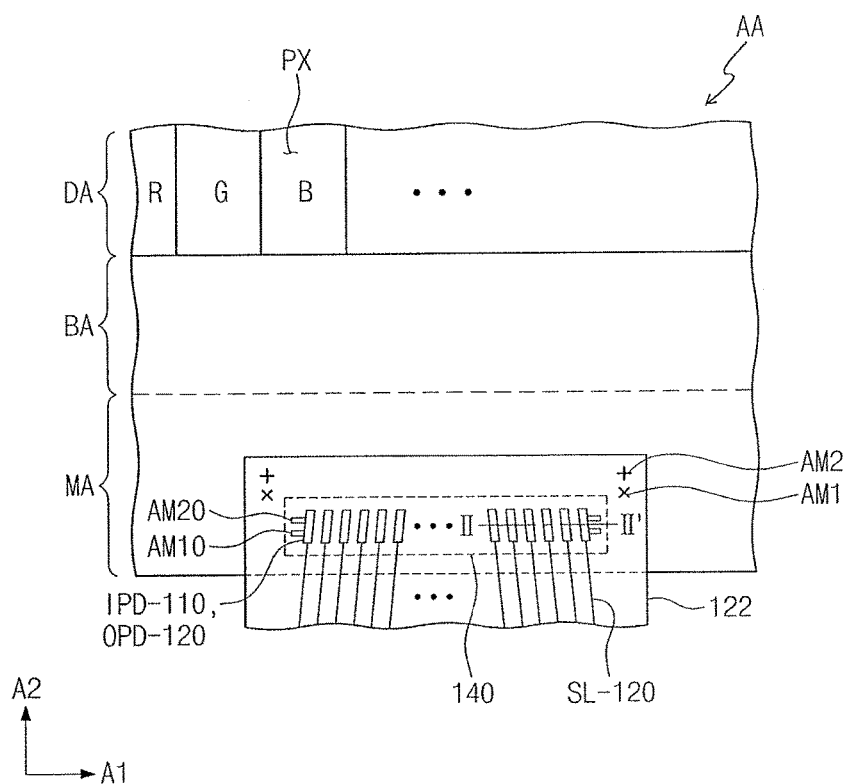
FIG. 4B illustrates a plan view of coupled pad regions of two electronic components shown in FIG. 1.
Figure 4C:
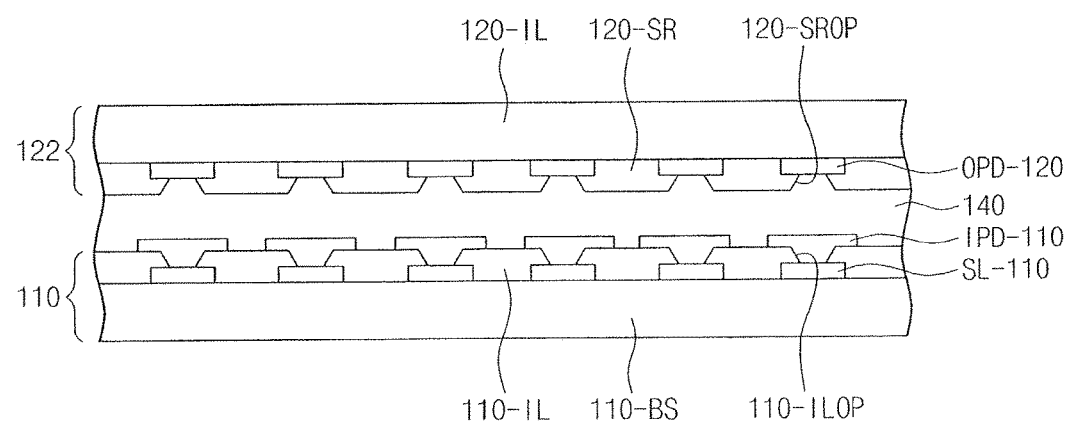
FIG. 4C illustrates a partial cross-sectional view of component 122 along line II-II' in FIG. 4B.

FIG. 4A is a plan view illustrating separated pad regions of two electronic components shown in FIG. 1. FIG. 4B is a plan view illustrating coupled pad regions of two electronic components shown in FIG. 1. FIG. 4C is a sectional view taken along a line II-II' of FIG. 4B.

As shown in FIG. 4A, the display panel 110 includes an input pad region IPP-110 corresponding to the output pad region OPP-120 of the flexible wiring substrate 122. The input pad region IPP-110 includes input pads IPD-110 corresponding to the output pads OPD-120 of the flexible wiring substrate 122. In this embodiment, although it is shown that the input pads IPD-110 one-to-one correspond to the output pads OPD-120, embodiments are not limited thereto. According to another embodiment, the input pad region IPP-110 and the output pad region OPP-120 may include a different number of pads and a different number of pad rows.

The display panel 110 may include first and second align marks AM1 and AM10 corresponding to the first and second align marks AM2 and AM20 of the flexible wiring substrate 122. One of the first and second align marks AM1 and AM10 may be omitted.

As shown in FIG. 4B, the output pads OPD-120 of the flexible wiring substrate 122 and the input pads IPD-110 of the display panel 110 are electrically connected to each other. By using the first and second align marks AM2 and AM20 of the flexible wiring substrate 122 and the first and second align marks AM1 and AM10 of the display panel 110, the output pad region OPP-120 and the input pad region IPP-110 are aligned and an align correction is performed along the second direction axis A2. Then, the output pads OPD-120 and the input pads IPP-110 are coupled to each other with the conductive adhesive film 140 therebetween by using a tool.

For convenience of description, it is shown in FIG. 4B that corresponding pads of the output pads OPD-120 and the input pads IPD-110 overlap each other completely. Embodiments are not limited thereto. Due to numeral errors occurring during a manufacturing process or numeral errors occurring during a bonding process, corresponding pads of the output pads OPD-120 and the input pads IPP-110 may not overlap completely. This will be described in detail later.

As shown in FIG. 4C, signal wires SL-110 are disposed on a base substrate 110-BS of the display panel 110. An insulating layer 110-IL is disposed on the base substrate 110-BS. The insulating layer 110-IL may include a barrier layer and a passivation layer. The input pads IPD-110 are disposed on the insulating layer 110-IL and are connected to the signal wires SL-110 via through holes 110-ILOP defined in the insulating layer 110-IL.

The wires SL 120 of FIG. 4B and the output pads OPD-120 connected to the wires SL-120 are disposed on the insulating layer 120-IL of the flexible wiring layer 120-IL. The wires SL-120 and the output pads OPD-120 may be disposed on the same layer. According to an embodiment, the wires SL-120 and the output pads OPD-120 may be disposed on different layers with another insulating layer therebetween. At this point, the wires SL-120 and the output pads OPD-120 may be connected to each other via through holes formed in another insulating layer.

A solder resist layer 120-SR is disposed on the insulating layer 120-IL. The output pads OPD-120 are exposed via through holes 120-SROP formed in the solder resist layer 120-SR. According to an embodiment, the solder resist layer 120-SR covers only the wires SL-120 and does not cover the output pads OPD-120.

Through the conductive adhesive film 140, the output pads OPD-120 and the input pads IPD-110 are electrically connected to each other. Although not shown in the drawing, through a plurality of conductive balls in the conductive adhesive film 140, a corresponding output pad and input pad among the output pads OPD-120 and the input pads IPD-110 may be electrically connected to each other.

As shown in FIG. 4B, the reason that the first and second align marks AM2 and AM20 of the flexible wiring substrate 122 and the first and second align marks AM1 and AM10 of the display panel 110 are misaligned along the second direction axis A2 is because the alignment correction is performed along the second direction axis A2 during the bonding process. By the align correction, a coupling area (i.e., an overlapping area) of an output pad and an input pad among the output pads OPD-120 and the input pads IPD-110 may be increased. As described later, the reason that the coupling area is increased by the align correction is because the output pads OPD-120 and the input pads IPD-110 have a form extending in a tilt direction relative to the first direction axis A1. This will be described in detail later.

During a coupling operation using the tool during the bonding process, the output pad region OPP-120 and the input pad region IPP-110 may expand along the first direction axis A1 by a heat emitted from the tool. The output pad region OPP-120 and the input pad region IPP-110 may expand at different rates. Additionally, the output pad region OPP-120 and the input pad region IPP-110 may expand at different rates according to positions based on the first direction axis A1.

According to this embodiment, even when the output pad region OPP-120 and the input pad region IPP-110 expand along the first direction axis A1 during the coupling operation, a corresponding output pad and input pad may have a predetermined coupling area (i.e., an overlapping area) regardless of a position along the first direction axis A1. As described later, this is because at least one pad among the output pad region OPP-120 and the input pad region IPP-110 includes pad groups having different pitches along the first direction axis A1. This will be described in detail later.

Figure 5A:
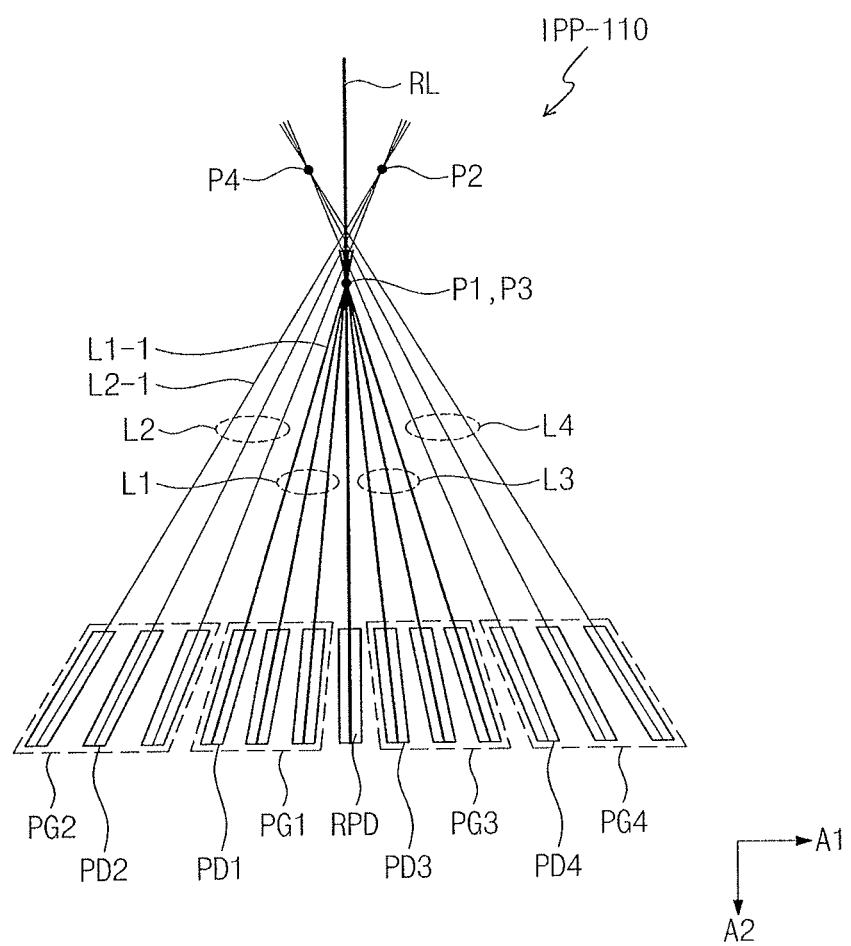
FIGS. 5A to 5D illustrate plan views of a pad region of a first electronic component according to an embodiment.
Figure 5B:
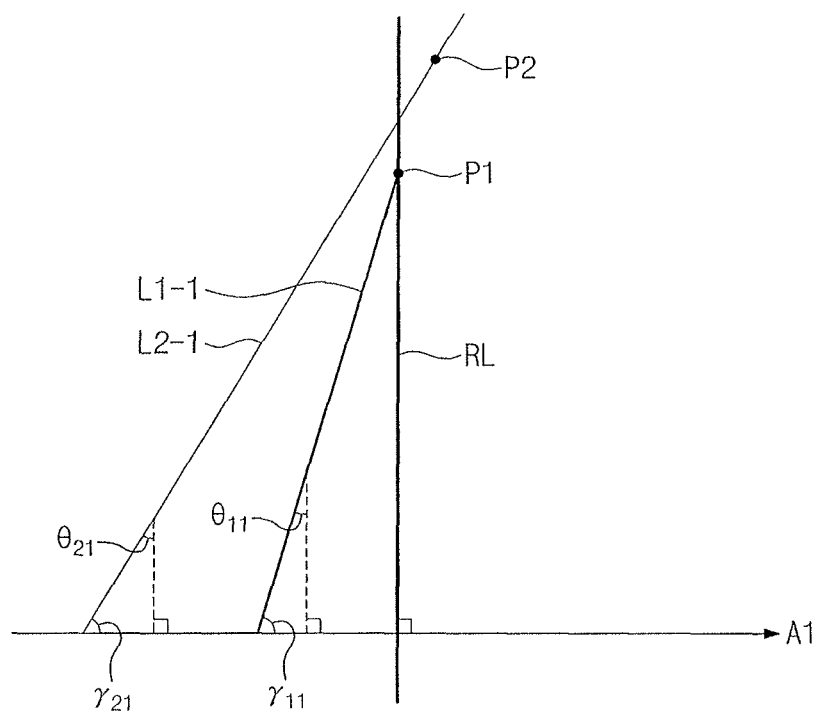
Figure 5C:
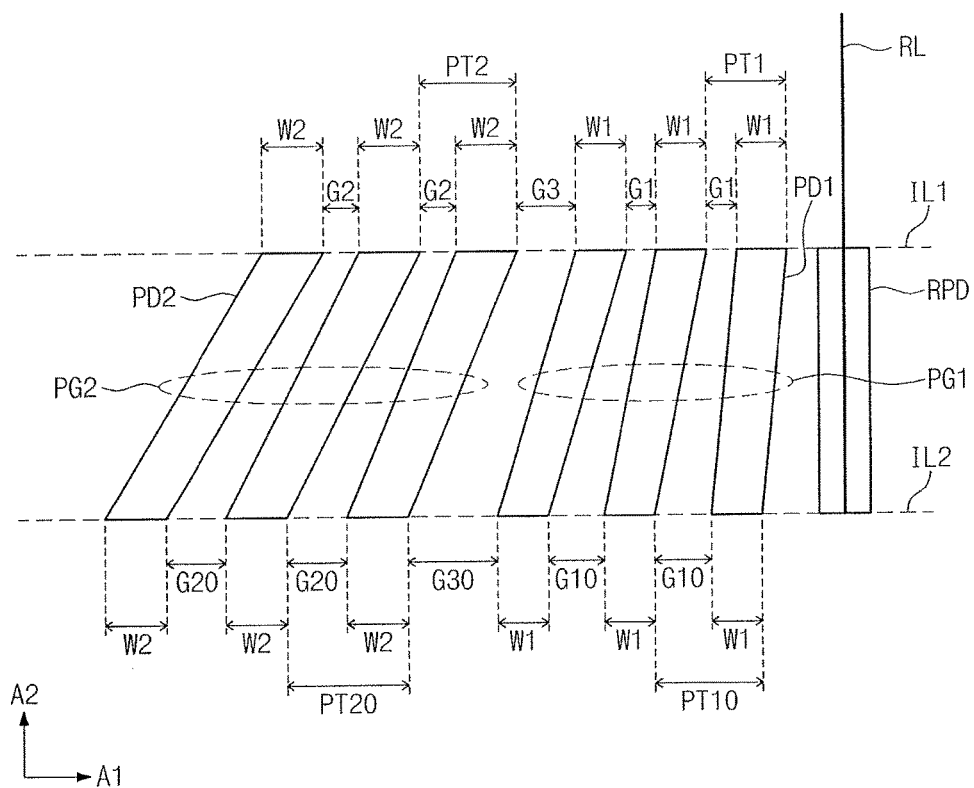
Figure 5D:
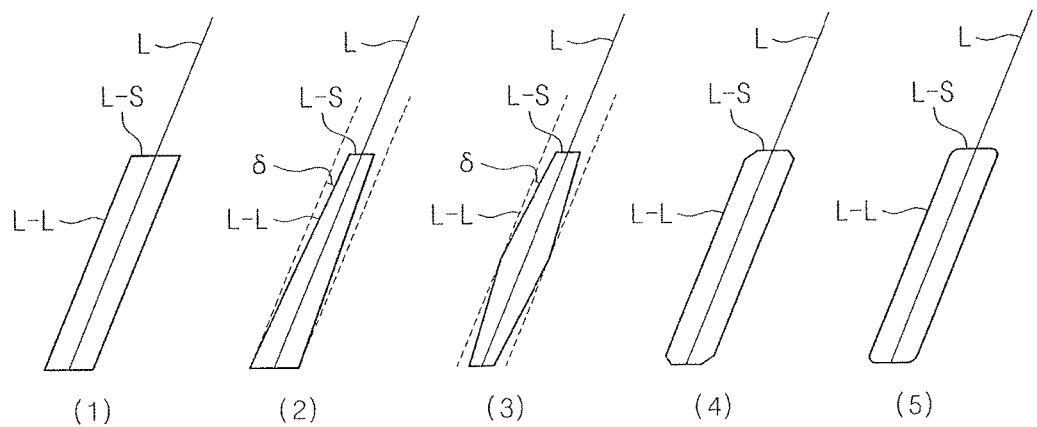

FIGS. 5A to 5D are plan views illustrating a pad region of a first electronic component according to an embodiment. FIG. 5B is a view illustrating only a part of extension lines shown in FIG. 5A. FIG. 5C illustrates first pads and second pads and FIG. 5D illustrates various pad forms.

As shown in FIGS. 5A and 5B, the input pad region IPP-110 of the display panel 110 includes a plurality of input pads arranged along the first direction axis A1. The input pad region IPP-110 includes a first and second pad group PG1 and PG2 disposed at the left and a third and fourth pad group PG3 and PG4 at the right, on the basis of a reference line RL. The reference line RL is disposed at the center along the first direction axis A1 of the input pad region IPP-110 on the basis of a virtual axis parallel to the second direction axis A2. The input pad region IPP-110 may further include a reference pad RPD that overlaps and is parallel to the reference line RL.

In this embodiment, the first pad group PG1 and the third pad group PG3 are symmetric to each other relative to the reference line RL and the second pad group PG2 and the fourth pad group PG4 are symmetric to each other relative to the reference line RL. However, embodiments are not limited thereto. The third pad group PG3 may include pads having a different arrangement than the first pad group PG1 and the fourth pad group PG4 may include pads having a different arrangement than the second pad group PG2. Additionally, the first pad group PG1 and the third pad group PG3 may be arranged symmetrically relative to the reference line RL but may include a different number of pads. Additionally, the second pad group PG2 and the fourth pad group PG4 may be arranged symmetrically relative to the reference line RL but may include a different number of pads.

The input pad region IPP-110 may include pad groups of more than two, three, and five but in this embodiment, for convenience of description, the input pad region IPP-110 including for pad groups (that is, first to fourth pad groups PG1, PG2, PG3, and PG4) is illustrated as one example. The first pad group PG1 includes a plurality of first pads PD1 and the second pad group PG2 includes a plurality of second pads PD2. Additionally, the third pad group PG3 includes a plurality of third pads PD3 and the fourth pad group PG4 includes a plurality of fourth pads PD4. The first to fourth pad groups PG1, PG2, PG3, PG4, each including three pads, are illustrated exemplarily. Substantially, the first to fourth pads PD1, PD2, PD3, and PD4 may be input pads IPD-110 shown in FIGS. 4A and 4B.

Each of the plurality of first pads PD1, the plurality of second pads PD2, the plurality of third pads PD3, and the plurality of fourth pads PD4 has a form extending in a direction intersecting the reference line RL and the first direction axis A1. FIG. 5A illustrates extension lines L1 (hereinafter referred to as a plurality of first lines) representing an extended direction of the plurality of first pads PD1, extension lines L2 (hereinafter referred to as a plurality of second lines) representing an extended direction of the plurality of second pads PD2, extension lines L3 (hereinafter referred to as a plurality of third lines) representing an extended direction of the plurality of third pads PD3, and extension lines L4 (hereinafter referred to as a plurality of fourth lines) representing an extended direction of the plurality of fourth pads PD4.

The first lines L1 are defined under the same condition relative to the plurality of first pads PD1. For example, each of the first lines L1 may be defined as a line bisecting the area of a corresponding first pad PD1. When the first pads PD1 have a parallelogram form, each of the first lines L1 may be defined as a line bisecting the area of a corresponding first pad PD1 and parallel to a long side. When the first pads PD1 have a parallelogram form, each of the first lines L1 may be defined as a diagonal line bisecting the area of a corresponding first pad PD1 and as a line parallel to the diagonal line.

Like the first lines L1 are defined, the second lines L2 are defined identically relative to the plurality of second pads PD2, the third lines L3 are defined identically relative to the plurality of third pads PD3, and the fourth lines L4 are defined identically relative to the plurality of fourth pads PD4.

The first lines L1 converge into a first point P1 and the second lines L2 converge into a second point P2. The first point P1 may be disposed on the reference line RL and the second point P2 may be disposed outside the reference line RL.

The first lines L3 converge into a first point P1 and the second lines L4 converge into a second point P2. The first point P1 and the third point P3 may be disposed at the same position. The fourth point P4 may be disposed at a position symmetric to the second point P2 relative to the reference line RL.

The plurality of first lines L1, the plurality of second lines L2, the plurality of third lines L3, and the plurality of fourth lines L4 form predetermined between-angles with the reference line RL. The between-angles formed by the plurality of first lines L1 and the reference line RL may vary and the between-angles formed by the plurality of second lines L2 and the reference line RL may vary.

FIG. 5B illustrates a between-angle θ11 formed by the first line L1-1 of a first pad (hereinafter referred to as the outermost first pad) disposed at the outermost from the reference line RL among the plurality of first pads PD1 and the reference line RL and a between-angle θ21 formed by the second line L2-1 of a second pad (hereinafter referred to as the outermost second pad) disposed at the outermost from the reference line RL among the plurality of second pads PD2 and the reference line RL.

A between-angle θ1n formed by the first line of the n-th pad among the plurality of first pads PD1 and the reference line RL satisfies the following equation 1.

$$\theta_{1n}=\theta_{11}-(n-1)\alpha \quad \text{[Equation 1]}$$

where n is a natural number equal to or greater than 2. α is a variation (hereinafter referred to as a first between-angle variation) of between-angles formed by the first lines L1 of the plurality of first pads PD1 and the reference line RL. As described later, α may be determined according to the positions of the plurality of first pads PD1 and the position of the first point P1.

The first between-angle variation α may be calculated by measuring all between-angles of the plurality of first pads PD1. Additionally, in relation to the first between-angle variation α, after each of a tilt angle of the outermost first pad and a tilt angle of the n-th first pad is measured, its difference value is calculated and then, an average variation is calculated by dividing the difference value by the number of first pads. FIG. 5B illustrates a between-angle γ11 formed by the first line L1-1 of the outermost first pad among the plurality of first pads PD1 and the first direction axis A1 and a between-angle γ21 formed by the second line L2-1 of the outermost second pad among the plurality of the second pads PD2 and the first direction axis A1.

A between-angle γ1n formed by the first line of the n-th pad among the plurality of first pads PD1 and the first direction axis A1 satisfies the following equation 1. The between angle γ1n may be represented in Equation 2 below and also may be represented in the type of Equation 1. That is, a between-angle γ11 between the first line L1-1 of the outermost first pad and the first direction axis A1 may be represented in 90-θ11.

$$\gamma_{1n}=90-\theta_{1n} \quad \text{[Equation 2]}$$

A between-angle θ2m formed by the second line of the m-th pad among the plurality of second pads PD2 and the reference line RL satisfies the following equation 3.

$$\theta_{2m}=\theta_{21}-(m-1)\beta \quad \text{[Equation 3]}$$

where m is a natural number equal to or greater than 2. β is a variation (hereinafter referred to as a second between-angle variation) of between-angles formed by the second lines L2 of the plurality of second pads PD2 and the reference line RL. As described later, β may be determined according to the positions of the plurality of second pads PD2 and the position of the second point P2. β is identical to or different from α. The second between-angle variation β may be measured in the same manner as the first between-angle variation α.

Additionally, when the second pad group PG2 includes K second pads, a between-angle between the second line of the K-th second pad and the reference line RL may differ from a between-angle θ11 between the first line L1-1 of the outermost first pad among the plurality of first pads PD1 and the reference line RL. This may be represented as the following Equation 4.

$$\theta_{11}\neq\theta_{21}-K\beta \quad \text{[Equation 4]}$$

As shown in Equation 5, when the second pad group PG2 includes K second pads, a between-angle between the second line of the K-th second pad and the reference line RL is greater than a between-angle θ11 between the first line L1-1 of the outermost first pad and the reference axis RX. The K-th second pad may be a pad closest to the first pad group PG1 among the second pads.

$$\theta_{11}<\theta_{2K}-\beta \quad \text{[Equation 5]}$$

The first pads PD1 and the second pads PD2 will be described in more detail with reference to FIG. 5C. Each of the first pads PD1 and the second pads PD2 may have a parallelogram form in which widths W1 and W2 along the first direction axis A1 are uniform. The first pads PD1 have the same width W1 and the second pads have the same width W2. The widths W1 of the first pads PD1 may be identical to or different from the widths W2 of the second pads PD2.

Lengths projected on the reference lines PL (see FIGS. 5A and 5B) of the first pads PD1 and the second pads PD2 may be identical to each other. A multiplication of the length measured along each extension line of the plurality of first pads PD1 and cosine between-angle θ1n (see Equation 1) of each of the plurality of first pads PD1 may be identical substantially. A multiplication of the length measured along each extension line of the plurality of second pads PD2 and cosine between-angle θ2m (see Equation 3) of each of the plurality of second pads PD2 may be identical substantially.

As shown in FIG. 5A, the reason that the first lines L1 and the second lines L2 converge into the different first and second points P1 and P2 is because the first pad group PG1 and the second pad group 2 including pads tilted relative to the reference line RL are discontinuous. Herein, the discontinuity means that the first pad group PG1 and the second pad group PG2 have different pitches.

Pitches PT1 and PT10 of the first pad group PG1 are defined by the sum of the width W1 of the first pad PD1 and intervals G1 and G10 between adjacent first pads PD1. Pitches PT2 and PT20 of the second pad group PG2 are defined by the sum of the width W2 of the second pad PD2 and intervals G2 and G20 between adjacent second pads PD2.

The pitches PT1 and PT10 of the first pad group PG1 may have different values according to measurement positions.

The reason for this is that the intervals G1 and G10 between the first pads PD1 vary along the second direction axis A2. In this embodiment, the intervals G1 and G10 between the first pads PD1 are increased as progressively away from the first point P1 (see FIGS. 5A and 5B).

The intervals G2 and G20 between the second pads PD2 are increased as progressively away from the second point P2 (see FIGS. 5A and 5B). With the same reason as the pitches PT1 and PT10 of the first pad group PG1, the pitches PT2 and PT20 of the second pad group PG2 may have different values according to measurement positions. The first pad group PG1 and the second pad group PG2 have different pitches PT1/PT10 and PT2/PT20. The pitches PT1 and PT10 of the first pad group PG1 and the pitches PT2 and PT20 of the second pad group PG2 may be measured on imaginary lines parallel to the first direction axis A1. As show in FIG. 5C, the pitches PT1/PT10 and PT2/PT20 of the first pad group PG1 and the second pad group PG2 may be measured on different first and second imaginary lines IL1 and IL2.

The first pad group PG1 has the first pitch PT1 measured on the first imaginary line IL1. The first pad group PG1 has the second pitch PT10 measured on the second imaginary line IL2. The second pad group PG2 has the third pitch PT2 measured on the first imaginary line IL1. The second pad group PG2 has the fourth pitch PT20 measured on the second imaginary line IL2.

The first pitch PT1 is less than the third pitch PT2. The widths W2 of the second pad PD is greater than the width W1 of the first pad PD1. At this point, an interval G2 between the adjacent second pads PD2 measured on the first imaginary line IL1 may be greater than or equal to an interval G1 between the adjacent first pads PD1. According to an embodiment, the width W2 of the second pad PD may be identical to the width W1 of the first pad PD1. At this point, the interval G2 between the adjacent second pads PD2 measured on the first imaginary line IL1 is greater than the interval G1 between the adjacent first pads PD1.

The first pad group PG1 has a smaller pitch than the second pad group PG2. The second pitch PT10 measured on the second imaginary line IL2 is less than the fourth pitch PT20.

Intervals G3 and G30 between the first pad group PG1 and the second pad group PG2, which are measured on the imaginary lines IL1 and IL2, differ from the intervals G1 and G10 between the adjacent first pads PD1. The Intervals G3 and G30 between the first pad group PG1 and the second pad group PG2, which are measured on the imaginary lines IL1 and IL2, may be identical to or different from the intervals G2 and G20 between the adjacent second pads PD1.

Although not separately shown in the drawing, the input pad region IPP-110 may further include pad groups (hereinafter referred to as left pad groups) disposed at the left of the second pad region PG2 and pad groups (hereinafter referred to as right pad groups) disposed at the right of the fourth pad region PG4. Extension lines of pads of each of the left pad groups converge into a specific point. The convergence points of the left pad groups may differ from each other. The left pad groups may have different pitches. The pitches of the left pad groups may be increased as progressively toward the left. The right pad groups may be symmetric to the left pad groups relative to the reference line RL.

FIG. 5D illustrates various pad forms. Each of the first pads PD1 and the second pads substantially has a parallelogram form. A first image 1 of FIG. 5D illustrates a typical parallelogram form in which long sides L-L and short sides L-S are parallel to each other. As shown in a second image 2, each of the first pads PD1 and the second pads PD2 may have a non-isosceles trapezoid form or an isosceles trapezoid form having a predetermined between-angle σ between the long sides L-L and an extension line L. As shown in a third image 3, each of the long sides L-L may include two sides. The two sides may have the same or different predetermined between-angle σ relative to the extension line L.

As shown in a fourth image 4 or a fifth image 5, each of the first pads PD and the second pads PD2 may have a parallelogram form having a transformed vertex. Each of the first pads PD1 and the second pads PD2 may have a parallelogram form in which a vertex area where the long sides L-L and the short sides L-S are connected is tapered or rounded. The form of a pad as shown in the fourth image 4 or a fifth image 5 may occur due to manufacturing errors after the pad is designed in a typical parallelogram form.

Although not separately shown in the drawing, the output pad region OPP-120 (see FIGS. 4A and 4B) of the flexible wiring substrate 122 may include pads designed identical to those of the input pad region IPP-110 of the display panel 110 described with reference to FIGS. 5A to 5D.

Additionally, although a specific design value is different, the input pads IPD-120 of the flexible wiring substrate 122 may include pads having a similar arrangement and form to pads of the input pad region IPP-110 of the display panel 110 described with reference to FIGS. 5A to 5D.

FIGS. 6 to 11 are plan views illustrating a pad region of a first electronic component of an electronic device according to an embodiment. Hereinafter, a pad region of a first electronic component according to embodiment will be described with reference to FIGS. 6 to 11. However, detailed description for the overlapping configurations described with reference to FIGS. 5A to 5D will be omitted.

Figure 6:
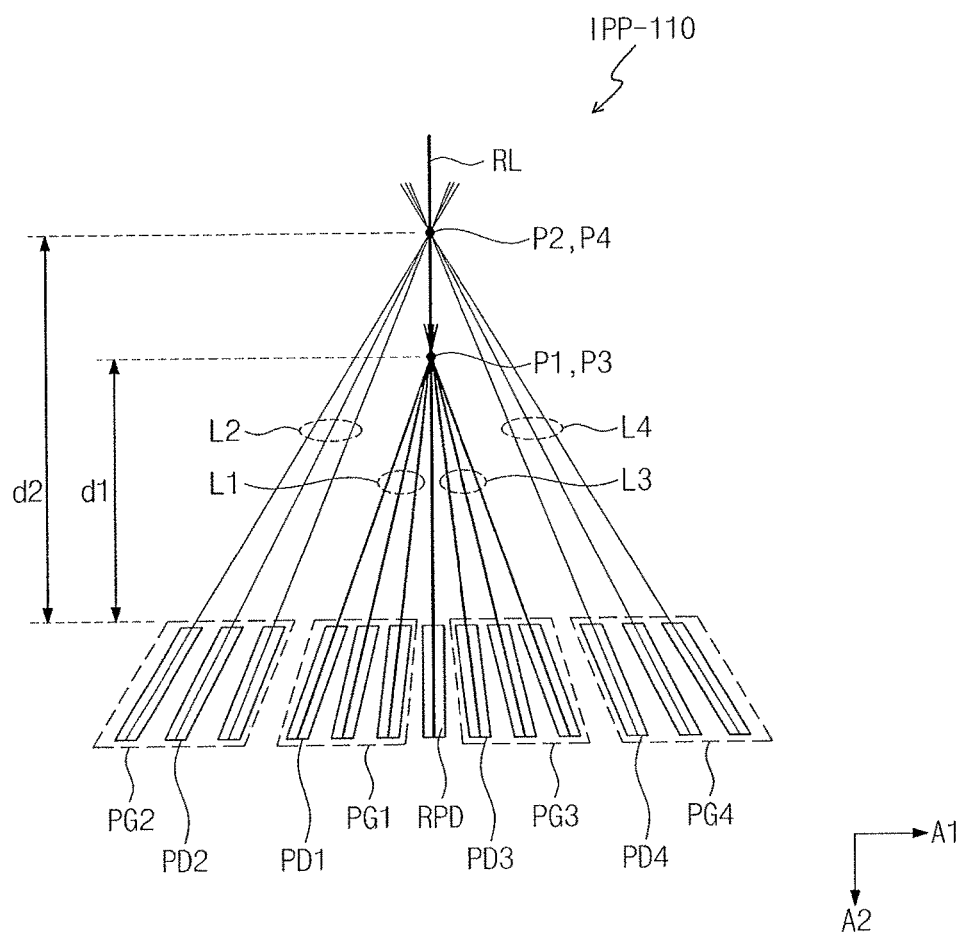
FIGS. 6 to 11 illustrate plan views of a pad region of a first electronic component according to an embodiment.

Referring to FIG. 6, the first lines L1 converge into a first point P1 and the second lines L2 converge into a second point P2. The first point P1 and the second point P2 may be disposed at different positions on the reference line RL.

The third lines L3 converge into a third point P1 and the third point P3 is disposed at the same position as the first point P1 on the reference line RL. Additionally, the fourth lines L4 converge into a fourth point P4 and the fourth point P4 is disposed at the same position as the second point P2 on the reference line RL.

According to an embodiment, a separation distance d1 from the first and third points P1 and P3 to the reference pad RPD is less than a separation distance d2 from the second and fourth points P2 and P4 to the reference pad RPD.

Figure 7:
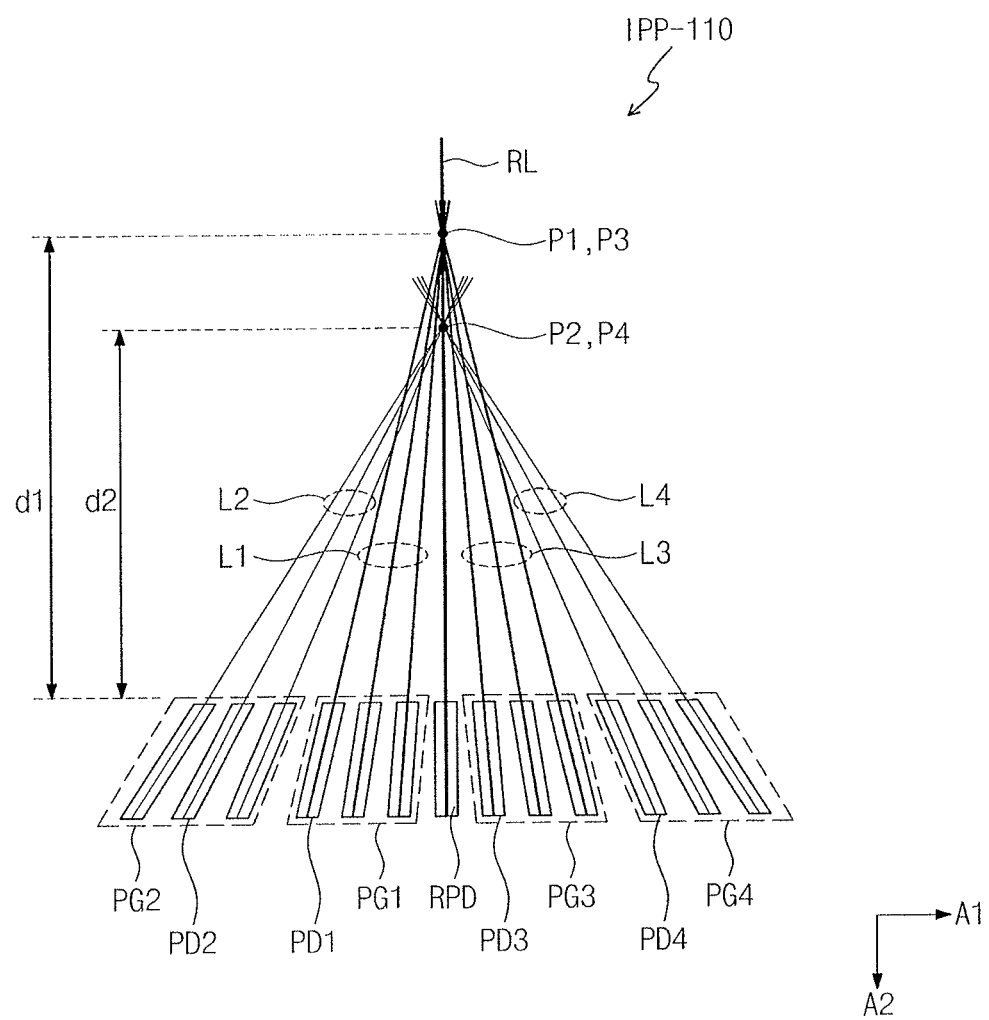

Referring to FIG. 7, the first point P1 and the third point P3 are disposed at the same position on the reference line RL and the second point P2 and the fourth point P4 are disposed at the same position on the reference line RL.

According to an embodiment, the separation distance d1 from the first and third points P1 and P3 to the reference pad RPD is greater than the separation distance d2 from the second and fourth points P2 and P4 to the reference pad RPD.

Figure 8:
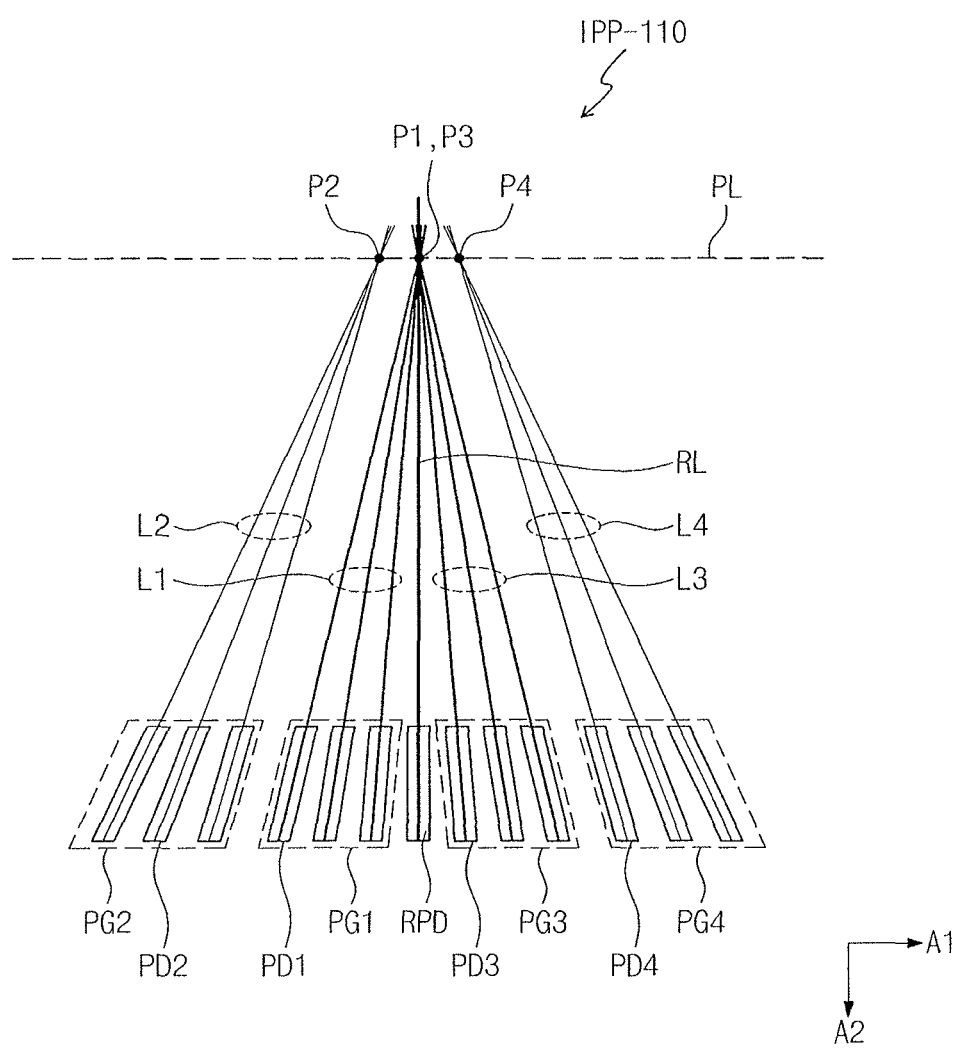

Referring to FIG. 8, the first point P1 and the third point P3 may be disposed at the same position on the reference line RL. The second point P2 and the fourth point P4 are parallel to the first direction axis A1 and disposed on a parallel line PL passing the first point P1 and the third point P3. Additionally, the second point P2 may be disposed at the left of the reference line RL and the fourth point P4 may be disposed at the right of the reference line RL.

Figure 9:
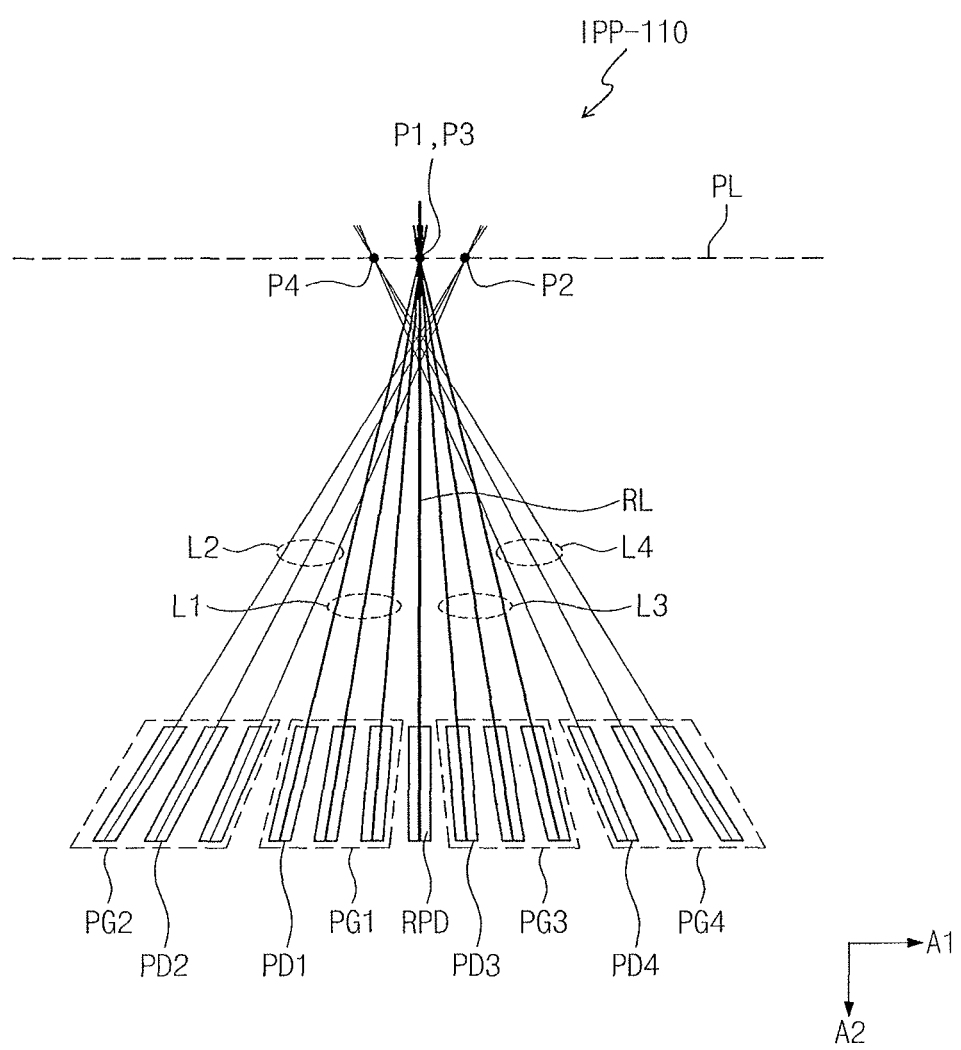

Referring to FIG. 9, the first point P1 and the third point P3 are disposed at the same position on the reference line RL. The second point P2 and the fourth point P4 are orthogonal to the reference line RL and disposed on the parallel line PL passing the first point P1 and the third point P3. Additionally, the second point P2 may be disposed at the right of the reference line RL and the fourth point P4 may be disposed at the left of the reference line RL.

Figure 10:
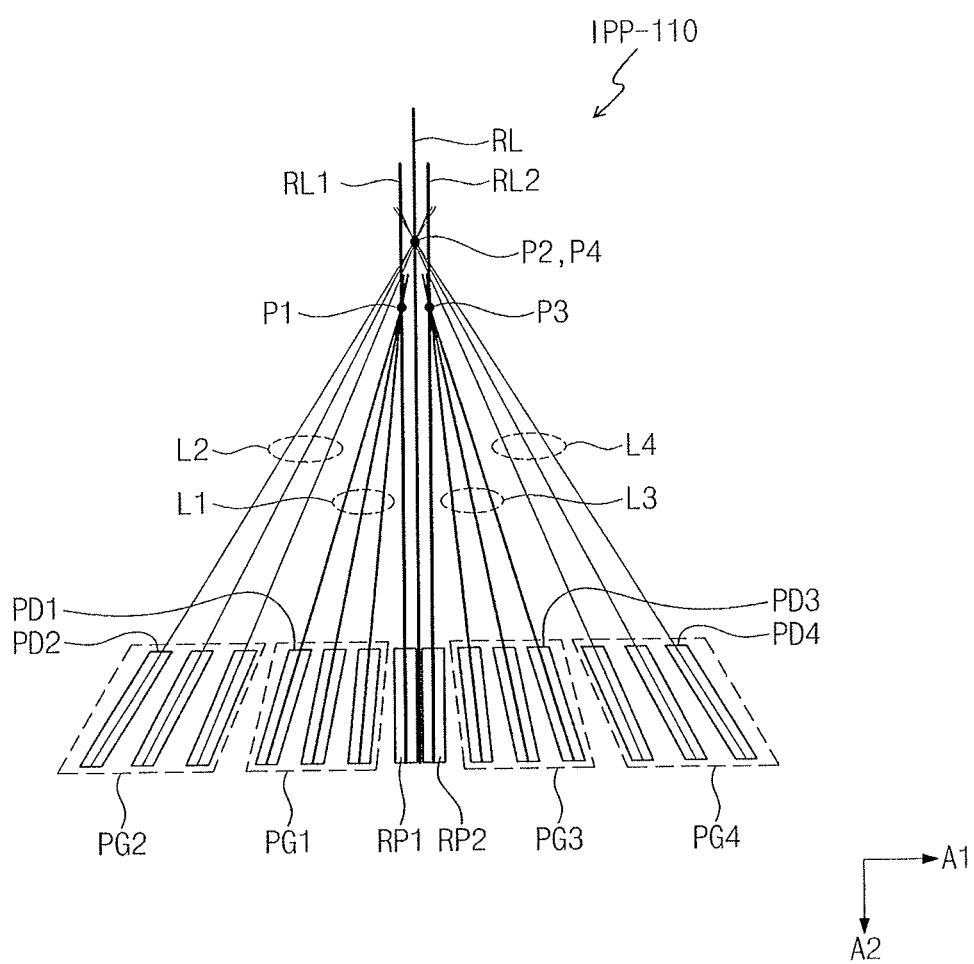

Referring to FIG. 10, sub reference lines RL1 and RL2 parallel to the reference line RL may be defined. The first sub reference line RL1 among the sub reference lines RL1 and RL2 is disposed between the reference line RL and the first pad group PG1 and the second sub reference line RL2 is disposed between the reference line RL and the third pad group PG3.

The input pad region IPP-110 overlaps the sub reference lines RL1 and RL2 and further includes first and second reference pads RPD1 and RPD2 extending in a direction parallel to the sub reference lines RL1 and RL2. The first and second reference pads RPD1 and RPD2 are disposed between the first pad group PG1 and the third pad group PG3.

A first point P1 where the first lines L1 converge is disposed on the first sub reference line RL1 and a third point P3 where the third lines L2 converge is disposed on the second sub reference line LR2. Additionally, a second point P2 where the second lines L2 converge and a fourth point where the fourth lines L4 converge may be disposed at the same position and the second point P2 and the fourth point P4 may be disposed at the reference line RL. The second point P2 and the fourth point P4 may be disposed between the first sub reference line RL1 and the second sub reference line RL2 outside the reference line RL.

Figure 11:
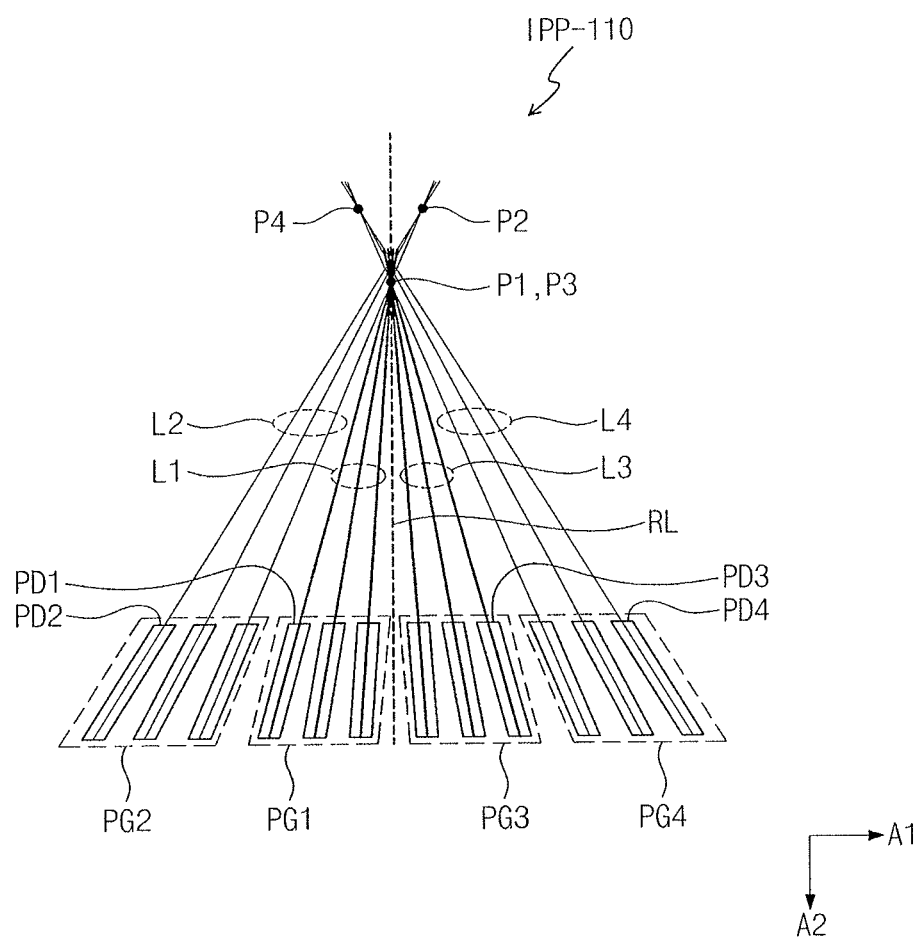

Referring to FIG. 11, a reference pad may not be disposed between the first pad group PG1 and the third pad group PG3. Only the reference line RL may be defined between the first pad group PG1 and the third pad group PG3.

Figure 12:
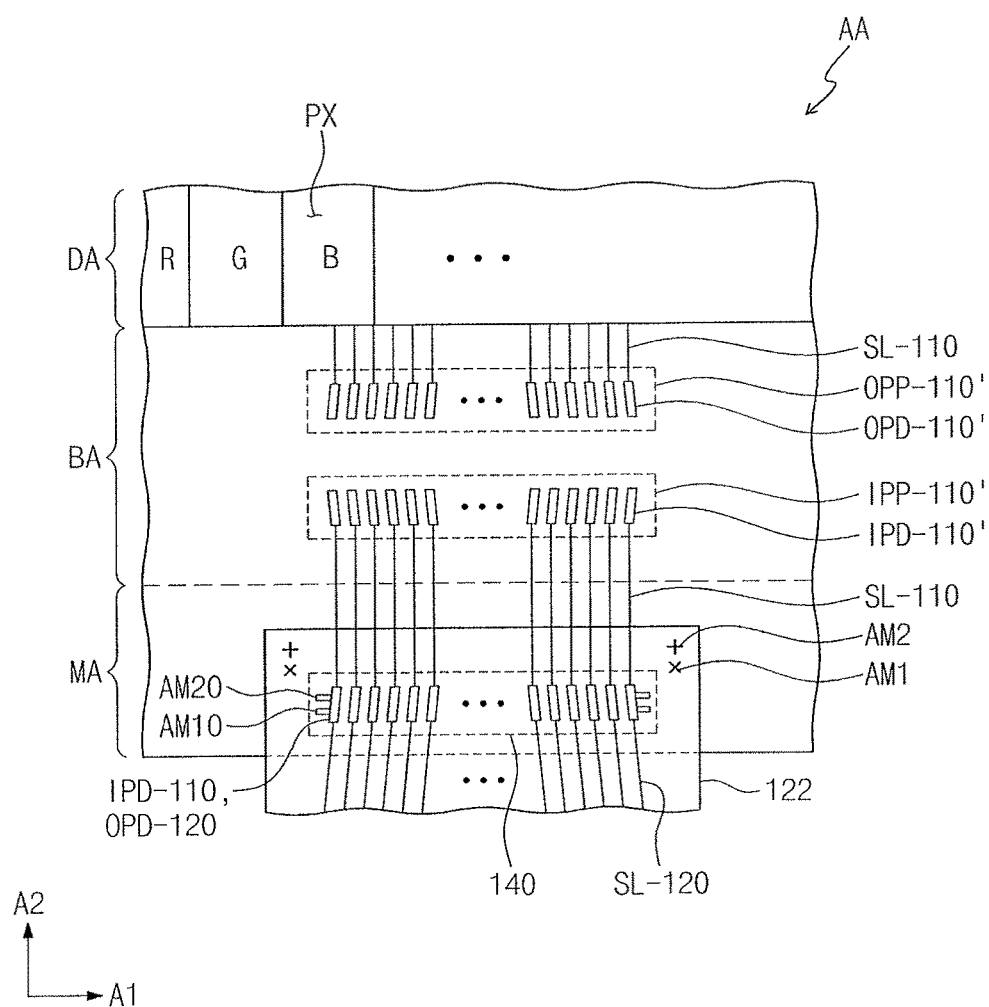
FIG. 12 illustrates a plan view of coupled pad regions of electronic components according to an embodiment.

FIG. 12 is a plan view illustrating pad regions where electronic components of an electronic device are coupled according to an embodiment. Hereinafter, an electronic device according to an embodiment will be described with reference to FIG. 12. However, detailed description for the overlapping configurations described with reference to FIGS. 1 to 11 will be omitted.

The output pads OPD-120 of the flexible wiring substrate 122 are electrically connected to the input pads IPD-110 of the display panel 110. In this embodiment, the second electronic components 120 (see FIGS. 3A and 3B) may include only the flexible wiring substrate 122. Although not shown in the drawing, the data driving circuit 125 (see FIGS. 3A and 3B) may be disposed in the non-display area BA of the display panel 110. Although the data driving circuit 125 is described as an example of a driving chip in this embodiment, the type of a driving chip may be changed.

The display panel 110 may further include connection pad regions IPP-110' and OPP-110' for data driving circuit disposed in the non-display area BA. The connection pad regions IPP-110' and OPP-110' may include an input pad region IPP-110' and an output pad region OPP-110'. The input pad region IPP-110' may include input pads IPD-110' and the output pad region OPP-110' may include output pads OPD-110'.

Additionally, although a specific design value is different, the output pad region OPP-110" may include pads having a similar arrangement and form to pads of the input pad region IPP-110 of the display panel 110 described with reference to FIGS. 5A to 5D. Additionally, the output pad region OPP-110' may include pads having a similar pattern to pads of the input pad regions IPP-110 shown in FIGS. 6 to 11. The input pad region IPP-110' may include the same pads as the output pad region OPP-110' or may include pads symmetric to pads of the output pad region OPP-110' relative to the first direction axis A1.

The input pads IPD-110 of the display panel 110 may be connected to the connection input pad region IPP-110' for data driving circuit through some of the signal wires SL-110. Although not shown in the drawing, other some of the signal wires SL-110 may be directly connected to the connection input pad region IPP-110' for data driving circuit. The input pads IPD-110 of the display panel 110 may be directly connected to gate wires (not shown) or data wires (not shown) through other some of the signal wires SL-110.

The data driving circuit 125 includes pad regions corresponding to the input pad region IPP-110' and the output pad region OPP-110'. The data driving circuit 125 may include a pad region designed identical to the input pad region IPP-110' and a pad regions designed identical to the output pad region OPP-110'. The par regions of the data driving circuit 125 may be electrically connected to the input pad region IPP-110' and the output pad region OPP-110' through a conductive adhesive film (not shown). That is, a coupling structure of the data driving circuit 125, the input pad region IPP-110', and the output pad region OPP-110' may be substantially identical to the coupling structure of the input pad region IPP-110 of the display panel 110 and the output pad region OPP-120 of the flexible wiring substrate 120 described with reference to FIGS. 4A to 4C.

Figure 13:
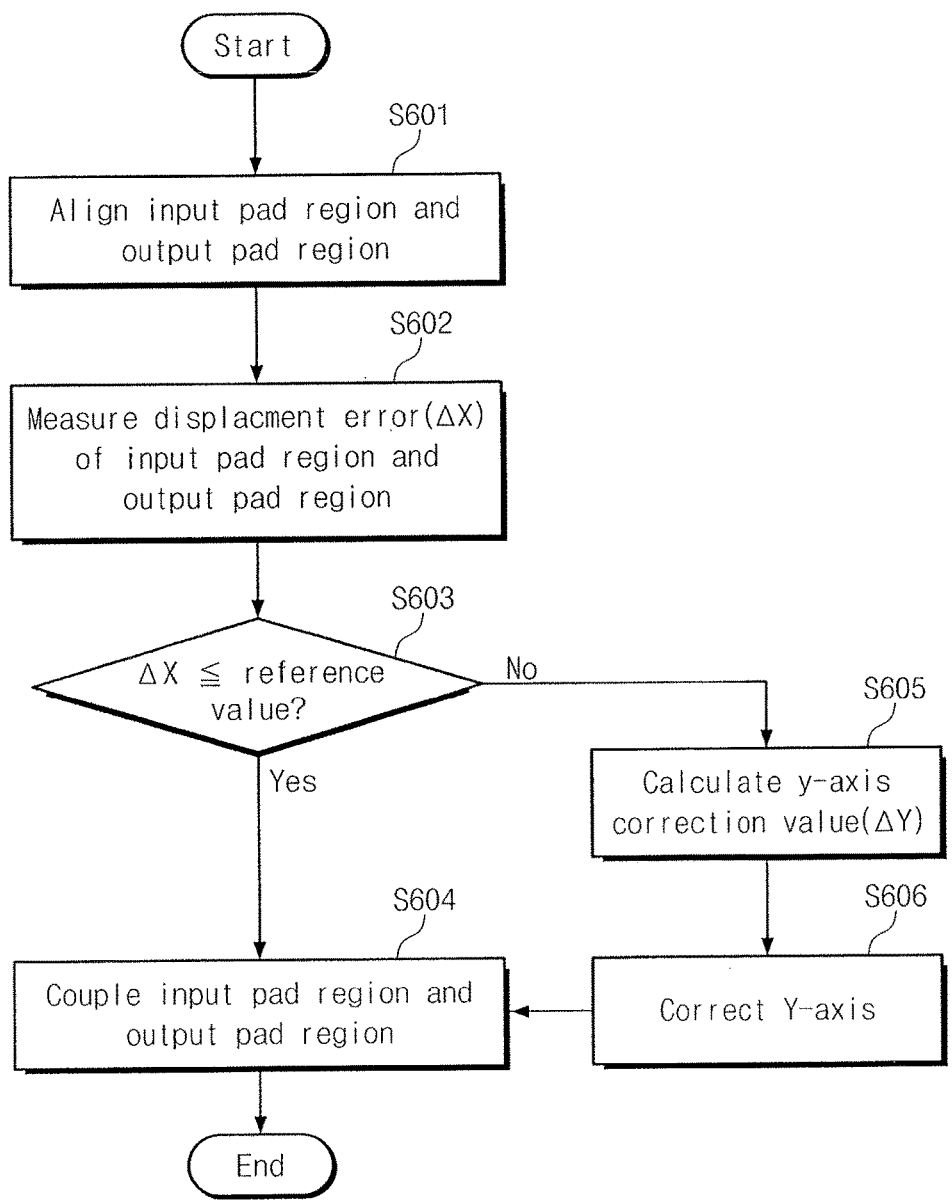
FIG. 13 illustrates a flowchart of a bonding process of an electronic device according to an embodiment.
Figure 14A:
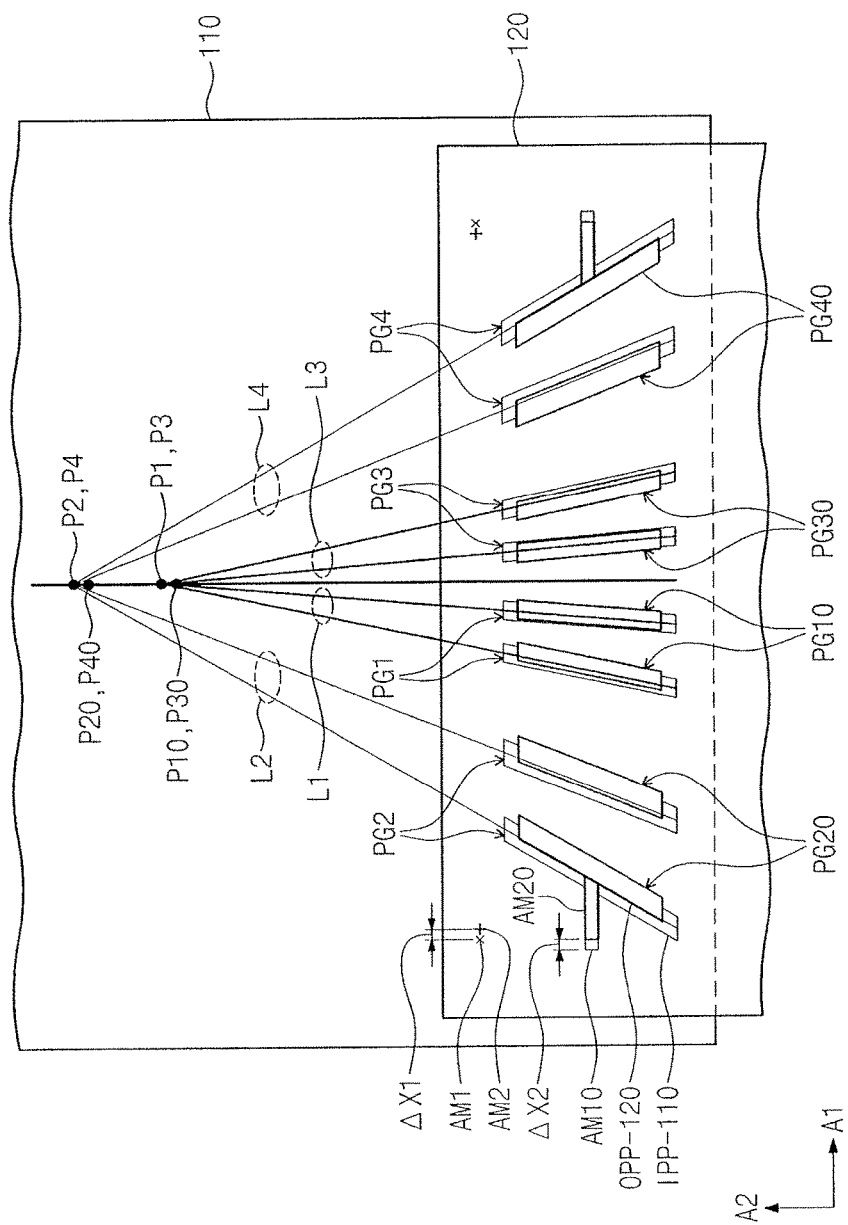
FIG. 14A illustrates a plan view of an alignment operation during a bonding process according to an embodiment.
Figure 14B:
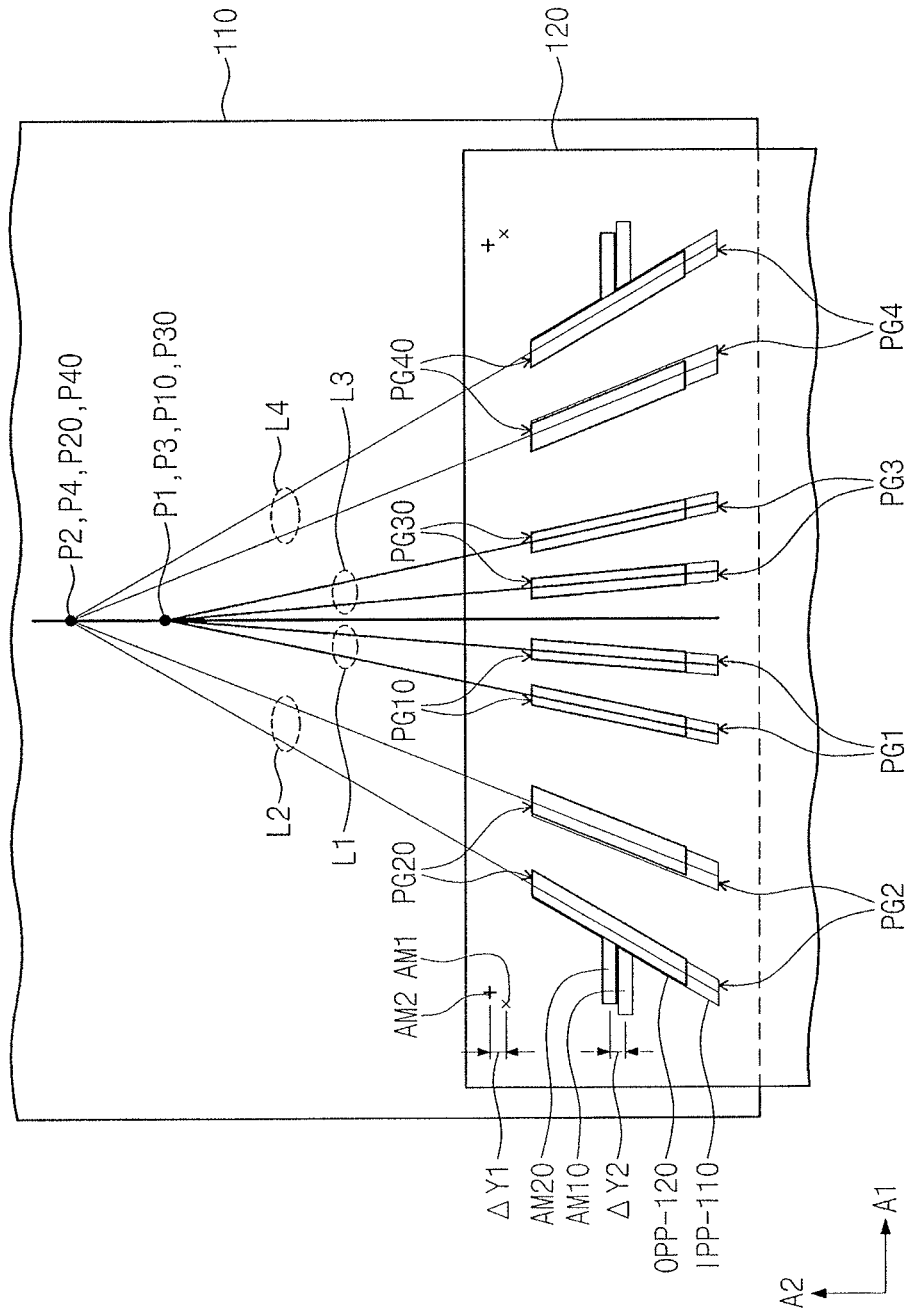
FIG. 14B illustrates a plan view of a Y-axis correction operation during a bonding process according to an embodiment.
Figure 14C:
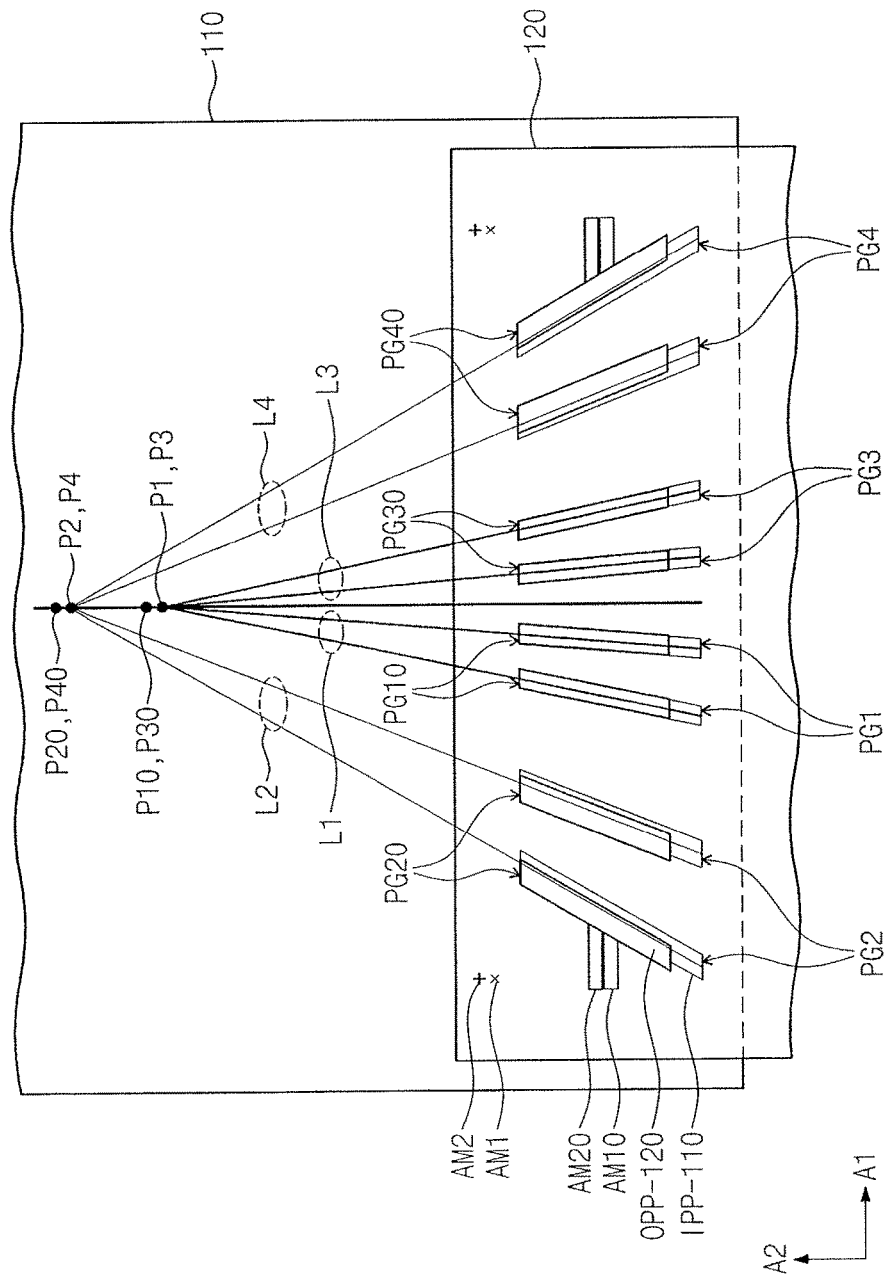
FIG. 14C illustrates a plan view of a coupling operation during a bonding process according to an embodiment.

FIG. 13 is a flowchart illustrating a bonding process of an electronic device according to an embodiment. FIG. 14A is a plan view illustrating an alignment operation during a bonding process according to an embodiment. FIG. 14B is a plan view illustrating a Y-axis correction operation during a bonding process according to an embodiment. FIG. 14C is a plan view illustrating a coupling operation during a bonding process according to an embodiment.

FIGS. 14A to 14C illustrating an input pad region IPP-110 including first to fourth pad groups PG1 to PG4 and an output pad region OPP-120 including first to fourth pad groups PG10 to PG40. Each pad group of the input pad region IPP-110 includes two input pads and each pad group of the output pad region OPP-120 includes two output pads. In this embodiment, a length according to each extension line of the input pads of the input pad region IPP-110 may be greater than a length according to each extension line of the output pads of the output pad region OPP-120. In order for simple drawings, extension lines of the output pads of the output pad region OPP-120 are not shown.

Referring to FIG. 13, first, the input pad region IPP-110 and the output pad region OPP-120 are arranged primarily in operation S601. As shown in FIG. 14A, the first and second align marks AM1 and AM10 of the display panel 110 and the first and second align marks AM2 and AM20 of the flexible wiring substrate 122 are used for alignment. The first and second align marks AM1 and AM10 of the display panel 110 and the first and second align marks AM2 and AM20 of the flexible wiring substrate 122 match the displacement of the second direction axis A2. In describing a bonding method, the second direction axis A2 indicates a Y-axis and the first direction axis A1 indicates an X-axis.

Even when the input pad region IPP-110 and the output pad region OPP-120 are designed identically, due to manufacturing errors of the flexible wiring substrate 122 or the display panel 110, displacements of the input pad region IPP-110 and the output pad region OPP-120 according to the X-axis may not be identical to each other. For example, due to the influence of temperature and humidity during a manufacturing process, the output pad region OPP-120 of the flexible wiring substrate 122 may further contract on the X-axis compared to a design value. That is, each of the input pad region IPP-110 and the output pad region OPP-120 may have different pitches than designed.

Accordingly, extension lines of the input pads of the first and third pad groups PG1 and PG3 of the input pad region IPP-100 may converge into the first point P1 and the third point P3 disposed at the same position and extension lines of the input pads of the second and fourth pad groups PG2 and PG4 of the input pad region IPP-100 may converge into the second point P2 and the fourth point P4 disposed at the same position. Extension lines of the output pads of the first and third pad groups PG10 and PG30 of the output pad region OPP-120 may converge into the fifth point P10 and the seventh point P30 disposed at the same position and extension lines of the output pads of the second and fourth pad groups PG20 and PG40 of the output pad region OPP-120 may converge into the sixth point P20 and the eighth point P40 disposed at the same position. The fifth point P10 and the seventh point P30 are disposed at different positions than the first point P1 and the third point P3. The sixth point P20 and the eighth point P40 are disposed at different positions than the second point P2 and the fourth point P4.

Then, a displacement error ΔX according to the X-axis of the input pad region IPP-110 and the output pad region OPP-120 is measured in operation S602. As shown in FIG. 14A, a displacement difference ΔX1 between the first align mark AM1 of the display panel 110 and the first align mark AM2 of the flexible wiring substrate 122 or a displacement difference ΔX2 between the second align mark AM10 of the display panel 110 and the second align mark AM20 of the flexible wiring substrate 122 is measured.

Then, the displacement error ΔX is determined in operation S603. When the displacement error ΔX is less than a reference value, for example, 0, it is determined that manufacturing errors do not occur. Therefore, the input pad region IPP-110 and the output pad region OPP-120 are coupled to each other immediately in operation S604. The reference value may be set within a predetermined range according to a numerical value of the input pad region IPP-110 and the output pad region OPP-120.

When the displacement error ΔX is greater than the reference value, it is determined that manufacturing errors occur. Accordingly, a Y-axis correction value ΔY is calculated in operation S605. However, a process for calculating the Y-axis correction value ΔY is performed when the displacement error ΔX according to the X-axis is within an allowable range. That is, when the displacement error ΔX according to the X-axis is much greater than the reference value, this may be regarded as defective.

The Y-axis correction value ΔY may be calculated by the following Equation 6.

$$\Delta Y = \frac{\Delta X}{\tan(\theta)} \quad \text{[Equation 6]}$$

where θ may be defined as a between-angle between an extension line of a sampling pad and the reference line RL. The sampling pad may be a pad disposed at the outermost. As shown in FIG. 14A, the sampling pad may be the input pad IPD-110 connected to the second align mark AM10 or the output pad OPD-120 connected to the second align mark AM20.

When the Y-axis correction value ΔY is calculated through Equation 6, as shown in FIG. 14B, Y-axis correction is performed in operation S606. The Y-axis correction is performed by moving one of the display panel 110 and the flexible wiring substrate 122 by the Y-axis correction value ΔY in an up/down direction along the second direction axis A2. Accordingly, as shown in FIG. 14B, overlapping areas of corresponding pads of the input pads IPD-110 and the output pads OPD-120 are increased.

The fifth point P10 and the seventh point P30 may be substantially disposed at the same position as the first point P1 and the third point P3, by the Y-axis correction. The sixth point P20 and the eighth point P40 may be substantially disposed at the same position as the second point P2 and the fourth point P4.

According to an embodiment, the calculation of the Y-axis correction value ΔY and the Y-axis correction may be replaced with another method. By moving one of the display panel 110 and the flexible wiring substrate 122 in a up/down direction along the second direction axis A2, a point where the overlapping areas of the input pads IPD-110 and the output pads OPD-120 are the maximum may be selected.

After the Y-axis correction, the input pad region IPP-110 and the output pad region OPP-120 are coupled to each other in operation S604. By using a tool, the input pad region IPP-110 and the output pad region OPP-120 are thermally compressed with the conductive adhesive film 140 therebetween.

The output pad region OPP-120 and the input pad region IPP-110 may expand along the first direction axis A1 by a heat emitted from the tool. Since the flexible wiring substrate 122 has a greater thermal expansion coefficient than the display panel 110 substantially, the output pad region OPP-120 may further expand than the input pad region IPP-110. Additionally, the output pad region OPP-120 may expand at a different rate according to a position based on the first direction axis A1.

As shown in FIG. 14C, after the thermal compression, the output pads OPD-120 shift from the reference line RL into the outside relative to the corresponding input pads IPD-110. The reason is because the output pads OPD-120 expand along the first direction axis A1. As disposed more outwardly from the reference line RL, the shifted displacements of the output pads OPD-120 are increased.

Accordingly, the fifth point P10 and the seventh point P30 are disposed at different positions than the first point P1 and the third point P3. The sixth point P20 and the eighth point P40 are disposed at different positions than the second point P2 and the fourth point P4.

In relation to an electronic device according to an embodiment, even when the output pad region OPP-120 and the input pad region IPP-110 are transformed as mentioned above in a thermal compression process using a tool, the electrical coupling reliability of the output pad region OPP-120 and the input pad region IPP-110 is improved.

As described with reference to FIG. 5C, in relation to an electronic device according to an embodiment, since the output pads OPD-120 include pad groups PG1 to PG4 having different pitches and the input pads IPD-110 include pad groups PG10 to PG40 having different pitches, even if the output pad region OPP-120 and the input pad region IPP-110 expand anisotropically along the first direction axis A1, a coupling area of corresponding output and input pads may be greater than a predetermined area. Accordingly, corresponding output and input pads may have a contact resistance of less than a reference value.

A coupling area of the output pads OPD-120 of the first pad group PG10 having a relatively small expansion rate is decreased at a relatively small rate. A coupling area of the output pads OPD-120 of the first pad group PG10 having a relatively large expansion rate is decreased at a relatively large rate. Nevertheless, since the output pads OPD-120 of the second pad group PG20 have a larger width than the output pads OPD-120 of the first pad group PG10, a coupling area larger than a predetermined area may be provided.

Additionally, since the output pads OPD-120 of the second pad group PG20 having a relatively large expansion rate are spaced from each other by intervals G2 and G20 that are relatively larger than intervals G1 and G10 of the output pads OPD-120 of the first pad group PG10, they are not electrically connected to corresponding input pads adjacent to the input pads IPD-110. That is, the error connection is prevented. Since the input pads IPD-110 of the second pad group PG2 are spaced from each other by the relatively large intervals G2 and G20, the error correction is further reduced.

FIGS. 14A to 14C are views illustrating a pad structure designed to allow the first to fourth points P1, P2, P3, and P4 of the input pad region IPP-110 to be disposed at the display panel 110. At this point, provided is a pad structure designed to allow the fifth to eighth points P10, P20, P30, and P40 of the output pad region OPP-120 to be disposed at the display panel 110. However, a pad structure of the input pad region IPP-110 and the output pad region OPP-120 is not limited thereto.

FIG. 15 is a plan view illustrating a pad region of an electronic device where a bonding process is completed according to an embodiment. The first to fourth points P1, P2, P3, and P4 of the input pad region IPP-110 are disposed at the flexible wiring substrate 122. At this point, the fifth to eighth points P10, P20, P30, and P40 of the output pad region OPP-120 are disposed at the flexible wiring substrate 122.

The bonding process of the electronic device shown in FIG. 15 is identical to that described with reference to FIGS. 13 to 14C. In the Y-axis operation described with reference to FIG. 14B, Y-axis correction may be performed by moving the flexible wiring substrate 122 in a direction opposite to a moving direction of FIG. 14B.

Figure 16A:
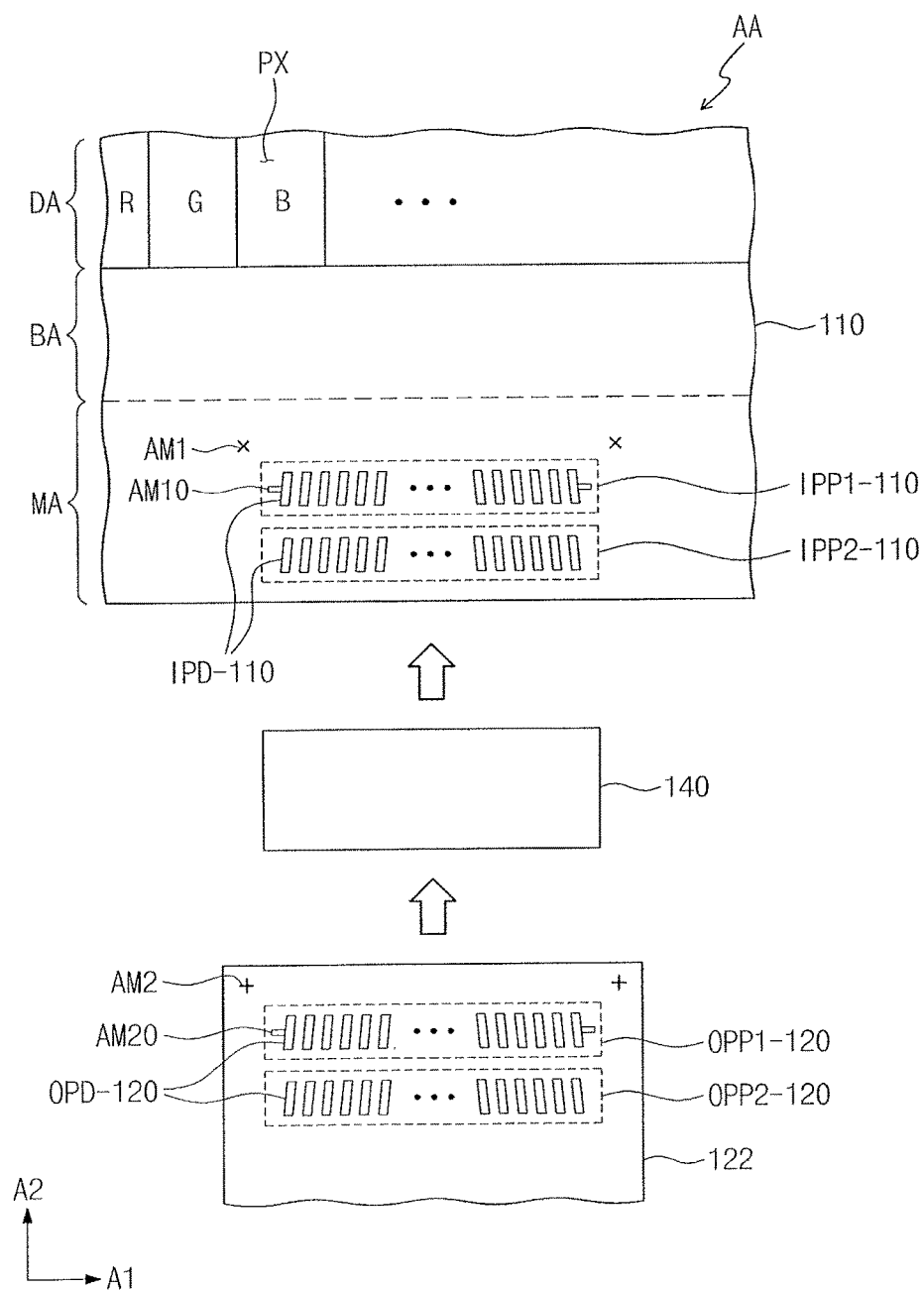
FIG. 16A illustrates a plan view of separated pad regions of two electronic components according to an embodiment.
Figure 16B:
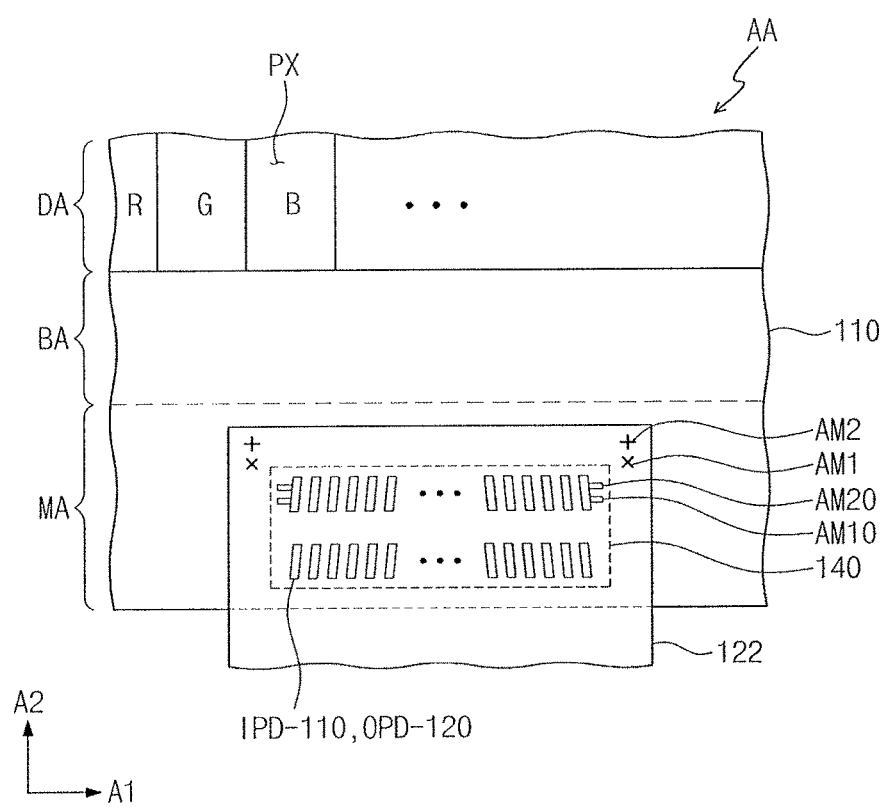
FIG. 16B illustrates a plan view of coupled pad regions of two electronic components according to an embodiment.

FIG. 16A is a plan view illustrating separated pad regions of two electronic components according to an embodiment. FIG. 16B is a plan view illustrating coupled pad regions of two electronic components according to an embodiment. Hereinafter, an electronic device according to an embodiment will be described with reference to FIGS. 16A and 16B. However, detailed description for the overlapping configurations described with reference to FIGS. 1 to 15 will be omitted.

As shown in FIGS. 16A and 16B, each of the display panel 10 and the flexible wiring substrate 122 includes a plurality of pad rows arranged along the second direction axis A2. Each of the plurality of pad rows includes a plurality of pads arranged along the first direction axis A1. In this embodiment, it is shown exemplarily that each of the display panel 110 and the flexible wiring substrate 122 includes two pad rows. Since each of the display panel 110 and the flexible wiring substrate 122 includes a plurality of pad rows, more pads may be disposed in a narrow range along the first direction axis A1.

The two pad rows of the display panel 110 may be defined as a first input pad region IPP1-110 and a second input pad region IPP2-110. Each of the first input pad region IPP1-110 and the second input pad region IPP2-110 includes a plurality of input pads IPD-110. The input pads IPD-110 of the first input pad region IPP1-110 and the input pads IPD-110 of the second input pad region IPP2-110 may receive different signals. According to an embodiment, some of the input pads IPD-110 of the first input pad region IPP1-110 and some of the input pads IPD-110 of the second input pad region IPP2-110 may receive the same signal.

The two pad rows of the flexible wiring substrate 122 may be defined as a first output pad region OPP1-120 and a second output pad region OPP2-120. Each of the first output pad region OPP1-120 and the second output pad region OPP2-120 includes a plurality of output pads OPD-120.

As shown in FIG. 16B, the first output pad region OPP1-120 and the second output pad region OPP2-120 are electrically connected to the first input pad region IPP1-110 and the second input pad region IPP2-110, respectively. In this embodiment, although it is shown that the input pads IPD-110 one-to-one correspond to the output pads OPD-120, embodiments are not limited thereto. According to another embodiment, the input pad region IPP-110 and the output pad region OPP-120 may include a different number of pads and a different number of pad rows.

Figure 17A:
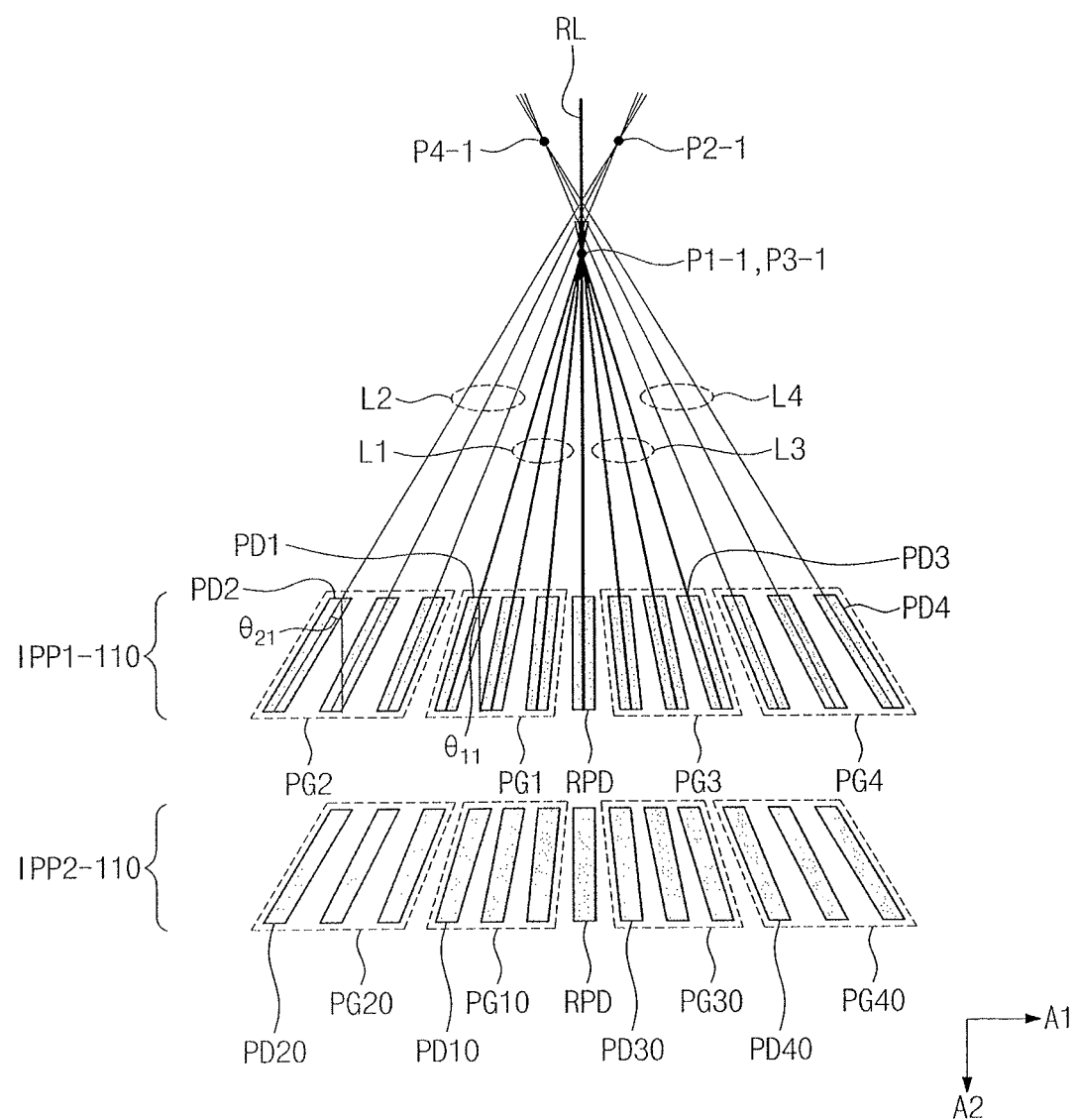
FIGS. 17A and 17B illustrate plan views of a pad region of a first electronic component according to an embodiment.
Figure 17B:
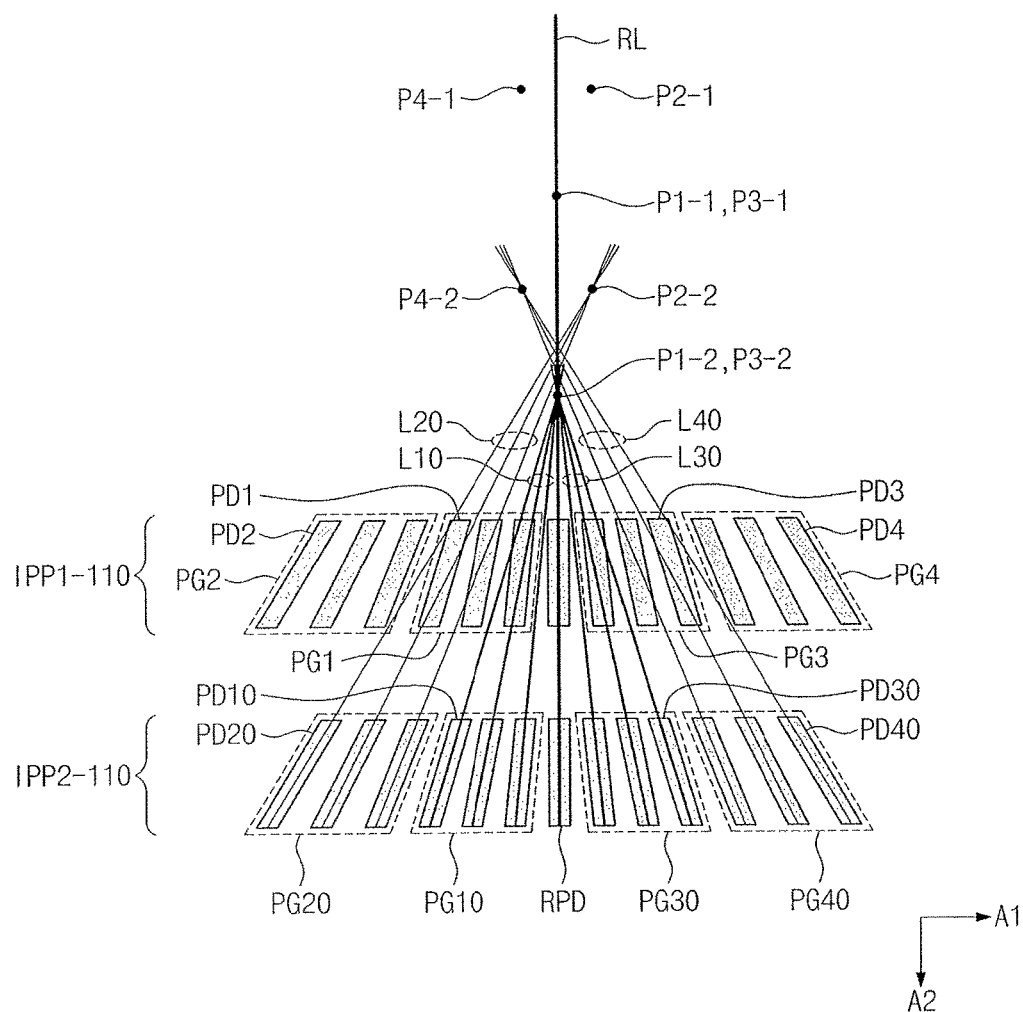

FIGS. 17A and 17B are plan views illustrating a pad region of a first electronic component according to an embodiment. FIG. 17A illustrates an extension line of input pads of the first input pad region IPP1-110 in detail and FIG. 17B illustrates an extension line of input pads of the second input pad region IPP2-110 in detail.

As shown in FIG. 17A, the first input pad region IPP1-110 includes a plurality of input pads that are arranged identical to those of the input pad region IPP-110 described with reference to FIGS. 5A to 5D. The first input pad region IPP1-110 includes a first and second pad group PG1 and PG2 disposed at the left and a third and fourth pad group PG3 and PG4 at the right relative to a reference line RL. The first to fourth pad groups PG1, PG2, PG3, and PG4 include a plurality of first pads PD1, a plurality of second pads PD2, a plurality of third pads PD3, and a plurality of fourth pads PD4, respectively.

The first lines L1 of the plurality of first pads PD1 converge into a first point P1-1 and the second lines L2 of the plurality of second pads PD2 converge into a second point P2-1. The first point P1-1 may be disposed on the reference line RL and the second point P2-1 may be disposed outside the reference line RL. The third lines L3 of the plurality of third pads PD3 converge into a third point P3-1 and the fourth lines L4 of the plurality of fourth pads PD4 converge into a fourth point P4-1. The first point P1-1 and the third point P3-1 may be disposed at the same position. The fourth point P4-1 may be disposed at a position symmetric to the second point P2-1 on the basis of the reference line RL.

According to an embodiment, the pitches and tilts relative to the reference line RL of the first pads PD1, the second pads PD2, the third pads PD3, and the fourth pads PD4 may be changed to allow the first point P1-1, the second point P2-1, the third point P3-1, and the fourth point P4-1 to correspond to the first point P1, the second point P2, the third point P3, and the fourth point P4 shown in FIGS. 6 to 11, respectively.

As shown in FIG. 17B, the second input pad region IPP2-110 includes a plurality of input pads that are arranged identical to those of the input pad region IPP-110 described with reference to FIGS. 5A to 5D. The second input pad region IPP2-110 includes a first and second pad group PG10 and PG20 disposed at the left and a third and fourth pad group PG30 and PG40 at the right relative to a reference line RL. The first to fourth pad groups PG1, PG2, PG3, and PG4 include a plurality of first pads PD10, a plurality of second pads PD20, a plurality of third pads PD30, and a plurality of fourth pads PD40, respectively.

The first lines L10 of the plurality of first pads PD10 converge into a fifth point P1-2 and the second lines L20 of the plurality of second pads PD20 converge into a sixth point P2-2. The fifth point P1-2 may be disposed on the reference line RL and the sixth point P2-2 may be disposed outside the reference line RL. The third lines L30 of the plurality of third pads PD30 converge into a seventh point P3-2 and the fourth lines L40 of the plurality of fourth pads PD4 converge into an eighth point P4-2. The fifth point P1-2 and the seventh point P3-2 may be disposed at the same position. The eighth point P4-2 may be disposed at a position symmetric to the sixth point P2-2 on the basis of the reference line RL.

In this embodiment, the plurality of first pads PD10, the plurality of second pads PD20, the plurality of third pads PD30, and the plurality of fourth pads PD40 in the second pad region IPP2-110 may have the same pitches and tilts relative to the reference line RL of the plurality of first pads PD1, the plurality of second pads PD2, the plurality of third pads PD3, and the plurality of fourth pads PD4 in the second pad region IPP1-110, respectively. That is, the pads of the second input pad region IPP2-110 have a pitch and arrangement, which are obtained as the pads of the first input pad region IPP1-110 move along the second direction axis A2. Accordingly, as the first to fourth points P1-1, P2-1, P3-1, and P4-1 move along the second direction axis A2, they overlap the fifth to eighth points P1-2, P2-2, P3-2, and P4-2.

According to an embodiment, the pitches and tilts relative to the reference line RL of the first pads PD10, the second pads PD20, the third pads PD30, and the fourth pads PD40 may be changed to allow the fifth point P1-2, the sixth point P2-2, the seventh point P3-2, and the eighth point P4-2 to correspond to the first point P1, the second point P2, the third point P3, and the fourth point P4 shown in FIGS. 6 to 11, respectively. According to an embodiment, the fifth point P1-2, the sixth point P2-2, the seventh point P3-2, and the eighth point P4-2 may be disposed to overlap the first point P1, the second point P2, the third point P3, and the fourth point P4, respectively. According to an embodiment, the pitches and tilts relative to the reference line RL of the first pads PD10, the second pads PD20, the third pads PD30, and the fourth pads PD40 may be changed to allow the fifth point P1-2, the sixth point P2-2, the seventh point P3-2, and the eighth point P4-2 to correspond to the first point P1, the second point P2, the third point P3, and the fourth point P4, respectively.

FIGS. 18 to 23 are plan views illustrating a pad region of a first electronic component according to an embodiment. Hereinafter, a pad region of a first electronic component according to embodiment will be described with reference to FIGS. 18 to 23. However, detailed description for the overlapping configurations described with reference to FIGS. 16A to 17B will be omitted.

The pads of the second input pad region IPP2-110 shown in FIGS. 18 to 23 are obtained as the pads of the first input pad region IPP1-110 move along the second direction axis A2. Although not separately shown in the drawing, according to an embodiment, one of the pads of the second input pad region IPP2-110 and the pads of the first input pad region IPP1-110 may be changed within a range satisfying the pitches and tilts relative to the reference line RL of the pads shown in FIGS. 6 to 11.

Figure 18:
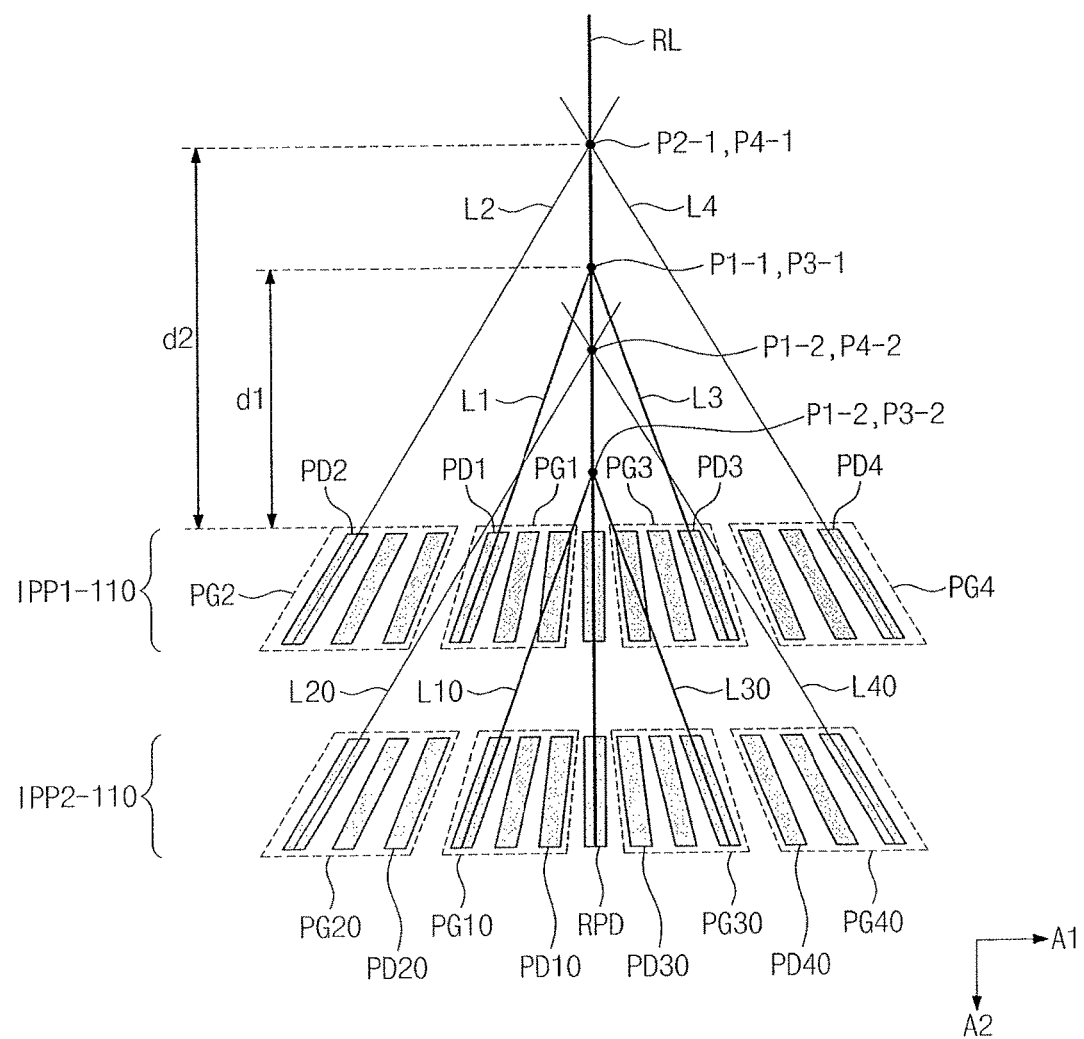
FIGS. 18 to 23 illustrate plan views of a pad region of a first electronic component according to an embodiment.

Referring to FIG. 18, the first point P1-1 and the second point P2-1 may be disposed at different positions on the reference line RL. The third point P3-1 and the first point P1-1 are disposed at the same position on the reference line RL. Additionally, the fourth point P4-1 and the second point P2-1 are disposed at the same position on the reference line RL.

According to an embodiment, a separation distance d1 from the first and third points P1-1 and P3-1 to the reference pad RPD is less than a separation distance d2 from the second and fourth points P2-1 and P4-1 to the reference pad RPD.

The fifth point P1-2 and the sixth point P2-2 may be disposed at different positions on the reference line RL. The seventh point P3-2 and the fifth point P1-2 are disposed at the same position on the reference line RL. Additionally, the eighth point P4-2 and the sixth point P2-2 are disposed at the same position on the reference line RL.

Figure 19:
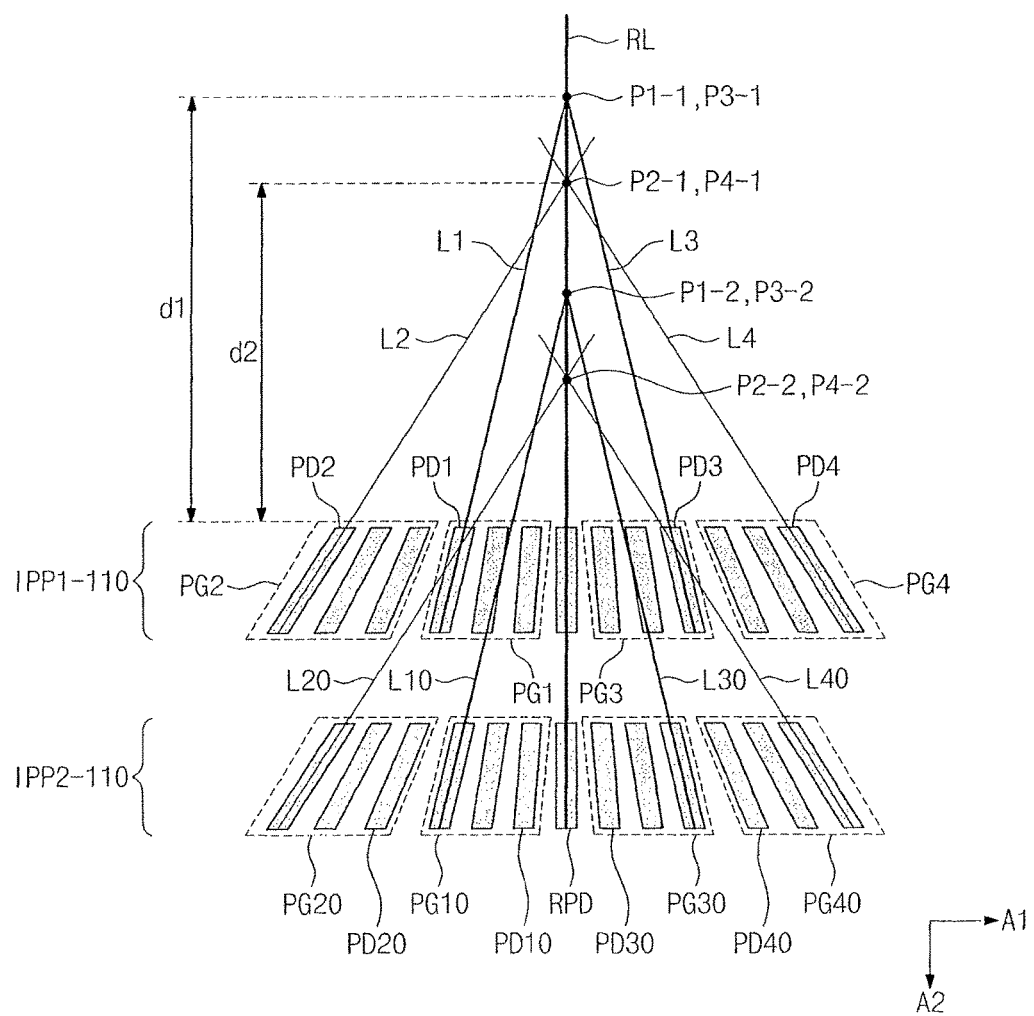

Referring to FIG. 19, the first point P1-1 and the third point P3-1 are disposed at the same position on the reference line RL and the second point P2-1 and the fourth point P4-1 are disposed at the same position on the reference line RL. According to an embodiment, a separation distance d1 from the first and third points P1-1 and P3-1 to the reference pad RPD is greater than a separation distance d2 from the second and fourth points P2-1 and P4-1 to the reference pad RPD.

The fifth point P1-2 and the seventh point P3-2 are disposed at the same position on the reference line RL and the sixth point P2-2 and the eighth point P4-2 are disposed at the same position on the reference line RL.

Figure 20:
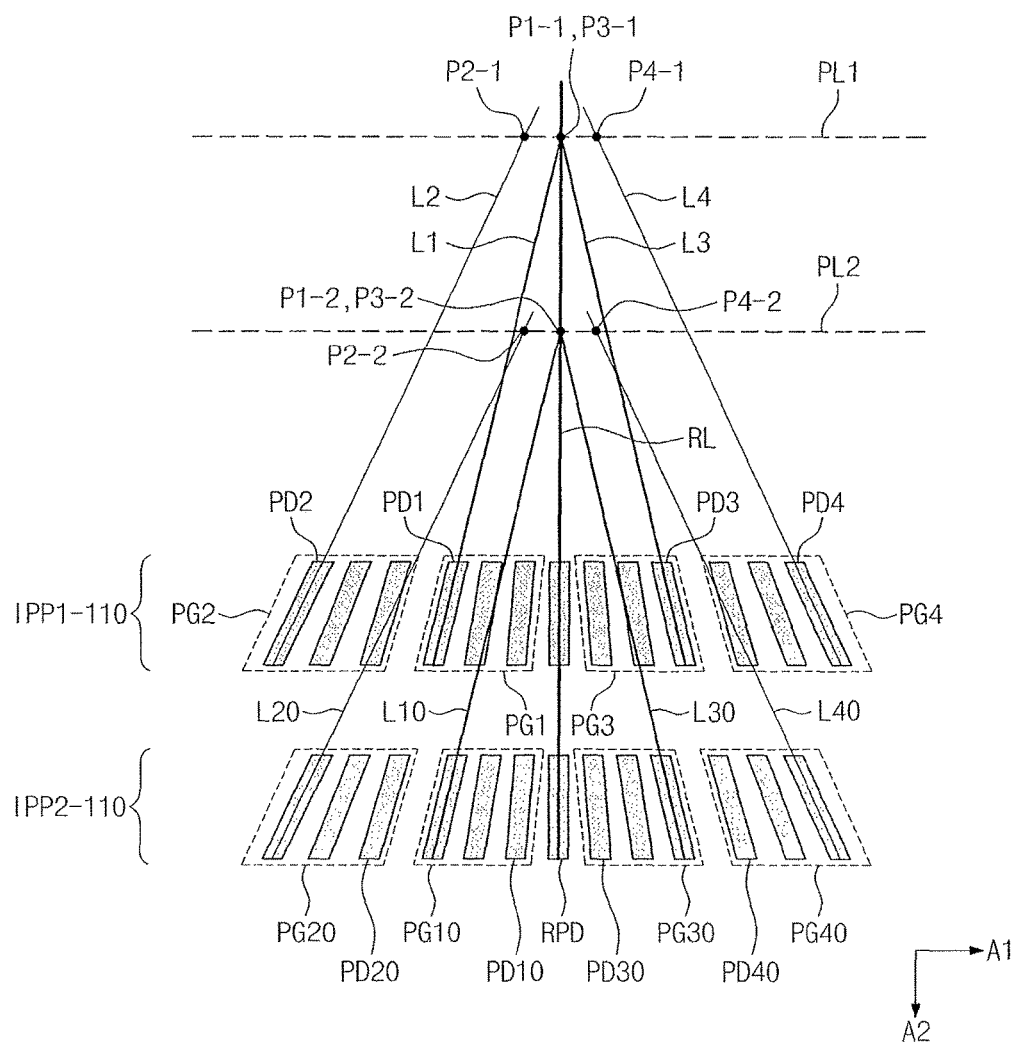

Referring to FIG. 20, the first point P1-1 and the third point P3-1 may be disposed at the same position on the reference line RL. The second point P2-1 and the fourth point P4-1 are parallel to the first direction axis A1 and disposed on a first parallel line PL1 passing the first point P1-1 and the third point P3-1. Additionally, the second point P2-1 may be disposed at the left of the reference line RL and the fourth point P4-1 may be disposed at the right of the reference line RL.

The fifth point P1-2 and the seventh point P3-2 are disposed at the same position on the reference line RL. The sixth point P2-2 and the eighth point P4-2 are parallel to the first direction axis A1 and disposed on a second parallel line PL2 passing the fifth point P1-2 and the seventh point P3-2. Additionally, the sixth point P2-2 may be disposed at the left of the reference line RL and the eighth point P4-2 may be disposed at the right of the reference line RL.

Figure 21:
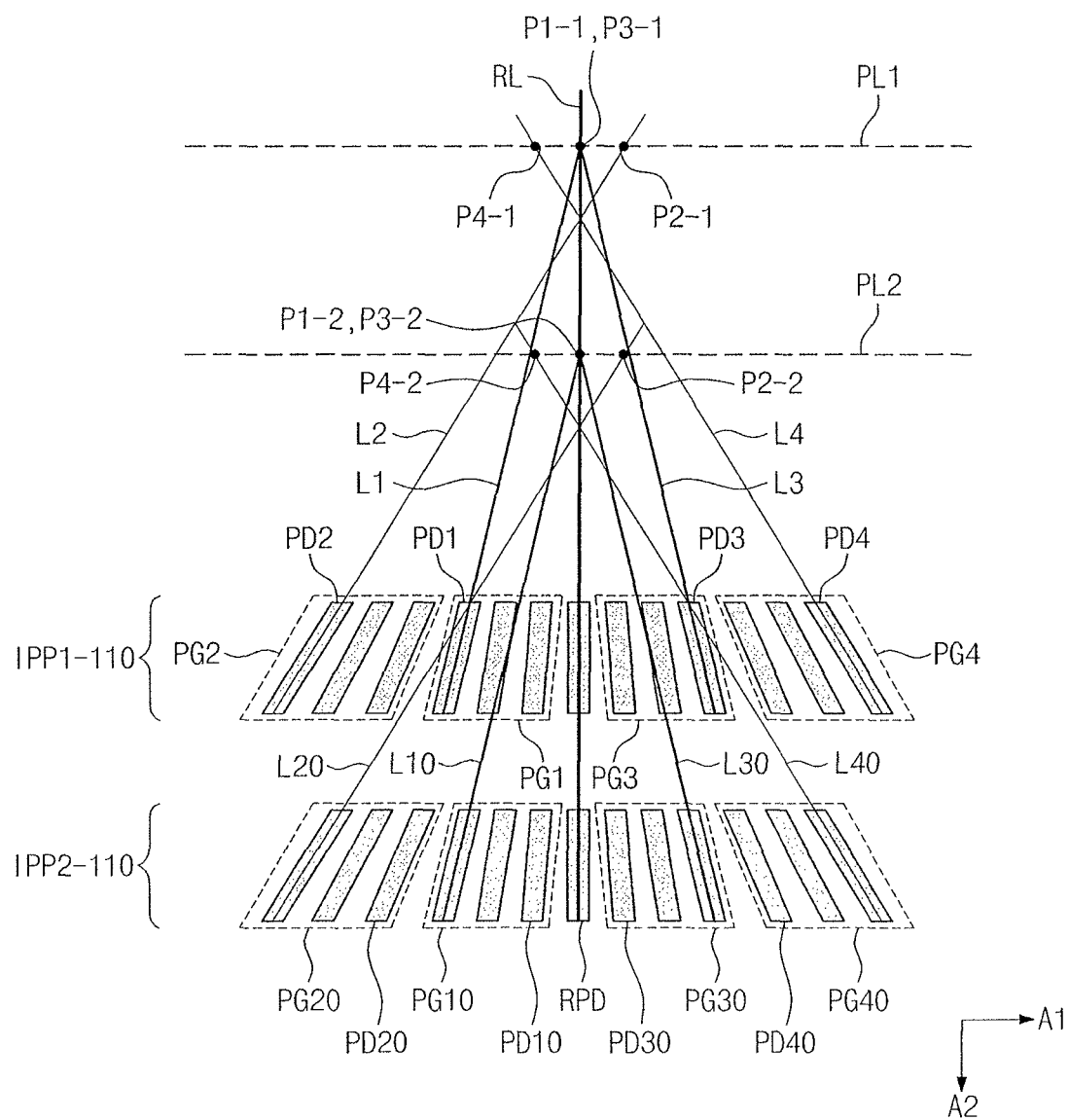

Referring to FIG. 21, the first point P1-1 and the third point P3-1 may be disposed at the same position on the reference line RL. The second point P2-1 and the fourth point P4-1 are orthogonal to the reference line RL and disposed on the first parallel line PL1 passing the first point P1-1 and the third point P3-1. Additionally, the second point P2-1 may be disposed at the right of the reference line RL and the fourth point P4-1 may be disposed at the left of the reference line RL.

The fifth point P1-2 and the seventh point P3-2 are disposed at the same position on the reference line RL. The sixth point P2-2 and the eighth point P4-2 are orthogonal to the reference line RL and disposed on a second parallel line PL2 passing the fifth point P1-2 and the seventh point P3-2. Additionally, the sixth point P2-2 may be disposed at the right of the reference line RL and the eighth point P4-2 may be disposed at the left of the reference line RL.

Figure 22:
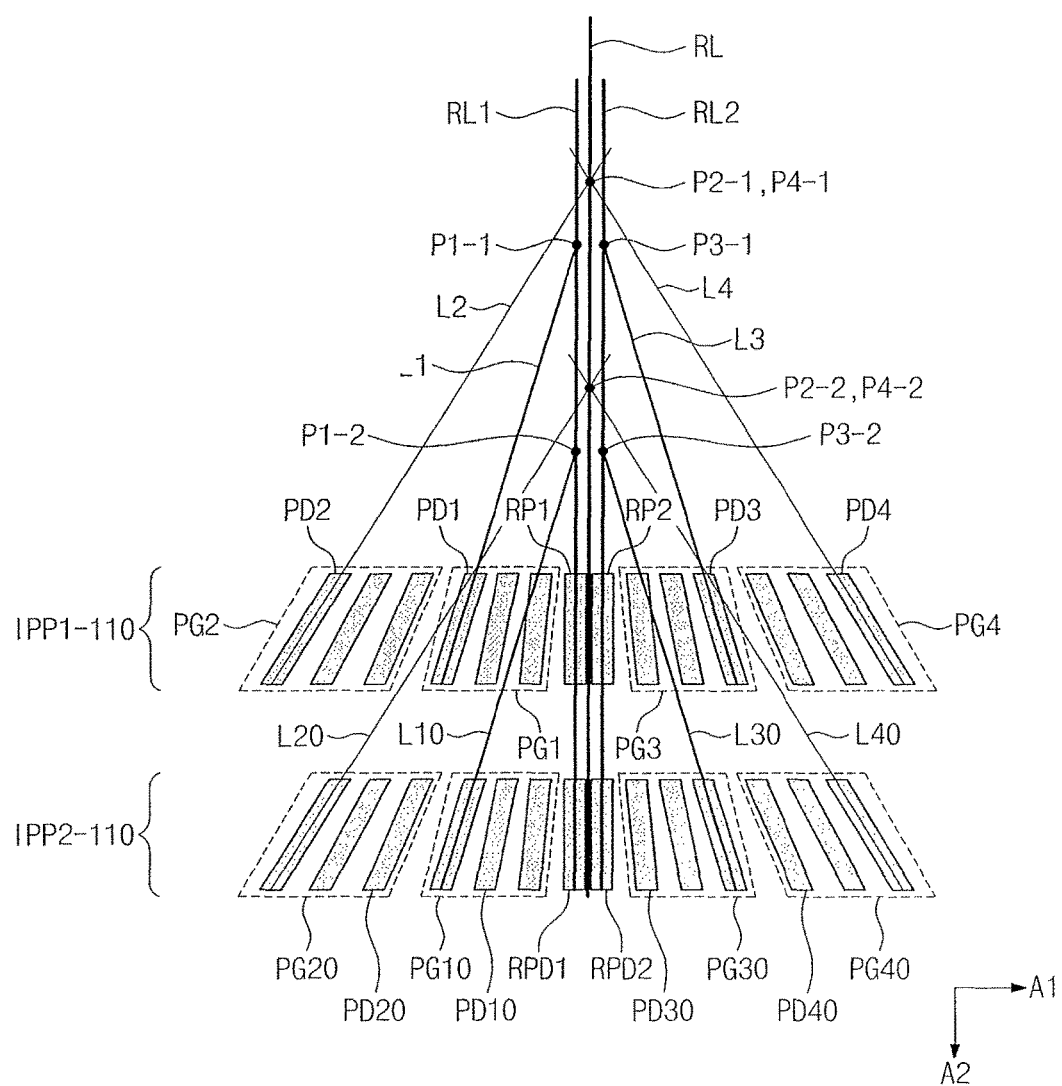

Referring to FIG. 22, sub reference lines RL1 and RL2 parallel to the reference line RL may be defined. The first sub reference line RL1 among the sub reference lines RL1 and RL2 is disposed between the reference line RL and the first pad group PG1 and the second sub reference line RL2 is disposed between the reference line RL and the third pad group PG3.

The first input pad region IPP1-110 overlaps the sub reference lines RL1 and RL2 and further includes first and second reference pads RPD1 and RPD2 extending in a direction parallel to the sub reference lines RL1 and RL2. The first and second reference pads RPD1 and RPD2 are disposed between the first pad group PG1 and the third pad group PG3.

The first point P1-1 is disposed on the first sub reference line RL1 and the third point P3-1 is disposed on the second sub reference line LR2. Additionally, the second point P2-1 and the fourth point P4-1 may be disposed at the same position and the second point P2-1 and the fourth point P4-1 may be disposed at the reference line RL. The second point P2-1 and the fourth point P4-1 may be disposed outside the reference line RL or may be disposed between the first sub reference line RL1 and the second sub reference line RL2.

The fifth point P1-2 is disposed on the first sub reference line RL1 and the seventh point P3-2 is disposed on the second sub reference line RL2. Additionally, the sixth point P2-2 and the eighth point P4-2 may be disposed at the same position and the sixth point P2-2 and the eighth point P4-2 may be disposed at the reference line RL. The sixth point P2-2 and the eighth point P4-2 may be disposed outside the reference line RL or may be disposed between the first sub reference line RL1 and the second sub reference line RL2.

Figure 23:
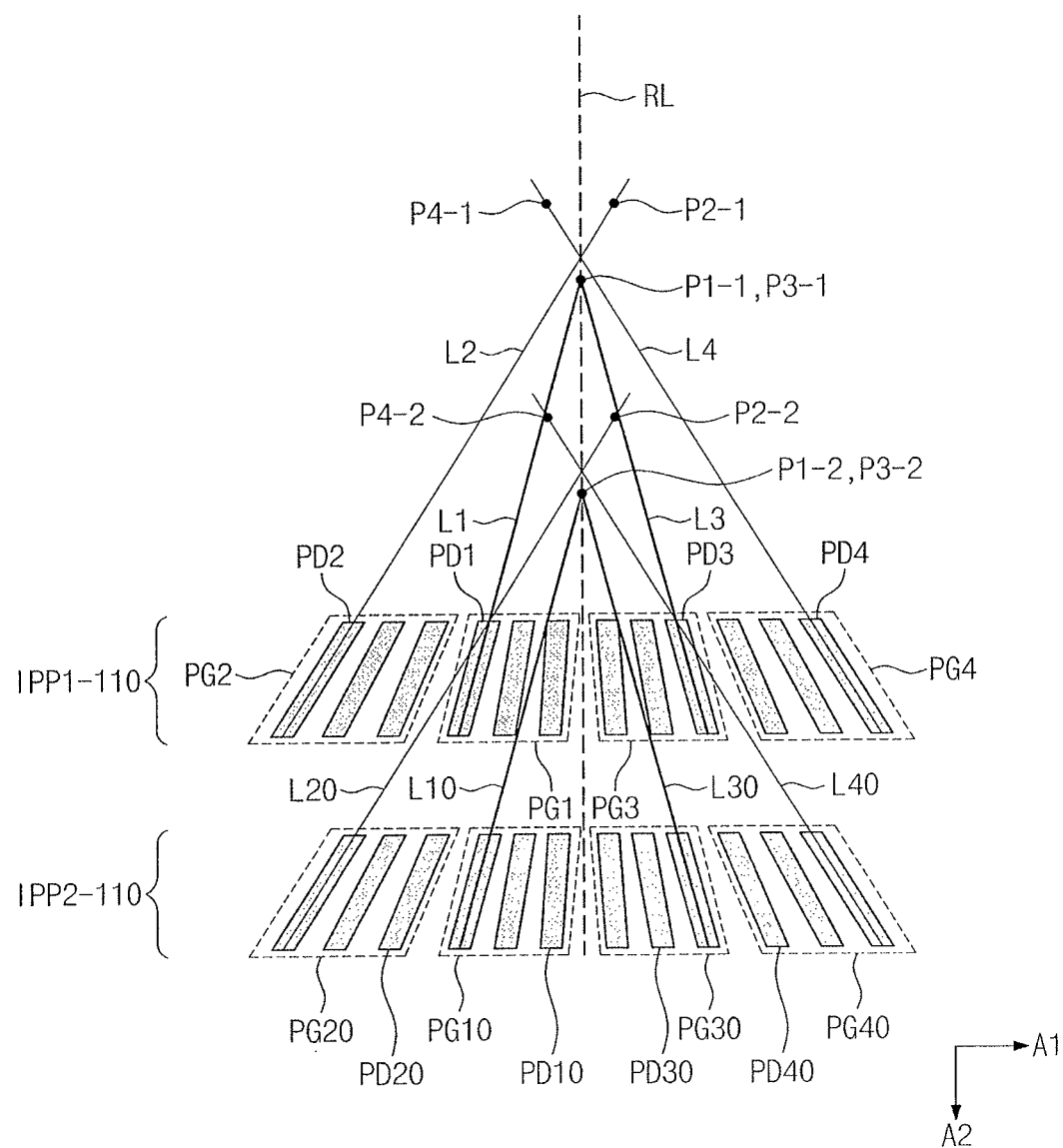

Referring to FIG. 23, a reference pad may not be disposed between the first pad group PG1 and the third pad group PG3. Only the reference line RL may be defined between the first pad group PG1 and the third pad group PG3. The pad region of the first electronic component shown in FIG. 23 may be substantially identical to the pad region of the first electronic component shown in FIGS. 17A and 17B, except for the reference pad.

Figure 24A:
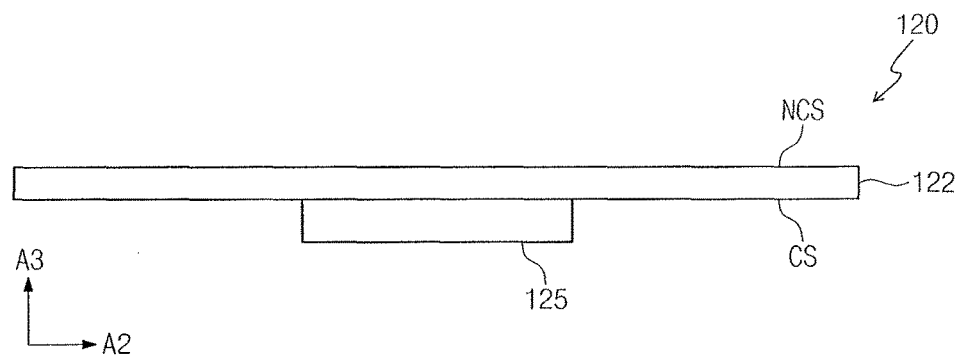
FIG. 24A illustrates a side view of a second electronic component according to an embodiment.
Figure 24B:
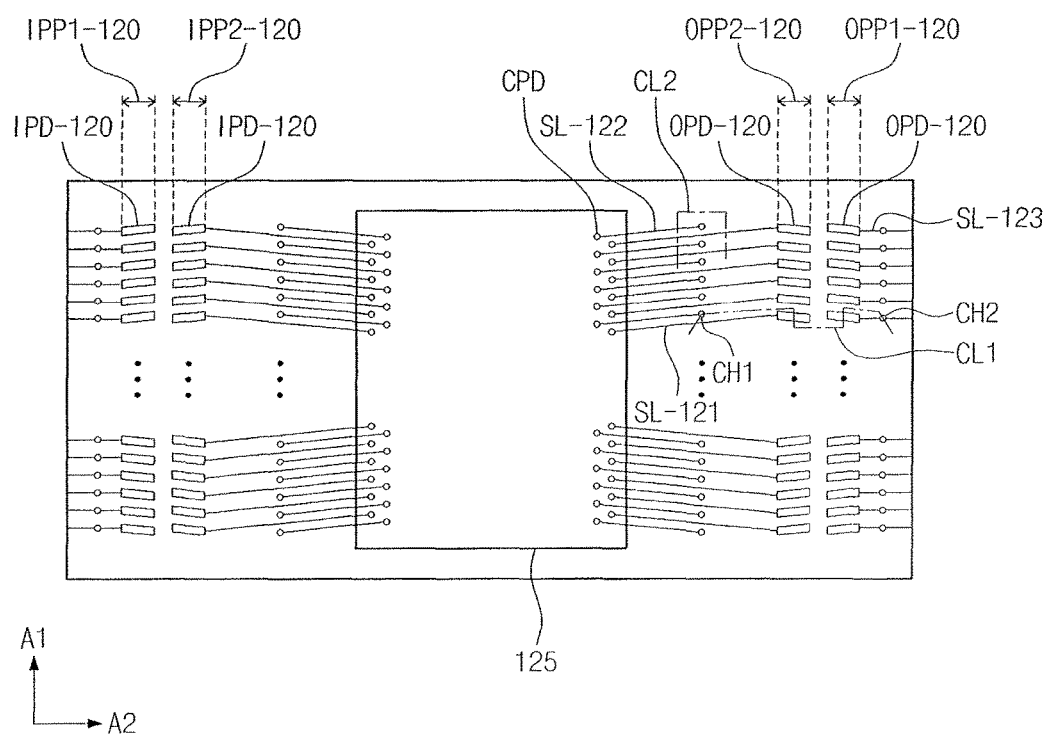
FIG. 24B illustrates a first plan view of a second electronic component according to an embodiment.
Figure 24C:
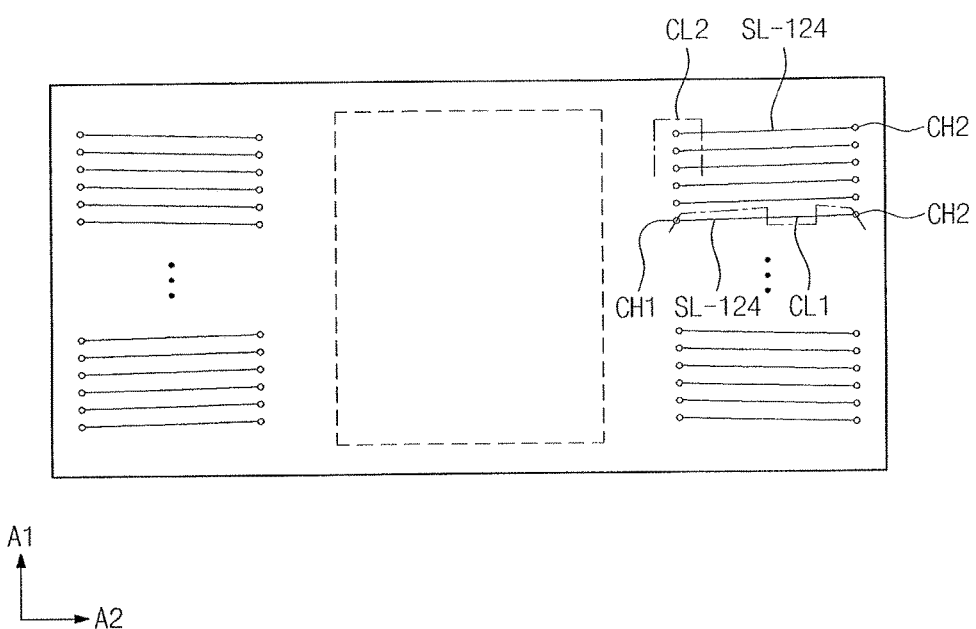
FIG. 24C illustrates a second plan view of a second electronic component according to an embodiment.
Figure 25A:
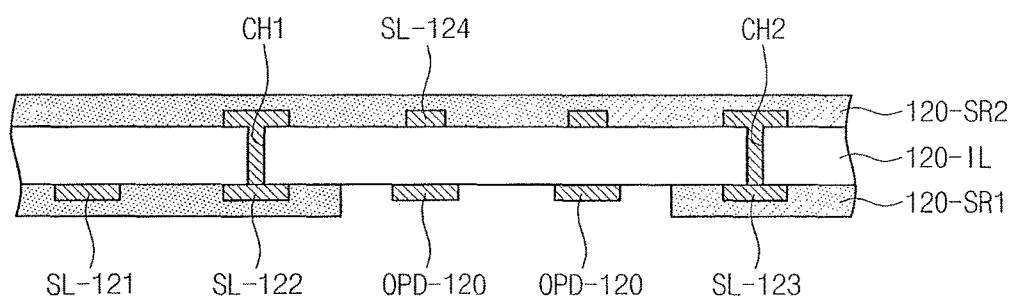
FIG. 25A illustrates a cross-sectional view taken along a first cutting line of FIGS. 24A and 24B according to an embodiment.
Figure 25B:
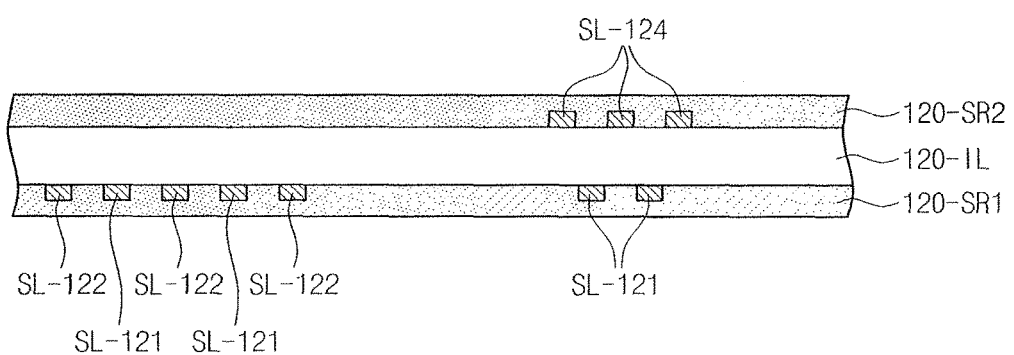
FIG. 25B illustrates a cross-sectional view taken along a second cutting line of FIGS. 24B and 24C according to an embodiment.

FIG. 24A is a side view of a second electronic component according to an embodiment. FIG. 24B is a first plan view of a second electronic component according to an embodiment. FIG. 24C is a second plan view of a second electronic component according to an embodiment. FIG. 25A is a cross-sectional view taken along a first cutting line CL1 of FIGS. 24B and 24C according to an embodiment. FIG. 25B is a cross-sectional view taken along a second cutting line CL2 of FIGS. 24B and 24C according to an embodiment.

FIG. 24B is a plan view illustrating a coupling surface CS of the second electronic component 120, and FIG. 24C is a plan view illustrating a non-coupling surface NCS of the second electronic component 120. A solder resist layer is omitted in FIGS. 24B and 24C in order to describe wires SL-121, SL-122, SL-123, and SL-124. Hereinafter, a second electronic component according to this embodiment will be described with reference to FIGS. 24A to 24C.

The second electronic component 120 includes a flexible wiring substrate 122 and a data driving circuit 125. The data driving circuit 125 may include at least one driving chip. The data driving circuit 125 is electrically connected to the wires of the flexible wiring substrate 122. In this embodiment, the second electronic component 120 has a chip on film structure but embodiments are not limited thereto. According to an embodiment, the data driving circuit 125 may be omitted. Additionally, align marks on the flexible wiring substrate 122 are not shown.

The flexible wiring substrate 122 includes at least one insulating layer 120-IL, a plurality of pads CPD, IPD-120, and OPD-120 and a plurality of wires SL-121, SL-122, SL-123, and SL-124. The plurality of pads CPD, IPD-120, and OPD-120 and the plurality of wires SL-121, SL-122, SL-123, and SL-124 are disposed on the insulating layer 120-IL.

The plurality of pads CPD, IPD-120, and OPD-120 may include connection pads CPD connected to connection terminals of the data driving circuit 125, input pads IPD-120 connected to the third electronic component 130 (see FIG. 1), and output pads OPD-120 connected to the display panel 110 (see FIG. 1). On a plane, the input pads IPD-120 may be defined as input pad regions IPP1-120 and IPP2-120 disposed at one side of the flexible wiring substrate 122 and the output pads OPD-120 may be defined as output pad regions OPP1-120 and OPP2-120 disposed at the other side of the flexible wiring substrate 122.

The input pad regions IPP1-120 and IPP2-120 include a first input pad region IPP1-120 and a second input pad region IPP2-120. Each of the first input pad region IPP1-120 and the second input pad region IPP2-120 includes one pad row. The pad row includes a plurality of input pads IPD-120 arranged along the first direction axis A1.

The output pad regions OPP1-120 and OPP2-120 include a first output pad region OPP1-120 and a second output pad region OPP2-120. Each of the first output pad region OPP1-120 and the second output pad region OPP2-120 includes one pad row. The pad row includes a plurality of output pads OPD-120 arranged along the first direction axis A1.

The input pads IPD-120 of the input pad regions IPP1-120 and IPP2-120 are arranged in correspondence to output pad regions (not shown) of the third electronic component 130. The output pad regions of the third electronic component 130 may have an arrangement shown in FIGS. 16A to 23. Accordingly, the input pads IPD-120 of the input pad regions IPP1-120 and IPP2-120 may have an arrangement shown in FIGS. 16A to 23.

The output pads OPD-120 of the output pad regions OPP1-120 and OPP2-120 are arranged in correspondence to those of the input pads IPD-110. Accordingly, the output pads OPD-120 of the output pad regions OPP1-120 and OPP2-120 may have an arrangement shown in FIGS. 16A to 23.

As shown in FIGS. 24A to 25B, the plurality of pads CPD, IPD-120, and OPD-120 are disposed on one side of the insulating layer 120-IL. Some and other some of the plurality of wires SL-121, SL-122, SL-123, and SL-124 are disposed on different layers. Some of the plurality of wires SL-121, SL-122, SL-123, and SL-124 are disposed on one side of the insulating layer 120-IL and other some are disposed on the other side of the insulating layer 120-IL.

The plurality of wires SL-121, SL-122, SL-123, and SL-124 include first wires SL-121, second wires SL-122, third wires SL-123, and fourth wires SL-124. The output pads OPD-120 of the second output pad region OPP2-120 are electrically connected to corresponding pads among the connection pads CPD through the first wires SL-121 and the input pads IPD-120 of the second input pad region IPP2-120 are electrically connected to corresponding pads among the connection pads CPD through the first wires SL-121. In this embodiment, the connection pads CPD are arranged overlapping the both sides of the data driving circuit 125 but unlike FIG. 24B, the connection pads CPD may be randomly arranged in correspondence to connection terminals of the data driving circuit 125.

The output pads OPD-120 of the first output pad region OPP1-120 are electrically connected to corresponding pads among the connection pads CPD via the second wires SL-122, the third wires SL-123, and the fourth wires SL-124. The input pads IPD-120 of the first output pad region IPP1-120 are electrically connected to corresponding pads among the connection pads CPD via the second wires SL-122, the third wires SL-123, and the fourth wires SL-124.

The second wires SL-122 are connected to corresponding pads among the connection pads CPD. The third wires SL-123 are connected to the output pads OPD-120 of the first output pad region OPP1-120. The fourth wires SL-124 are connected to each of the second wires SL-122 and the third wires SL-123.

The fourth wires SL-124 and the second wires SL-122 are connected to each other via first through holes CH1 penetrating the insulating layer 120-IL, and the fourth wires SL-124 and the third wires SL-123 are connected to each other via second through holes CH2 penetrating the insulating layer 120-IL.

The flexible wiring substrate 122 may be disposed on the one side of the insulating layer 120-IL and may further include a first solder resist layer 120-SR1 covering at least the first wires SL-121, the second wires SL-122, and the third wires SL-123. At least the connection pads CPD, the input pads IPD-120, and the output pads OPD-120 may be exposed from the first solder resist layer 120-SR1. Additionally, the flexible wiring substrate 122 may be disposed on the other side of the insulating layer 120-IL and may further include a second solder resist layer 120-SR2 covering at least the fourth wires SL-124.

FIGS. 26A to 26E are partially enlarged views of wires shown in FIGS. 24B and 24C. Detailed description for the overlapping configurations described with reference to FIGS. 24A to 25B will be omitted.

FIG. 26A illustrates an enlarged portion overlapping the first through hole CH1 of one of the second wires SL-122. As shown in FIG. 26A, the second wire SL-122 may include a land portion LP and a wiring portion SP.

The land portion LP overlaps the first through hole CH1 and has a form in which the width W1 is reduced as progressively closer to the wiring portion SP. Although a circular land portion LP is shown exemplarily in FIG. 26A, embodiments are not limited thereto and the form of the land portion LP may vary.

The wiring portion SP connects the land portion LP and a corresponding connection pad CPD. The land portion LP has a variable first width W1 and the wiring portion SP has a second width W2 that is less than or identical to the minimum width W1 of the land portion LP. The first width W1 and the second width W2 are measured in a direction orthogonal to an extending direction of the wiring portion SP.

As the land portion LP is closer to the wiring portion SP, the width S1 is reduced, so that when the flexible wiring substrate 122 is bent, the stress applied to the boundary of the land portion LP and the wiring portion SP is reduced. The reason is that the stress applied to the boundary of the land portion LP and the wiring portion SP is distributed by the land portion LP. Accordingly, when the flexible wiring substrate 122 is bent, crack occurring in the second wires SL-122 may be prevented.

Although not separately shown in the drawing, the fourth wires SL-124 may include a first land portion disposed at a portion overlapping the second through holes CH2 and having a width that is reduced as closer to a wiring region and a second land portion disposed at a portion overlapping the first through holes CH1 and having a width that is reduced as closer to the wiring region.

FIG. 26B illustrates an enlarged portion overlapping the second through hole CH2 of one of the third wires SL-123.

As shown in FIG. 26B, the third wire SL-123 may include a land portion LP and wiring portions SP1 and SP2.

The land portion LP overlaps the second through hole CH2 and has a form in which the width W1 is reduced as progressively closer to the wiring portion SP. Although a circular land portion LP is shown exemplarily in FIG. 26B, embodiments are not limited thereto and the form of the land portion LP may vary.

The wiring portions SP1 and SP2 include a first wiring portion SP1 and a second wiring portion SP2. The first wiring portion SP1 connects the land portion SP overlapping the second through hole CH2 and the output pad OPD-120 of the first output pad region OPP1-120. The second wiring portion SP2 is connected to the land portion SP overlapping the second through hole CH2. Although not shown in the drawing, the connection reliability of the second wires SL-122, the third wires SL-123, and the fourth wires SL-124 may be tested through the second wiring portion SP2.

Figure 26C:
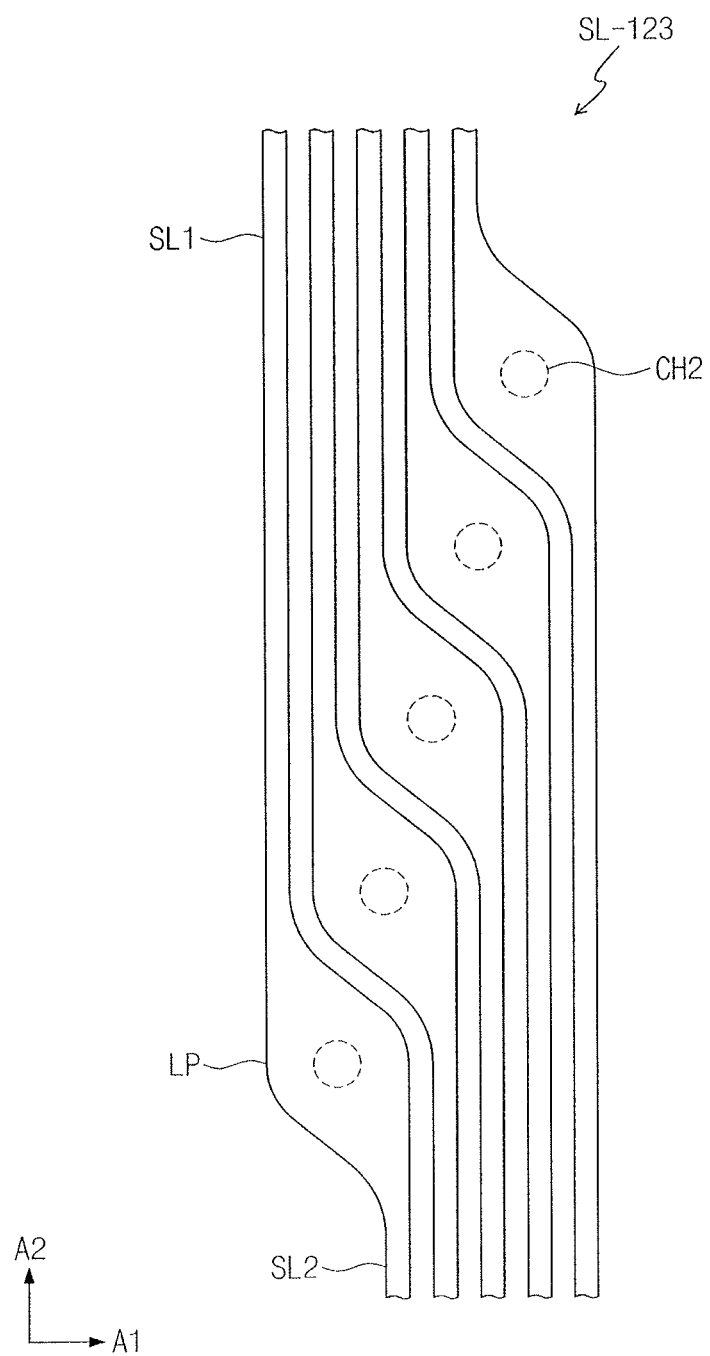
Figure 26D:
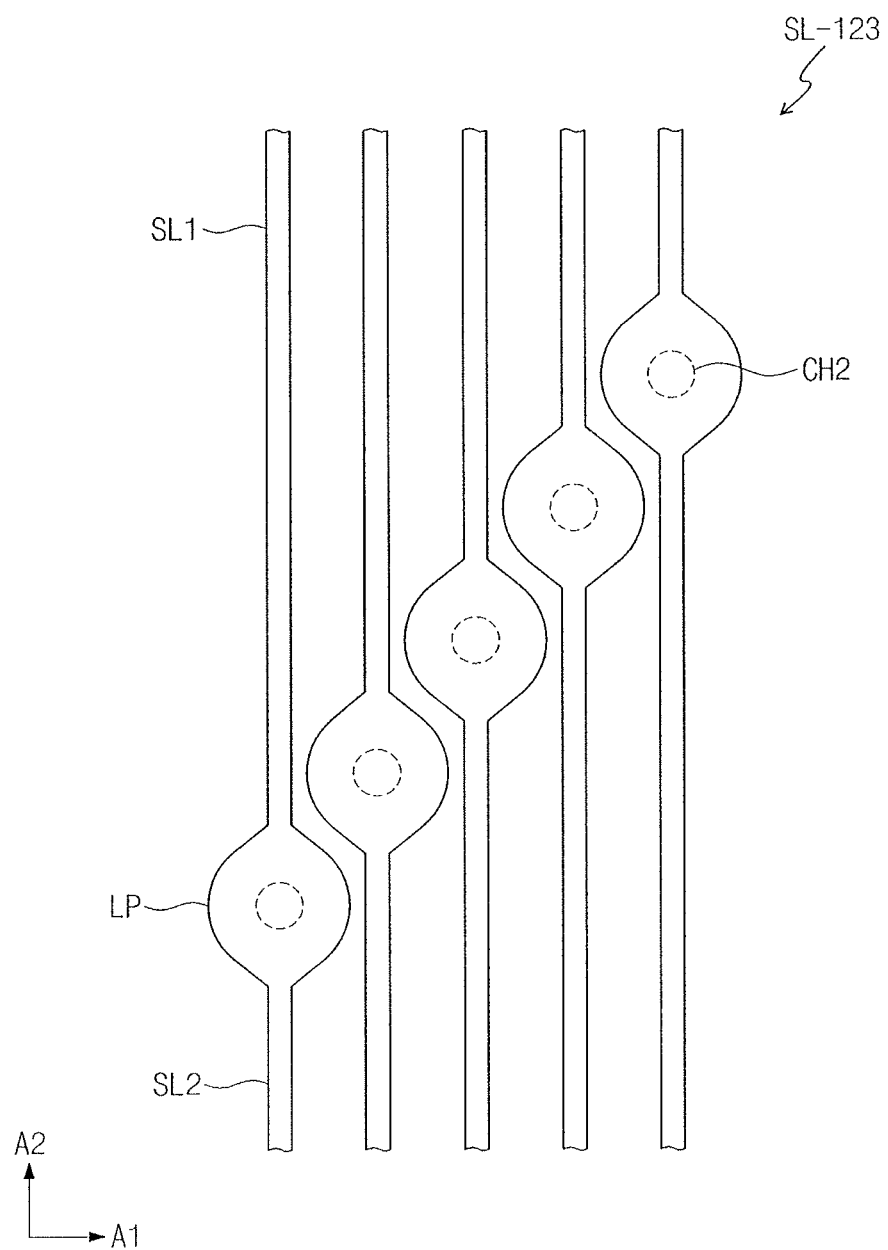
Figure 26E:
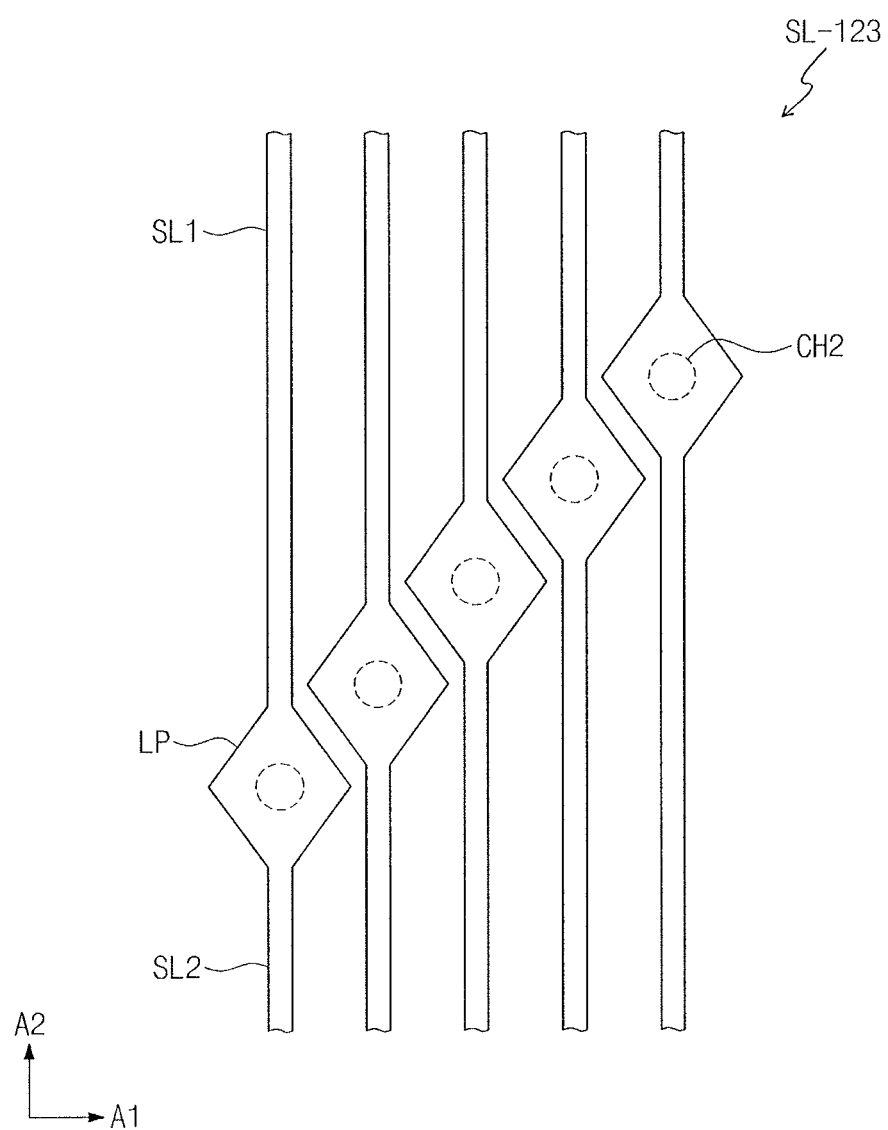

FIGS. 26C to 26E are enlarged views of the third wires SL-123. As shown in FIGS. 26C to 26E, the third wires SL-123 are arranged orthogonal to the extension direction. The second through holes CH2 may be arranged tilted relative to the first direction axis A1. Accordingly, the land portions LP of the third wires SL-123 may be arranged tilted relative to the first direction axis A1. Thus, a large number of third wires SL-123 may be arranged in a narrow range along the first direction axis A1.

As shown in FIGS. 26C to 26E, the form of the land portions LP may vary. Although not separately shown in the drawing, the second wires SL-122 also may be arranged as shown in FIGS. 26C to 26E.

Figure 27A:
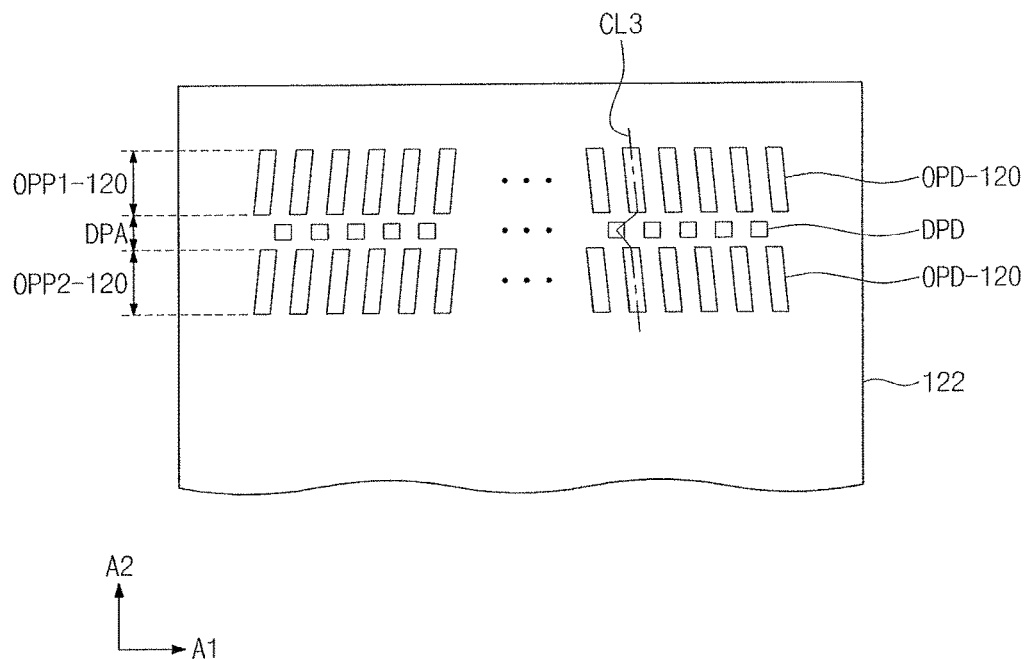
FIG. 27A illustrates a plan view of a second electronic component according to an embodiment.
Figure 27B:
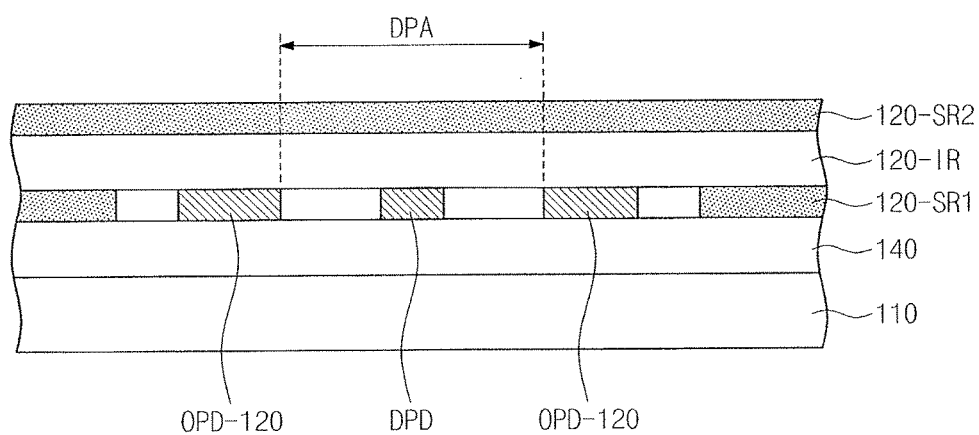
FIG. 27B illustrates a cross-sectional view taken along a third cutting line of FIG. 27A.

FIG. 27A is a plan view of a second electronic component according to an embodiment. FIG. 27B is a sectional view taken along a third cutting line of FIG. 27A. Wires are not shown in FIG. 27A. The input pads of the display panel 110 are not shown in FIG. 27B. Detailed description for the overlapping configurations described with reference to FIGS. 24A to 25B will be omitted.

As shown in FIG. 27A, the flexible wiring substrate 122 may further include dummy pads DPD disposed between a first output pad region OPP2-120 and a second output pad region OPP2-120. In this embodiment, an area between the first output pad region OPP1-120 and the second output pad region OPP2-120 along the second direction axis A2 may be defined as a middle area DPA.

The dummy pads DPD may be arranged along the first direction axis A1. The dummy pads DPD may be arranged spaced a predetermined interval apart from each other. The dummy pads DPD are spaced apart from output pads OPD-120. The dummy pads DPD prevents the lift defect of the middle area DPA after the bonding process described with reference to FIG. 13.

As shown in FIG. 27B, the dummy pad DPD is disposed on the same layer as the output pads OPD-120, that is, one side of an insulating layer 120-IL. The dummy pads DPD is bonded to a conductive adhesive film 140.

The dummy pad DPD prevents the conductive adhesive film 140 from being bonded to one side of the insulating layer 120-IL in the middle area DPA. The thermal compression operation using a tool during the bonding process was described above with reference to FIG. 13. When the conductive adhesive film 140 is directly bonded to one side of the insulating layer 120-IL, after the thermal compression operation, lift defects may occur as the insulating layer 120-IL is restored to a form before the thermal compression.

The lift defects may occur between the conductive adhesive film 140 and the insulating layer 120-IL or between the conductive adhesive film 140 and the display panel 110. Since the dummy pad DPD maintains an interval between the conductive adhesive film 140 and one side of the insulating layer 120-IL in the middle area DPA, the lift defects may be prevented.

Figure 28A:
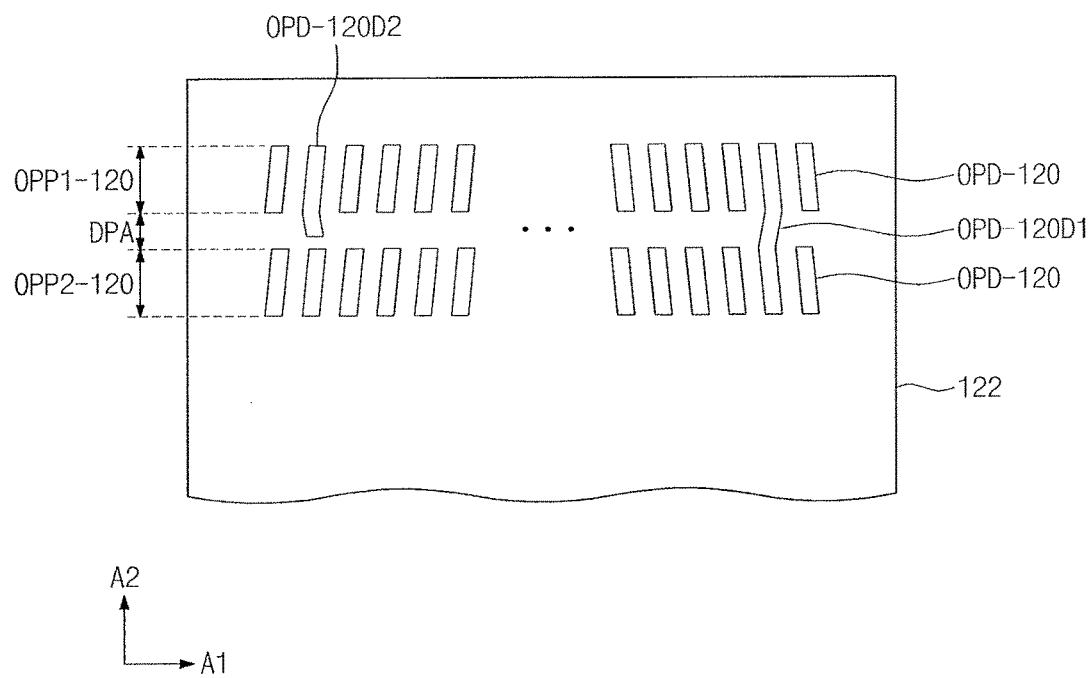
FIG. 28A illustrates a plan view of a second electronic component according to an embodiment.
Figure 28B:
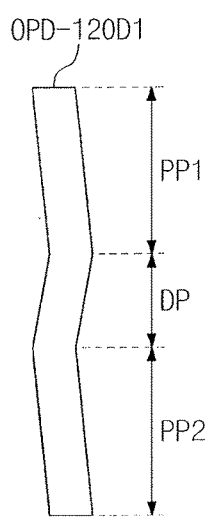
FIG. 28B illustrates a plan view of a first dummy pad of FIG. 28A.
Figure 28C:
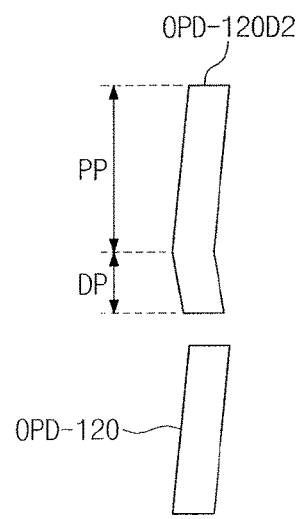
FIG. 28C illustrates a plan view of a second dummy pad of FIG. 28A.

FIG. 28A is a plan view of a second electronic component according to an embodiment. FIG. 28B is a plan view of a first dummy pad of FIG. 28A. FIG. 28C is a plan view of a second dummy pad of FIG. 28A. Wires are not shown in FIG. 28A. Detailed description for the overlapping configurations described with reference to FIGS. 24A to 25B, 27A, and 27B will be omitted.

As shown in FIG. 28A, the flexible wiring substrate 122 may further include at least one first dummy pad OPD-120D1 and at least one second dummy pad OPD-120D2. One of the first dummy pad OPD-120D1 and the second dummy pad OPD-120D2 may be omitted. A signal may not be applied to the first dummy pad OPD-120D1 and the second dummy pad OPD-120D2. At this point, the first dummy pad OPD-120D1 and the second dummy pad OPD-120D2 may not be connected to a wire.

As shown in FIGS. 28A and 28B, the first dummy pad OPD-120D1 may include a first portion PP1, a second portion PP2, and a third portion DP connecting the first portion PP1 and the second portion PP2. Each of the first portion PP1 and the second portion PP2 may have the same pitch as one of adjacent two output pads OPD-120.

The third portion PP3 may prevent lift defects occurring in the middle area DPA according to the same principle as the dummy pad DPD shown in FIGS. 27A and 27B. Since the third portion PP3 maintains an interval between the conductive adhesive film 140 and one side of the insulating layer 120-IL in the middle area DPA, the lift defects may be prevented.

As shown in FIGS. 28A and 28C, the second dummy pad OPD-120D2 may include a first portion PP and a second portion DP connected to the first portion PP. The first portion PP1 may have the same pitch as one of adjacent two output pads OPD-120.

The second portion DP may prevent lift defects occurring in the middle area DPA according to the same principle as the dummy pad DPD shown in FIGS. 27A and 27B. Since the second portion DP maintains an interval between the conductive adhesive film 140 and one side of the insulating layer 120-IL in the middle area DPA, the lift defects may be prevented.

By way of summation and review, pad regions of two electronic components of an electronic device may have dimensions that are different from the design dimensions due to manufacturing errors. Additionally, the two electronic components are subject to expansion or contraction due to heat generated from the bonding process. Therefore, reliability of an electrical connection in the two electronic components may be reduced.

Therefore, embodiments provide an electronic component with a pad region correcting a numeral error of the pad region occurring during a manufacturing process and a numerical error of the pad region occurring during a bonding process. Embodiments also provide an electronic device with improved reliability of electrical connection. Embodiments also provide a bonding method of an electronic device with an improved reliability of an electrical connection.

In detail, each of a pad region of the first electronic component and a pad region of the second electronic component includes the above-mentioned one pad row. The first pads and the second pads form different between-angles relative to the first direction axis, so that the extension lines of the first pads and the extension lines of the second pads substantially converge into different positions. Even when the pad region of the first electronic component and/or the pad region of the second electronic component have numeral errors occurring during a manufacturing process, the electrical connection reliability between the pad region of the first component and the pad region of the second electrical component may be improved.

The first and second pads of the second electronic component coupled to the pads of the first electronic component may have different pitches. Even when numerical errors occur in the pad region of the second electronic component during a bonding process, the electrical connection reliability between the pad region of the first component and the pad region of the second electrical component may be improved Each of the pad region of the first electronic component and the pad region of the second electronic component may include a plurality of pad rows. Accordingly, a plurality of pads may be disposed in a narrow area.

The second electronic component may be a flexible wiring substrate. The flexible wiring substrate includes a plurality of wires. Some of the plurality of wires includes a land portion and a wiring portion. As the land portion is progressively closer to the wiring portion, its width is reduced, so that when flexible wiring substrate is bent, the stress applied to the boundary of the land portion and the wiring portion is reduced. Accordingly, when the flexible wiring substrate 122 is bent, crack occurring in the wires may be prevented.

The flexible wiring substrate may further include a dummy pad disposed between a pad row and a pad row. The dummy pad maintains an interval between a conductive adhesive film and an insulating layer of a flexible wiring substrate. Accordingly, lift defects between the conductive adhesive film and the insulating layer may be prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An electronic component, comprising:
a pad region including a plurality of pads extending along corresponding extension lines, the plurality of pads being spaced apart from each other in a first direction; and
a signal wire configured to receive a driving signal from the pad region,
wherein the plurality of pads includes a plurality of first pads arranged continuously in the first direction, and a plurality of second pads arranged continuously in the first direction,
wherein the first pads and the second pads are spaced apart from each other in the first direction,
wherein extension lines of the plurality of first pads substantially converge into a first point, and extension lines of the plurality of second pads substantially converge into a second point different from the first point, wherein the first pads and the second pads are disposed apart from a reference line in the first direction, the reference line is extended in a second direction intersecting the first direction, and wherein the first pads and the second pads are arrayed in the first direction and the first pads and the second pads are located in same sides of the reference line, wherein a first between-angle $\theta 1n$ is formed by an extension line of an n-th first pad among the first pads and the reference line and satisfies Equation 1 below, $$\theta_{1n}=\theta_{11}-(n-1)\alpha \qquad \text{[Equation 1]}$$

where in $\theta 1n$, the subscript "1" indicates the first pads and the subscript "n" indicates the n-th first pad among the first pads, $\theta 11$ is a first between-angle formed by an extension line of a first pad disposed at the outermost among the first pads and the reference line, n is a natural number greater than or equal to 2, and $\alpha$ is the first value.

\* \* \* \* \*